(12) United States Patent
Kwon et al.

(10) Patent No.: US 11,062,990 B2
(45) Date of Patent: Jul. 13, 2021

(54) SEMICONDUCTOR PACKAGE OF USING INSULATING FRAME

(71) Applicant: NEPES CO., LTD., Chungcheongbuk-do (KR)

(72) Inventors: Yongtae Kwon, Cheongju-si (KR); Junkyu Lee, Cheongju-si (KR); Jaecheon Lee, Cheongju-si (KR); Mina Yoon, Cheongju-si (KR)

(73) Assignee: NEPES LAWEH CORPORATION

(*) Notice: Subject to any disclaimer, the term of this patent is extended or adjusted under 35 U.S.C. 154(b) by 77 days.

(21) Appl. No.: 16/424,434

(22) Filed: May 28, 2019

(65) Prior Publication Data

US 2019/0295944 A1    Sep. 26, 2019

Related U.S. Application Data

(63) Continuation of application No. PCT/KR2017/002401, filed on Mar. 6, 2017, and a
(Continued)

(30) Foreign Application Priority Data

Nov. 28, 2016  (KR) .......................... 10-2016-0159624
Jan. 6, 2017   (KR) .......................... 10-2017-0002543

(51) Int. Cl.
*H01L 23/522*    (2006.01)
*H01L 21/56*     (2006.01)
(Continued)

(52) U.S. Cl.
CPC ........ *H01L 23/5226* (2013.01); *H01L 21/565* (2013.01); *H01L 23/06* (2013.01);
(Continued)

(58) Field of Classification Search
CPC ....... H01L 21/56; H01L 21/565; H01L 23/06; H01L 23/29; H01L 23/31; H01L 23/312;
(Continued)

(56) References Cited

U.S. PATENT DOCUMENTS

| 7,728,422 B2* | 6/2010 | Kim .................. H01L 23/49855 257/698 |
| 10,672,697 B2* | 6/2020 | Funahashi ............... H01L 24/32 |
| 2015/0187742 A1 | 7/2015 | Kwon et al. |

FOREIGN PATENT DOCUMENTS

| JP | H05129482 A | 5/1993 |
| JP | H0730017 A  | 1/1995 |

(Continued)

OTHER PUBLICATIONS

International Search Report for PCT/KR2017/002401 dated Sep. 21, 2017.
(Continued)

*Primary Examiner* — Monica D Harrison
(74) *Attorney, Agent, or Firm* — Renaissance IP Law Group LLP

(57) ABSTRACT

A semiconductor package using an insulating frame of various is disclosed. The insulating frame has a through hole therein, and the semiconductor chip is mounted in the through hole. Further, a via hole is provided in the periphery of the through hole, and a via contact filling the via hole is provided. Whereby the pad of the semiconductor chip is electrically connected to the via contact through the distribution layer. Further, an adhesive buffer layer for increasing the adhesive force is introduced into the upper portion of the insulating frame.

20 Claims, 41 Drawing Sheets

Related U.S. Application Data continuation of application No. PCT/KR2017/002402, filed on Mar. 6, 2017, and a continuation of application No. PCT/KR2017/002403, filed on Mar. 6, 2017, and a continuation of application No. PCT/KR2017/002699, filed on Mar. 13, 2017, and a continuation of application No. PCT/KR2017/002694, filed on Mar. 13, 2017, and a continuation of application No. PCT/KR2017/002700, filed on Mar. 13, 2017.

(51) Int. Cl.
　　*H01L 23/31*　　　(2006.01)
　　*H01L 23/528*　　(2006.01)
　　*H01L 23/552*　　(2006.01)
　　*H01L 23/00*　　　(2006.01)
　　*H01L 25/065*　　(2006.01)
　　*H01L 23/29*　　　(2006.01)
　　*H01L 23/06*　　　(2006.01)
　　*H01L 23/60*　　　(2006.01)

(52) U.S. Cl.
　　CPC .............. *H01L 23/29* (2013.01); *H01L 23/31* (2013.01); *H01L 23/3128* (2013.01); *H01L 23/5283* (2013.01); *H01L 23/552* (2013.01); *H01L 23/60* (2013.01); *H01L 24/09* (2013.01); *H01L 24/17* (2013.01); *H01L 24/32* (2013.01); *H01L 24/73* (2013.01); *H01L 25/0655* (2013.01); *H01L 2224/0231* (2013.01); *H01L 2224/02373* (2013.01); *H01L 2224/02379* (2013.01); *H01L 2224/02381* (2013.01); *H01L 2224/73203* (2013.01)

(58) Field of Classification Search
　　CPC ... H01L 23/3128; H01L 23/52; H01L 23/522; H01L 23/5226; H01L 23/60; H01L 24/09; H01L 24/17; H01L 24/32; H01L 24/73

USPC ........................................................ 257/690
See application file for complete search history.

(56) References Cited

FOREIGN PATENT DOCUMENTS

| | | |
|---|---|---|
| JP | H07266767 A | 10/1995 |
| JP | H11135526 A | 5/1999 |
| JP | 2004071872 A | 3/2004 |
| JP | 2011003758 A | 1/2011 |
| JP | 5875102 B2 | 3/2016 |
| KR | 20070096693 A | 10/2007 |
| KR | 20090039407 A | 4/2009 |
| KR | 20120077875 A | 7/2012 |
| KR | 20130132162 A | 12/2013 |
| KR | 20140140256 A | 12/2014 |
| KR | 20150024944 A | 3/2015 |
| KR | 20160114106 A | 10/2016 |
| KR | 20160132751 A | 11/2016 |

OTHER PUBLICATIONS

International Search Report for PCT/KR2017/002402 dated Sep. 21, 2017.
International Search Report for PCT/KR2017/002403 dated Aug. 28, 2017.
International Search Report for PCT/KR2017/002694 dated Aug. 28, 2017.
International Search Report for PCT/KR2017/002699 dated Aug. 28, 2017.
International Search Report for PCT/KR2017/002700 dated Aug. 28, 2017.

\* cited by examiner

SEMICONDUCTOR PACKAGE OF USING INSULATING FRAME

TECHNICAL FIELD

The present disclosure is related to semiconductor package, more particularly related to semiconductor package using insulating frame of various type.

BACKGROUND

As the design rule of semiconductor devices is reduced and the width of metal line is reduced, the number of transistors implemented in the same area is increasing. Also, as various functions are integrated in the same area, the number of input/output terminals increase and the number of pads performing the function of input/output terminals in the semiconductor chip also increases.

The increase in the number of pads causes a reduction in the spacing distance between the pads. In addition, in the semiconductor package in which solder balls or bumps for electrically connecting the pads to the outside are to be formed, disposition and spacing of these external connection terminals are problematic. That is, since the area occupied by the solder ball or the bump in the semiconductor package is larger than the pads, when the external connection terminal is disposed in the defined area of the semiconductor chip, the spacing space between the external connection terminals is smaller than that of pads. Therefore, an interference problem may occur between signals input or output through the external connection terminal. To solve this problem, a package of a fan-out type in which external connection terminals can be formed out of the semiconductor chip area is being developed.

In a package of the fan-out type, a frame accommodating an epoxy molding compound (EMC), which is a molding material for packaging a semiconductor chip, is introduced. That is, the semiconductor chip is mounted in the area surrounded by the frame, and the EMC is molded in the space between the semiconductor chip and the frame. A normal frame is made of a metal material.

Further, in the process of molding the EMC, the flow of the EMC occurs, and the arrangement of the semiconductor chips is distorted. Particularly, there arises a problem that the frame of a metal material which accommodates the EMC is deformed by the thermal expansion operation according to the thermal expansion coefficient of the EMC. In a typical EMC, the thermal expansion coefficient is 10 to 18 ppm/° C., and the silicon semiconductor chip has a thermal expansion coefficient of 2.6 ppm/° C. Therefore, there is a possibility that the semiconductor chip flows in the frame due to a difference in thermal expansion coefficient between the EMC and the semiconductor chip.

In addition, when the frame is made of aluminum, the aluminum has a high thermal expansion coefficient of 23 ppm/° C. That is, thermal stress is applied between the frame and the EMC during melting, curing, and cooling of the EMC at a high temperature during the molding process. This causes damage to the frame made of aluminum or causes the mis-arrangement of semiconductor chips by thermal stress.

Further, in the manufacturing process, the frame is disposed on the carrier substrate, and the semiconductor chip is mounted through the accommodation space formed in the frame. The molding process is then performed. In this process, the carrier has a ceramic material. Therefore, if the frame has a metal material, thermal deformation of the frame occurs due to a difference in thermal expansion coefficient between the frame and the carrier substrate.

Accordingly, it would be desirable to develop a semiconductor package and a method of manufacturing the same that can minimize the occurrence of thermal stress due to a difference in thermal expansion coefficient in the process of manufacturing the semiconductor package and minimize movement of the semiconductor chip.

Furthermore, in the package of the fan-out type, the wiring layer is also formed on the molding material formed in the region other than the semiconductor chip. Such a wiring layer is formed outside the region occupied by the semiconductor chip. If the shielding layer made of metal covers the side of the wiring layer, electrical short-circuiting may occur between the shielding layer and the wiring layer, which may cause malfunction of the semiconductor device.

Therefore, a semiconductor package capable of performing an effective heat emitting function and simultaneously performing electromagnetic wave shielding will still be required.

In the process of manufacturing the fan-out package, the redistribution layer connects the wiring layer to the pads of the semiconductor chip, and the connected wirings layer is extended to the outer region of the semiconductor chip. For this, an insulating layer is required between the semiconductor chip provided with the pad and the wiring layer connected to the pad.

The insulating layer is formed by forming or depositing an oxide et al using a solution process. However, when a solution process is used, loss of material occurs. In addition, when a deposition process is used, the oxide is required to be deposited at a high temperature, thereby causing warping of the semiconductor package.

Therefore, a semiconductor package having a redistribution layer that can be manufactured through a simple process with minimal loss of material will still be required.

Technical Problem

A first aspect of the present disclosure is to provide a semiconductor package in which mechanical stress is minimized by using an insulating frame.

A second aspect of the present disclosure is to provide a semiconductor package having heat dissipation and electromagnetic shielding characteristics.

A third aspect of the present disclosure is provided a semiconductor package having a high productivity by changing the structure of a redistribution layer.

Technical Solution

The first aspect of the present disclosure provides a semiconductor package comprising: an insulating frame having a through hole, a first surface and a second surface facing the first surface, a semiconductor chip disposed in the through hole and having an active surface on which a pad is formed, a molding layer covering a back surface and side surface of the semiconductor chip by filling the through hole, and being coplanar with the first surface of the insulating frame, a redistribution layer electrically connected to the pad of the semiconductor chip, and formed on the active surface of the semiconductor chip and on the first surface of the insulating frame, and an external connection terminal electrically connected to the pad of the semiconductor chip, and formed on the redistribution layer, wherein the first surface and the second surface have different widths from each other, or an inner circumferential surface of the insulating frame has an inclined surface.

The second aspect of the present disclosure provides a semiconductor package comprising an insulating frame having a first through hole formed from first surface, and a second through hole formed from a second surface opposing to the first surface and having width narrower than width of the first through hole, a semiconductor chip disposed in the first through hole, a molding layer filling space between the semiconductor chip and the first through hole, and the second through hole, so that the molding layer covers a back surface and side surface of the semiconductor chip and is coplanar with the first surface of the insulating frame, a conductive layer formed on the molding layer and having a higher conductivity than the molding layer, an upper redistribution layer formed on an active surface of the semiconductor chip and the first surface of the insulating frame, and electrically connected to a pad on the active surface of the semiconductor chip, and a via contact passing through the insulating frame, filling via hole formed in peripheral region of the first through hole, and electrically connected to the upper redistribution layer, wherein the molding layer and the conductive layer are formed in the though hole.

The third aspect of the present invent provides a semiconductor package comprising an adhesive buffer layer formed on the insulating frame, a polymer bonding layer formed on the adhesive buffer layer and provided as an insulating polymer film, and a wiring layer formed on the polymer bonding layer, wherein the adhesive buffer layer is metal film or nanoparticle film, and the nanoparticle film has TiO2 or SiO2.

Advantageous Effects

According to the present disclosure, the insulating frame in which the semiconductor chip and the molding layer are accommodated is made of an insulating material. The redistribution layer is formed on the insulating frame. The use of an insulating frame can ensure a strong chemical resistance compared to the use of a conventional metal frame. In addition, a short circuit phenomenon with an adjacent package or a short circuit with the redistribution layer pattern in the process of mounting the semiconductor package is prevented.

Furthermore, the insulating frame has a convex shape toward the through hole. That is, the width of the first inclined surface of the inner wall increases as the distance from the first surface increases, and the width of the second inclined surface increases as the distance from the second surface increases. Accordingly, stress due to heat generated in the semiconductor package can be evenly distributed along the first inclined surface and the second inclined surface.

Furthermore, the insulating frame has a first through hole and a second through hole therein. A semiconductor chip is accommodated on the first through hole. Deformation of the semiconductor package due to stress due to various causes is minimized through the insulating frame disposed on the side surface of the semiconductor chip. Further, the semiconductor chip and the molding layer can be protected from the external environment by the insulating frame stretched to a part of the semiconductor chip area.

Furthermore, in the insulating frame, the first through hole has a narrower width than the second through hole. The semiconductor chip is accommodated in the first through hole, and the first through hole and the second through hole are filled with the molding layer. Since the second through hole has a wider width than the semiconductor chip or the first through hole, the heat generated in the semiconductor chip can be easily emitted to the outside. Further, the deformation of the semiconductor package is minimized by the insulating frame disposed on the side surface of the semiconductor chip.

Furthermore, the surface of the insulating frame can be modified into a reinforcing material for effective dispersion of stress and securing of mechanical strength.

Further, a buffer layer is formed between the insulating frame and the molding layer, so that the stress absorbing operation is performed. Through this, the mechanical stability of the semiconductor package is ensured.

The molding layer can have different conductivity, and conductive particles are added to the second molding layer formed on the back surface of the semiconductor chip. Electromagnetic wave shielding is achieved and malfunction of the semiconductor chip due to electromagnetic wave interference is prevented.

In addition, the via contact for filling the via hole and the conductive layer in the manufacturing process can be performed simultaneously, and the via contact and the molding layer can be simultaneously processed. This has the economic advantage of being able to form the molding layer and via contact only by the one step process by reducing the method requiring a minimum of three steps.

In the present disclosure, the redistribution layer formed on the insulating frame includes a polymer bonding layer. Further, an adhesive buffer layer is formed between the frame and the redistribution layer. The polymer bonding layer is easily bonded to the wiring layer by the adhesive buffer layer. In the conventional technology for coating or depositing an oxide or the like for forming a redistribution layer in a mother frame composed of a plurality of frames, it is difficult to ensure the uniformity of the thickness of the oxide and cause generation of particles in a subsequent cutting process do.

To improve this, an insulating polymer is attached to the insulating frame in place of the oxide deposited. Further, in order to solve the problem that the adhesive force is lowered when introducing the polymer bonding layer, which is an insulating polymer film, into the frame, an adhesive buffer layer is used between the frame and the polymer bonding layer. Whereby the polymer bonding layer can be easily bonded to the frame.

By using the polymer bonding layer in the form of a film, the uniformity of the thickness of the redistribution layer can be improved and the manufacturing cost can be reduced. In addition, it is possible to prevent the generation of particles generated during cutting and contribute to the improvement of the yield.

DETAILED DESCRIPTION

Figure 1:
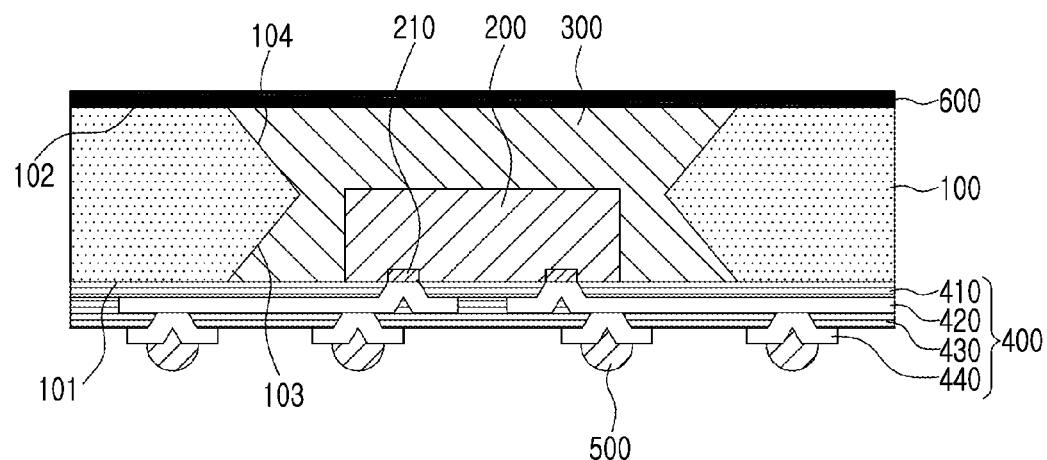
FIG. 1 is a cross-sectional view illustrating a semiconductor package using an insulating frame according to a first embodiment of the present disclosure.

Hereinafter, embodiments of the present disclosure will be described in detail with reference to the accompanying drawings.

While the present disclosure is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

When an element such as a layer, a region, and a substrate is referred to as being disposed "on" another element, it should be understood that the element may be directly formed on the other element or an intervening element may be interposed therebetween.

It should be understood that, although the terms "first," "second," etc. may be used herein to describe various elements, components, areas, layers, and/or regions, these elements, components, areas, layers, and/or regions are not limited by these terms.

First Embodiment

FIG. 1 is a cross-sectional view illustrating a semiconductor package using an insulating frame according to a first embodiment of the present disclosure.

Referring to FIG. 1, a semiconductor package includes an insulating frame 100, a semiconductor chip 200, a molding layer 300, a redistribution layer 400, and an external connection terminal 500.

The insulating frame 100 has an insulating material, and preferably has a thermal expansion coefficient similar to that of the carrier substrate or the molding layer. Accordingly, the insulating frame 100 may be an insulating ceramic or a semiconductor material. The insulating ceramics may have various materials such as metal oxides or metal nitrides, and soda lime glass or sapphire may be used. In addition, the semiconductor materials may have a silicon material, and ZnO, GaN, GaAs, or the like may be used. Since the semiconductor materials are insulative in a undoped state, it is possible to use as insulating frame. Furthermore, the insulating frame 100 may be selected variously according to the material of the carrier substrate or the molding layer to be used.

For example, soda lime glass has a thermal expansion coefficient of 9 to 9.5 ppm/° C., which is a thermal expansion coefficient in a range similar to the molding layer 300, and the thermal stress between the insulating frame 100 and the molding layer 300 can be minimized.

In addition, the insulating frame 100 has through hole. The inner circumferential surface of the through hole has a convex shape toward its center. The insulating frame 100 defining the through hole by the inner circumferential surface has a first inclined surface 103 whose thickness increases from the first surface 101 toward the second surface 102, and a second inclined surface 103 whose thickness increases from the second surface 102 toward the first surface 101. Furthermore, the point where the first inclined surface 103 and the second inclined surface 104 meet is an arbitrary point in the through hole. The width of the first surface 101 which are the lower portion of the insulating frame 100 and the second surface 102 which are the upper portion of the insulating frame 100 may be equal to each, and the width of the insulating frame 100 at the point where the first inclined surface 103 and the second inclined surface 104 meet with each other is set to be larger than the width of the first surface 101 or the width of the second surface 102.

The semiconductor chip 200 is provided in the through hole defined by the first inclined surface 103 and the second inclined surface 104 of the insulating frame 100. The semiconductor chip 200 is not particularly limited, and any semiconductor device capable of performing a certain function such as a memory or a non-memory may be used. In this embodiment, only one semiconductor chip 200 is arranged in the through hole of the insulating frame 100, but a plurality of semiconductor chips may be arranged in the through hole according to the embodiment. In addition to the disclosed semiconductor chip 200, a passive element such as a resistor or a capacitor may be disposed in the through hole.

The active surface provided with the pads 210 of the semiconductor chip 200 is located around the first surface 101 of the insulating frame 100 and is preferably coplanar with the first surface 101.

In addition, the molding layer 300 buries the semiconductor chip 200 disposed in the through hole of the insulating frame 100. The molding layer 300 is made of EMC (Epoxy Molding Compound) and is composed of a mixture of insulating polymer and inorganic powder such as silica powder. The molding layer 300 may form the same plane as the first surface 101 of the insulating frame 100 and may form the same plane as the second surface 102 which is the upper face of the insulating frame 100. The molding layer 300 may further include a conductive powder.

Further, it is preferable that the molding layer 300 has a thickness larger than the thickness of the semiconductor chip 200. Therefore, the molding layer 300 covers the back surface (inactive surface) opposed to the active surface or the side surface of the semiconductor chip 200.

The redistribution layer 400 is formed in contact with the first surface 101 of the insulating frame 100. The redistribution layer 400 has a first insulation layer 410, a first wiring layer 420, a second insulation layer 430, and a second wiring layer 440. However, the configuration of the redistribution layer 400 is only an example configured to realize the fan-out structure, and the configuration of the redistribution layer 400 described above can be variously modified by those skilled in the art.

In addition, the redistribution layer 400 may be formed in any form as far as the external connection terminal 500 can be formed in an area outside the area occupied by the semiconductor chip 200. In the FIG. 1, the first wiring layer 420 extends beyond the region occupied by the semiconductor chip 200 and extends to a lower region of the insulating frame 100. In addition, the first wiring layer 420 can extend to the molding layer 300 in present embodiment.

In addition, the redistribution layer 400 is electrically connected to the external connection terminal 500. The external connection terminal 500 has a solder ball or bump structure. More specifically, the external connection terminal 500 is formed on the second wiring layer 440 and is electrically connected to the pads 210 of the semiconductor chip 200. In addition, the second wiring layer 440 may be omitted according to the embodiment. That is, the external connection terminal 500 may be formed directly on the first wiring layer 420.

According to the embodiment, the protective film 600 may be provided on the second surface 102 of the insulating frame 100 and the molding layer 300 having the same plane with the second surface 102. The protective film 600 is provided to protect the molding layer 300 from the external environment so that may prevent mechanical damage and prevent moisture penetration. The protective film 600 may be an insulating film and may have an epoxy or acrylic material.

FIG. 2 to FIG. 8 are cross-sectional views and plan views illustrating a method of manufacturing the semiconductor package of FIG. 1 according to the first embodiment of the present disclosure.

Figure 2:
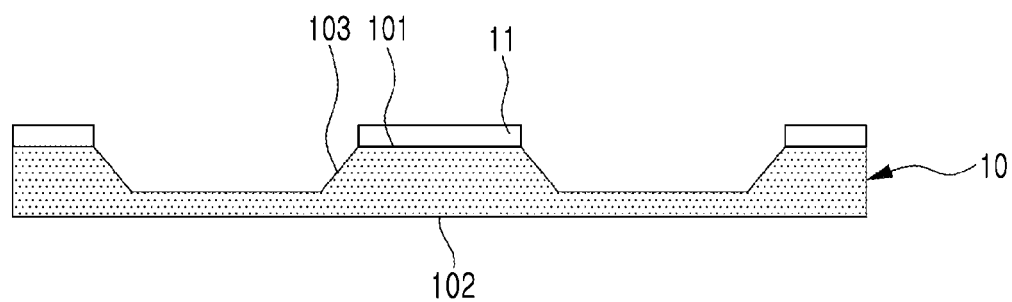
FIG. 2 to FIG. 8 are cross-sectional views and plan views illustrating a method of manufacturing the semiconductor package of FIG. 1 according to the first embodiment of the present disclosure.

Referring to FIG. 2, a mother frame 10 is prepared. The mother frame 10 is for providing the insulating frame 100 of FIG. 1 and has an insulating material, and preferably has a thermal expansion coefficient similar to that of the carrier substrate or molding layer described later. Therefore, since the mother frame 10 is formed as an insulating frame through processing, the material of the mother frame 10 is the same as the insulating frame.

When soda lime glass is used as the mother frame 10, it has higher brittleness than conventional metal materials or semiconductor materials. Therefore, when the mother frame 10 is moved or a various film attached to the mother frame 10 is detached or attached, warping or distortion of the entire mother frame 10 can be prevented.

A photoresist pattern 11 is provided on the first surface 101 of the mother frame 10. The photoresist pattern 11 may be formed by a conventional photolithography process in accordance with a photoresist deposition, exposure, and development processes. Thereby, a photoresist pattern 11 is formed on the first surface 101.

Then, an etching process using the photoresist pattern 11 as an etching mask is performed. A wet or dry etch may be used for the etch process, and a wet etch process is preferably used. The etchant that can be used is HF or the like and the etchant selectively etches the mother frame 10. The etchant is not necessarily limited thereto and may be variously selected depending on the material of the mother frame 10. The mother frame 10 has a first inclined surface 103 that is formed by a wet etching process and has an oblique inclination from a first surface 101 to a second surface 102.

Figure 3:
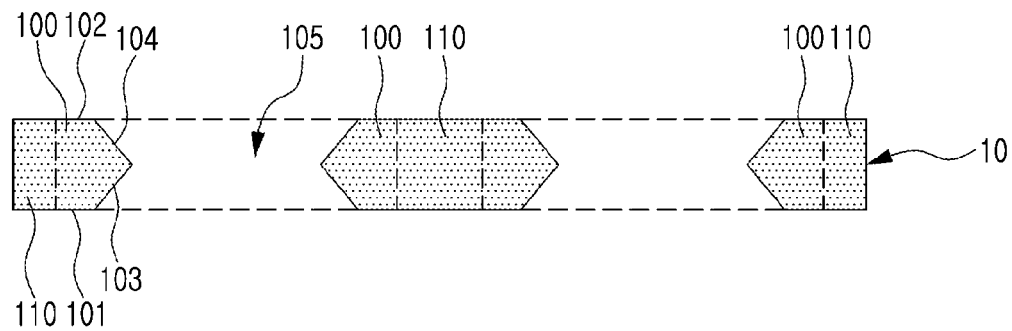

Referring to FIG. 3, the photoresist pattern 11 shown in FIG. 2 is removed, and another photoresist pattern is formed on the second surface 102 opposite to the first surface 101. Another photoresist pattern is matched or opposite to the photoresist pattern of FIG. 2. The same etching process shown in FIG. 2 is applied to FIG. 3. Therefore, the etching proceeds from the second surface 102 toward the inside in an oblique direction is performed. A second inclined surface 104 having a thickness increasing from the second surface 102 toward the first surface 101 is formed.

According to FIGS. 2 and 3, the first inclined surface 103 and the second inclined surface 104 are formed, and the through hole 105 defined by the inclined surfaces 103 and 104 is formed.

Also, although the mother frame 10 is not physically separated, the mother frame 10 may be configured with an insulating frame 100 and cutting frame 110. The insulating frame 100 accommodates the semiconductor chip 200 and the molding layer 300 through a subsequent manufacturing process, and the cutting frame 110 can be removed by cutting process. The insulating frame 100 and the cutting frame 110 are distinguished by a dotted line.

According to FIGS. 2 and 3, a first inclined surface 103 and a second inclined surface 104 are formed in the mother frame 10. The first inclined surface 103 is inclined from the first surface 101 toward inner space of the through hole 105, and the second inclined surface 104 is inclined from the second surface 102 toward the inner space of through hole 105.

Also, the mother frame 10 of this embodiment can have various inclined surfaces according to the etching process. That is, the first inclined surface 103 and the second inclined surface 104 of the insulating frame 100 may have various shapes.

Figure 4:
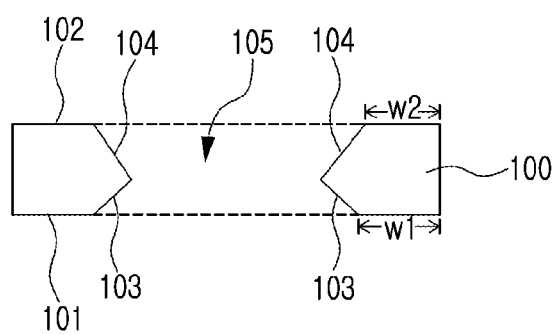
Figure 5:
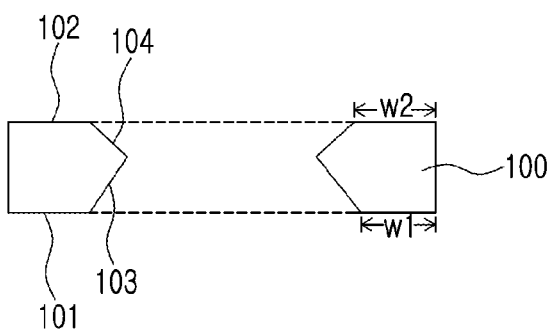

For example, the width W1 of the first surface 101 may be set to be greater than the width W2 of the second surface 102 as shown in FIG. 4, and the width W1 of the first surface 101 may be set to be smaller than the width W2 of the second surface 102 as shown in FIG. 5. That is, the first inclined surface 103 and the second inclined surface 104 can be provided in various forms by the etching process. In the present embodiment, if the inner circumferential surface of the insulating frame 100 is convex toward the through hole 105, it will be understood that the present disclosure is intended.

Figure 6:
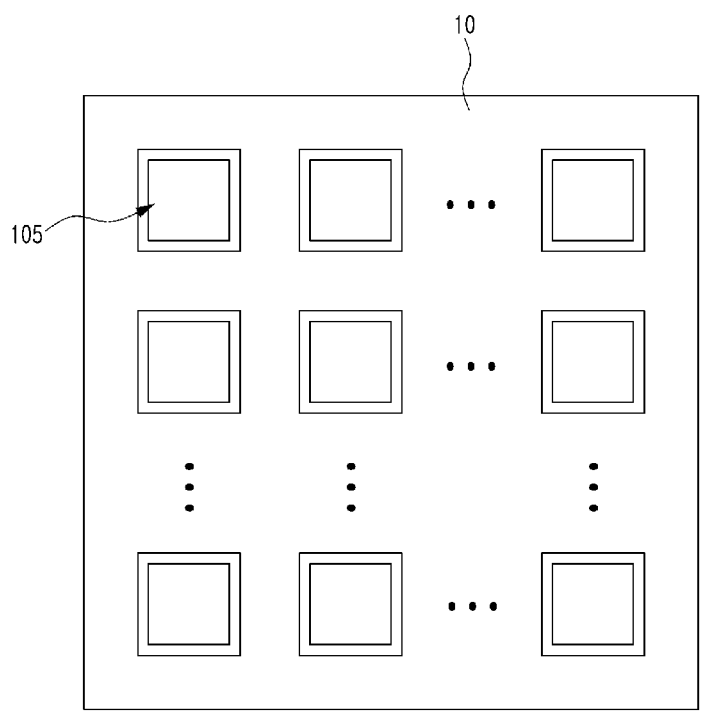

FIG. 6 is a top plan view of the mother frame shown in FIG. 3.

Referring to FIG. 6, the mother frame 10 is prepared with through holes 105. Further, a protrusion portion of which intermediate portion is concave toward the inner center portion of the through hole 105 appears.

As will be described later, semiconductor chips are disposed in each of the through holes 105, and molding process is performed. That is, the through hole 105 formed by the etching defines the region where the semiconductor chip and the molding layer 120 are disposed.

The through hole 105 of the mother frame 10 is shown in a rectangular shape on a plane, but various shapes such as a polygonal shape, a circular shape, or an elliptical shape are possible depending on the shape of the package. Furthermore, the mother frame 10 may has various shapes such as rectangular shape, polygonal shape, circular shape, or elliptical shape.

Figure 7:
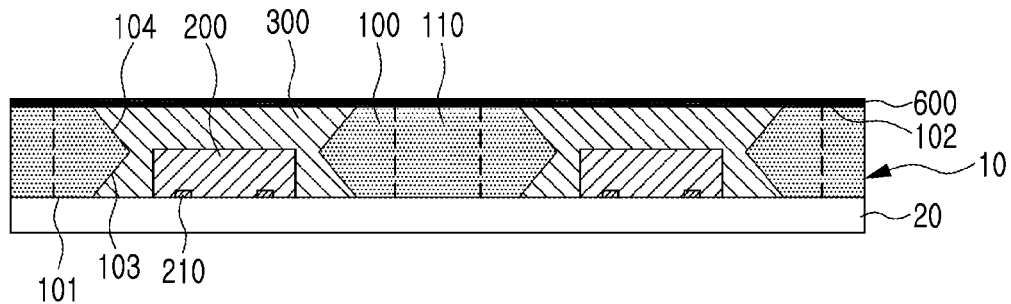

Referring to FIG. 7, the mother frame 10 shown in FIGS. 3 and 4 is disposed on the carrier substrate 20. The first surface 101 of the insulating frame 100 and the cutting frame 110 constituting the mother frame 10 are in contact with the carrier substrate 20 and the second surface 102 are exposed to the outside. Further, the carrier substrate 20 is exposed to the outside through the through hole of the insulating frame 100.

Then, the semiconductor chip 200 is disposed inside the through hole. The active surface on which the pad 210 is formed is brought into contact with the carrier substrate 20 so that the first surface 101 of the mother frame 10 and the active surface of the semiconductor chip 200 is preferable to form the same plane. Further, an adhesive agent or an adhesive film may be additionally provided between the carrier substrate 20 and the mother frame 10 to prevent the semiconductor chip 200 from moving during a subsequent molding process.

Subsequently, a molding process is performed on the semiconductor chip 200, and a molding layer 300 is formed. The molding layer 300 covers the semiconductor chip 200 from the outside and fills the through hole in which the semiconductor chip 200 is mounted.

Also, after the molding process, the protective film 600 may be formed on the second surface 102 of the mother frame 10 and molding layer 300 coplanar with the second surface 102.

Figure 8:
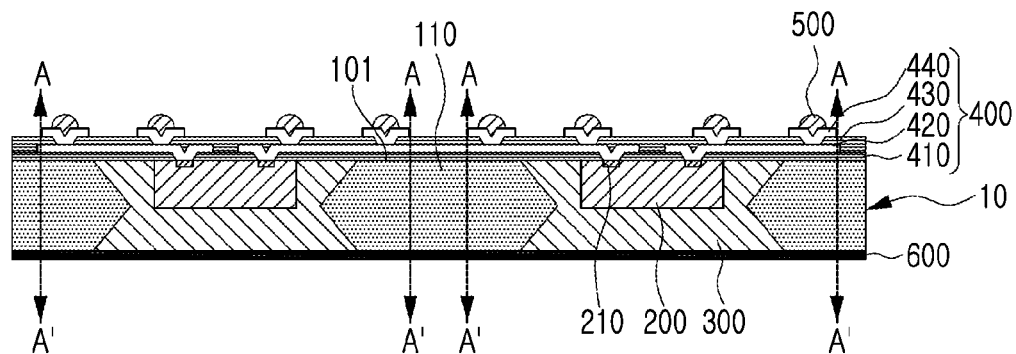

Referring to FIG. 8, the carrier substrate is separated from the mother frame 10 on which the molding layer 300 is formed. The pads 210 of the semiconductor chip 200 and the first surface 101 of the mother frame 10 are exposed by separation of the carrier substrate. A redistribution layer 400 and an external connection terminal 500 are sequentially formed on the pad 210 of the semiconductor chip 200 and the first surface 101 of the mother frame 10.

The redistribution layer 400 is formed according to a conventional manufacturing process. That is, a first insulation layer 410 is formed by deposition, and the pad 210 of the semiconductor chip 200 is exposed by selective etching of the first insulation layer 410. Then, a first wiring layer 420 is formed on the first insulation layer 410. The first wiring layer 420 is electrically connected to the pad 210 of the semiconductor chip 200 and a part of the first wiring layer 420 is physically contacted with the pad 210. In addition, the first wiring layer 420 is formed to extend to a region other than the region of the semiconductor chip 200. A second insulation layer 430 is formed on the first wiring layer 420 and a second wiring layer 440 electrically connected to the first wiring layer 420 is formed by selective etching and a conventional deposition process. That is, the second insulation layer 430 is selectively etched to expose a portion of the first wiring layer 420 in a specific region. Then, when the metal deposition process is performed, the first wiring layer 420 is electrically connected to the second wiring layer 440.

An external connection terminal 500 is formed on the second wiring layer 440 of the redistribution layer 400. The external connection terminal 500 is preferably a solder ball or a bump. In addition, the second wiring layer 440 may be omitted according to the embodiment. That is, the external connection terminal 500 may be formed directly on the first wiring layer 420.

The semiconductor chip 200 is mounted in the through hole of the mother frame 10 and the molding layer 300 for filling the through hole is formed. A redistribution layer 400 is formed on the active surface of the semiconductor chip 200 and the first surface 101 of the insulating frame 100.

Finally, the cutting frame 110 constituting the mother frame 10 is removed by cutting, and the insulating frame 100 is left, so that the semiconductor package shown in FIG. 1 can be obtained.

Figure 9:
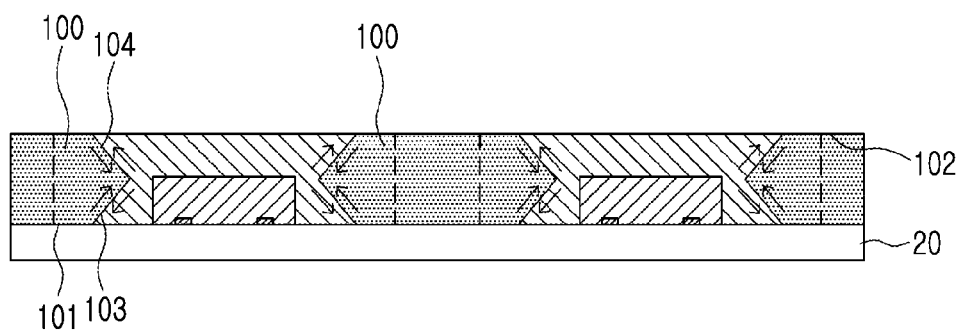
FIGS. 9 and 10 are schematic views for explaining the operation of the molding layer and the mother frame during molding in the method of manufacturing the semiconductor package shown in FIGS. 2 to 8.
Figure 10:
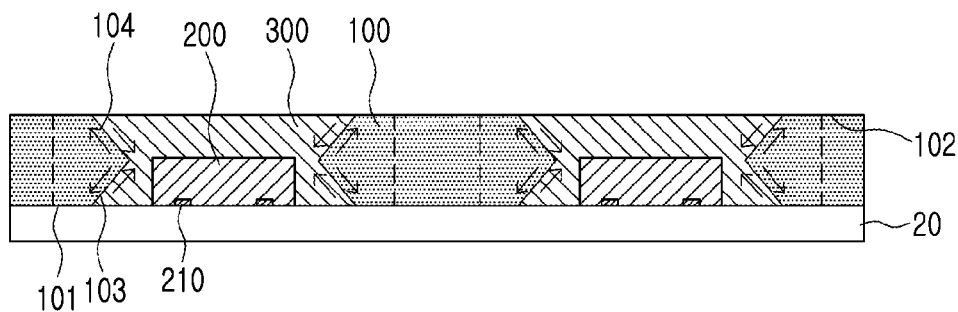

FIGS. 9 and 10 are schematic views for explaining the operation of the molding layer and the mother frame during molding in the method of manufacturing the semiconductor package shown in FIGS. 2 to 8.

Referring to FIG. 9, in the heating process for molding, the EMC constituting the molding layer 300 acts stress along the inner wall of the mother frame 10 due to the thermal expansion coefficient. In addition, the mother frame 10 also applies stress to the molding layer 300 due to applied heat.

In the present embodiment, the middle portion of the mother frame 10 or the insulating frame 100 has a wider width than the lower first surface 101 or the upper second surface 102. That is, the inner wall of the insulating frame 100, which is cut and individualized in the mother frame 10, has a convex shape toward through hole at the middle portion.

That is, the first inclined surface 103 and the second inclined surface 104 are formed along the inner circumferential surface of the mother frame 10.

In the heating process for performing molding process, the EMC is expanded by the applied pressure and heat. The expansion of the molding layer 300 causes stress along the first inclined surface 103 and the second inclined surface 104. Further, the mother frame 10 also causes stress in accordance with the thermal expansion toward the molding layer 300 by the heating process. The direction of the stress in the heating process is parallel to the inclined surfaces 103 and 104.

That is, the expansion of the molding layer 300 generates thermal stress toward the lower first surface 101 at the first inclined surface 103 and generates the thermal stress toward the upper second surface 102 at the second inclined surface 104.

In addition, in the heating process, the mother frame 10 induces stress along the first inclined surface 103 and the second inclined surface 104, but the stress direction has a different pattern from the stress due to the expansion of the molding layer 300. That is, stress due to the thermal expansion of the mother frame 10 is applied from the first surface 101 to the upper direction along the first inclined surface 103 and applied from the second surface 102 to lower direction along the second inclined surface 104.

Therefore, the thermal expansion in the molding layer 300 and the thermal expansion in the mother frame 10 cause an effect of evenly dispersing along the inner circumferential surface of the mother frame 10. Thus, problems such as damage of the mother frame 10 and errors in the arrangement of semiconductor chips due to thermal expansion can be prevented.

Referring to FIG. 10, in the cooling process for the molding layer 300, the heated molding layer 300 and the mother frame 10 are cooled with a specific temperature gradient. Therefore, the expanded material has a tendency to shrink in accordance with the thermal expansion coefficient. The contraction progresses inversely to the expansion and the generated stress has a different direction.

That is, upon cooling, the molding layer 300 causes stress along the first inclined surface 103 from the first surface 101 toward the upper surface and causes stress along the second sloped surface 104 from the second surface 102 toward lower surface. In addition, the mother frame 10 also induces stress along the first inclined surface 103 toward the first surface 101 and along the second inclined surface 104 toward the second surface 102.

Therefore, generation of gaps between the mother frame 10 and the molding layer 300 or mis-arrangement of the semiconductor chip 200 can be prevented at the cooling process.

Figure 11:
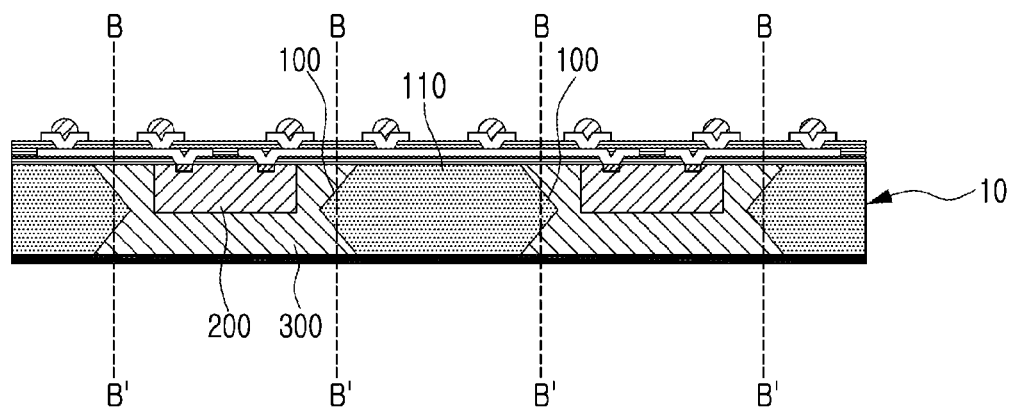
FIGS. 11 and 12 are cross-sectional views illustrating various modified examples according to the cutting of the mother frame according to the first embodiment of the present disclosure.
Figure 12:
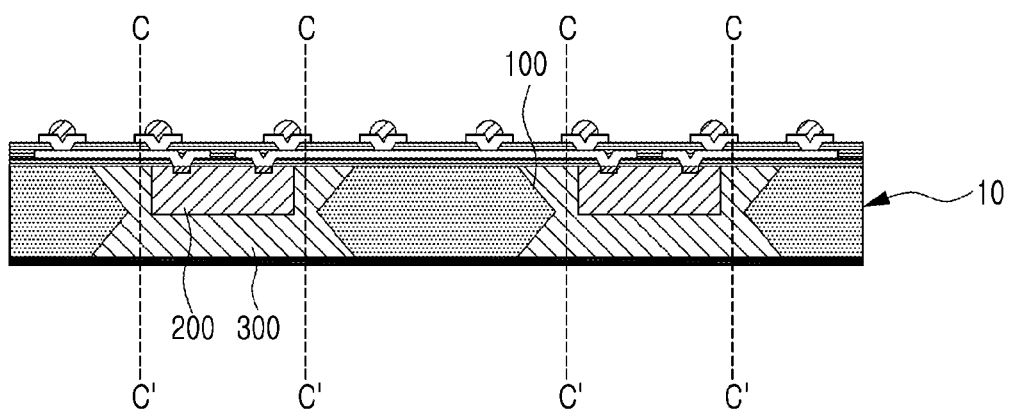

FIGS. 11 and 12 are cross-sectional views illustrating various modified examples according to the cutting of the mother frame according to the first embodiment of the present disclosure.

Referring to FIG. 11, the insulating frame 100 constituting the mother frame 10 may have a shape to surround a part of a side surface of the molding layer 300. This is because the cutting frame 110 defined by the cutting line indicated by the dotted line B-B' is set to extend to the through hole of the mother frame 10. That is, the cutting for the mother frame 10 can be performed for the molding layer 300 formed on the first inclined surface 103 or the second inclined surface 104. Thereby, the insulating frame 100 that surrounds a part of the side surface of the molding layer 300 can be obtained.

Further, referring to FIG. 12, the mother frame 10 is removed through cutting along the cutting line C-C'. Therefore, only the molding layer 300 surrounding the side and inactive surface of the semiconductor chip 200 remains. Since the molding layer 300 is provided in a state where the deformation due to thermal stress is minimized during the manufacturing process, mechanical deformation of the semiconductor package can be prevented in a continuous use environment of the semiconductor chip 200.

Figure 13:
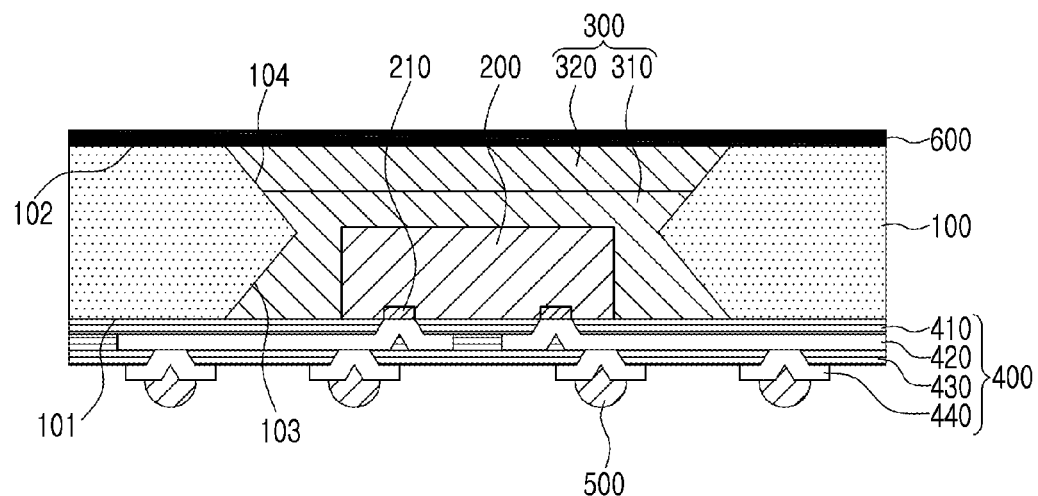
FIGS. 13 and 14 are two other cross-sectional views for explaining a semiconductor package using the insulating frame according to the first embodiment of the present disclosure and a method of manufacturing the semiconductor package.
Figure 14:
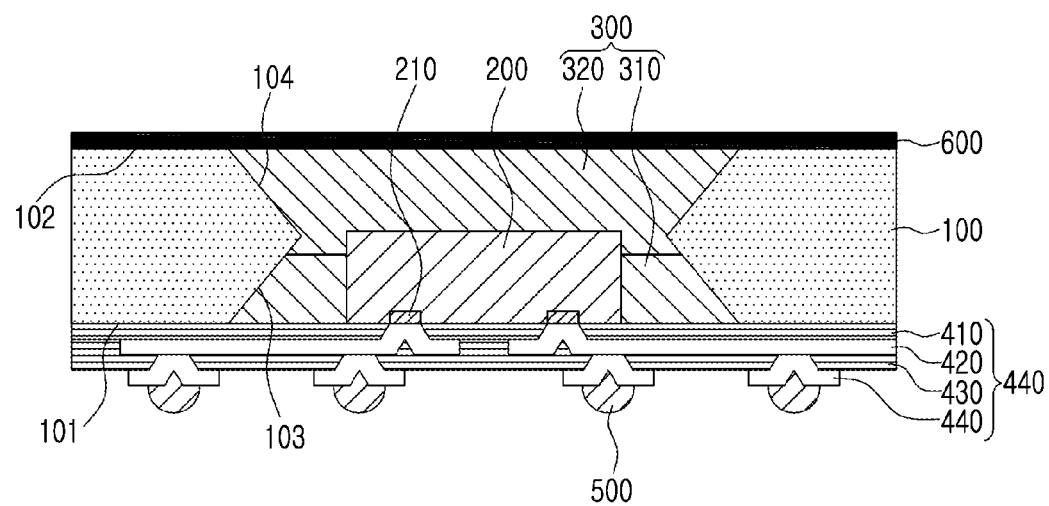

FIGS. 13 and 14 are two other cross-sectional views for explaining a semiconductor package using the insulating frame according to the first embodiment of the present disclosure and a method of manufacturing the semiconductor package.

Referring to FIG. 13, the semiconductor package is the same as FIG. 1 except for the configuration of the molding layer 300.

That is, the molding layer 300 has a first molding layer 310 and a second molding layer 320.

The first molding layer 310 is made of EMC, which is a normal insulating material. That is, a powder of an insulating polymer and an inorganic material such as silica may be consisted of, and a carbon black may be added.

In addition, the first molding layer 310 is formed to cover the back surface (inactive surface) of the semiconductor chip 200. Accordingly, the first molding layer 310 covers the side surface and the back surface of the semiconductor chip 200. A second molding layer 320 is provided on the first molding layer 310.

The second molding layer 320 has higher conductivity than the first molding layer 310. In order to have higher conductivity, the second molding layer 320 may be formed by mixing the conductive powder into the material of the first molding layer 310. The conductive powder may be conductive oxide particles or metal particles. The conductive oxide particles may be ZnO, ITO, or IZO, and the metal particles may be general metal particles such as Al, Ag, Cu, Fe, Au, or Zn.

The second molding layer 320 having higher conductivity than the first molding layer 310 shields electromagnetic waves generated from the semiconductor chip 200 or applied from the outside. Accordingly, malfunction of the semiconductor chip 200 due to interference by electromagnetic waves can be prevented. It is also preferable that the surface of the second molding layer 320 forms the same plane as the second surface 102 of the insulating frame 100.

Referring to FIG. 14, the first molding layer 310 covers a side surface or a part of a side surface of the semiconductor chip 200. The second molding layer 320 formed on the first molding layer 310 covers an upper portion of the semiconductor chip 200 and may cover the remaining portion of the side surface of the semiconductor chip 200. However, it is preferable that the second molding layer 320 does not cover the portion where the doped well region or the transistor of the active region is formed. That is, the first molding layer 310 needs to cover the predetermined side surface of the semiconductor chip 200, where is a predetermined region directly involved in the operation of the device.

In addition, the second molding layer 320 has the conductive powders. In the structure of FIG. 14, the second molding layer 320 not only shields electromagnetic interference, but also provides a ground to the semiconductor chip 200. Thereby, the operation of the semiconductor chip 200 can be operated in a more stable condition.

For example, the semiconductor chip 200 has a separate ground pad on its active surface. The ground pad is electrically connected to the weakly doped or undoped bulk regions. However, the ground voltage supplied through the ground pad may not be sufficiently supplied to the bulk region. This causes noise in the bulk region in the semiconductor chip 200, which may cause a body effect.

In FIG. 14, the back surface of the semiconductor chip 200 is covered by the second molding layer 320 having higher conductivity than the first molding layer 310, thereby preventing electromagnetic interference and body effect.

In addition, the formation of the first molding layer 310 and the second molding layer 320 is implemented in the process of FIG. 7. That is, the mother frame 10 is disposed on the carrier substrate 20, and the semiconductor chips 200 are mounted in the through holes 105 formed in the mother frame 10. Next, a first molding layer 310 for partially filling the through hole 105 is formed, and a second molding layer 320 is formed on the first molding layer 310 successively. And, the stress due to thermal expansion and heat shrinkage generated in the manufacturing process is evenly distributed through the inner wall of the insulating frame 100.

Figure 15:
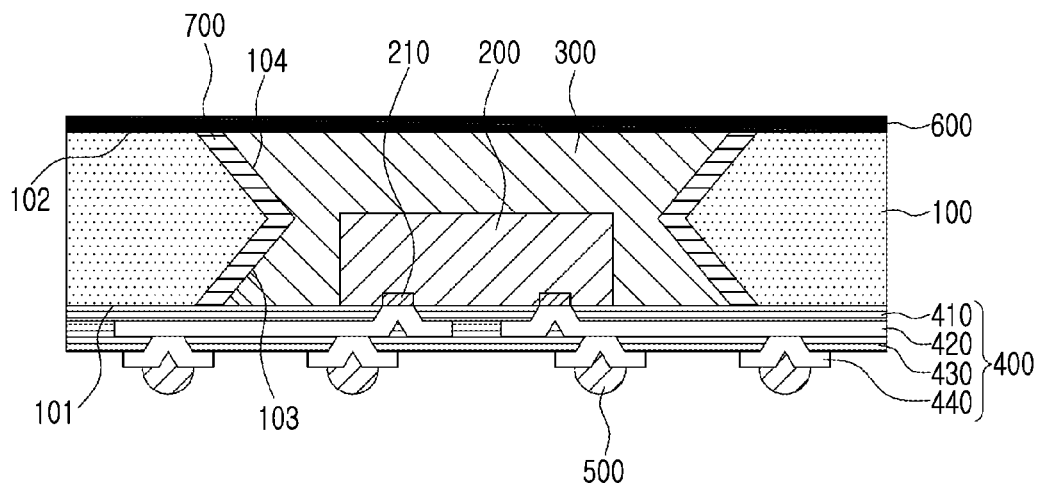
FIGS. 15 to 17 are yet three other cross-sectional views for explaining a semiconductor package using the insulating frame according to the first embodiment of the present disclosure and a method of manufacturing the same.
Figure 16:
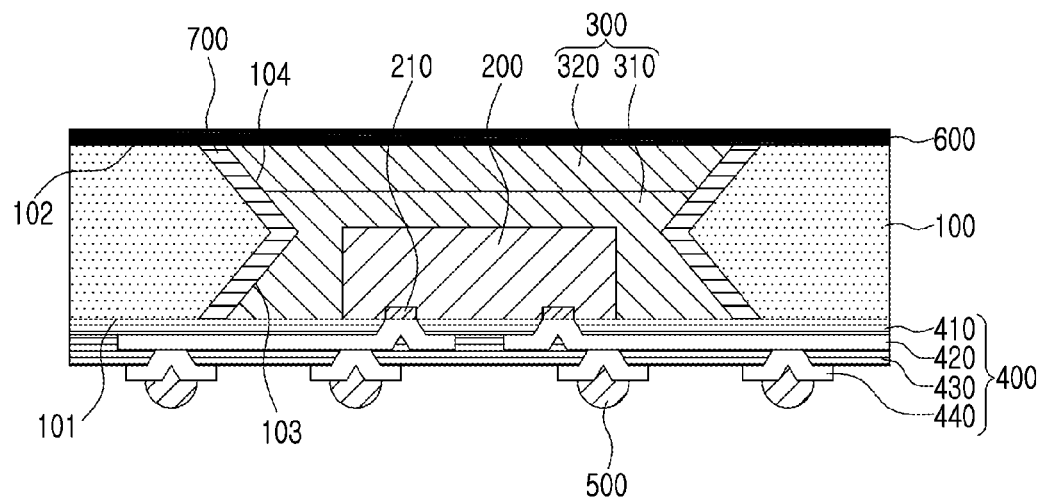
Figure 17:
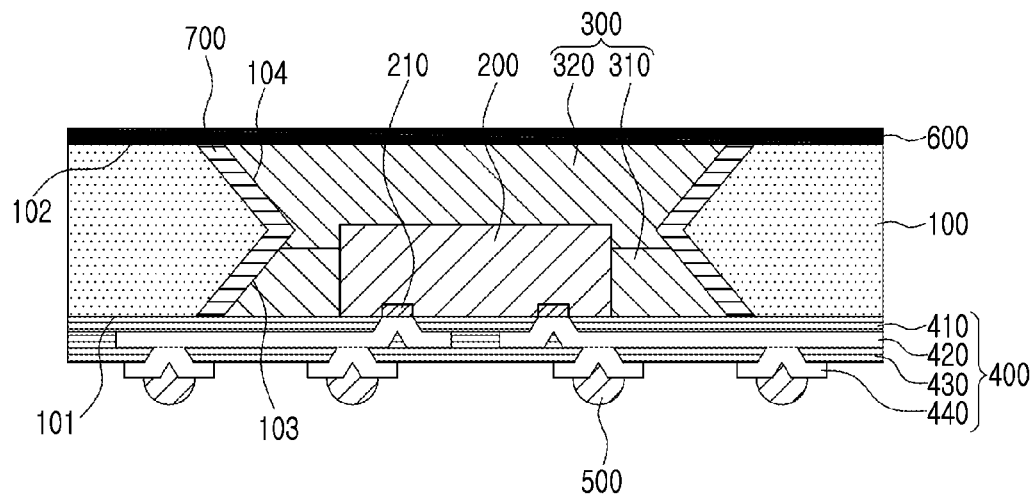

FIGS. 15 to 17 are yet three other cross-sectional views for explaining a semiconductor package using the insulating frame according to the first embodiment of the present disclosure and a method of manufacturing the same.

Referring to FIG. 15, the structure and material of the semiconductor package are the same as those of the semiconductor package shown in FIG. 1 except that a buffer layer 700 is formed between the insulating frame 100 and the molding layer 300.

The buffer layer 700 is provided between the insulating frame 100 and the molding layer 300. The buffer layer 700 preferably has conductivity of a metal material, and preferably has a thickness of at least a few um. Metals have superior ductility and malleability than ceramics or polymers. This means that mechanical stresses generated in the insulating frame 100 and the molding layer 300 that are in contact with the buffer layer 700 can be relaxed in the buffer layer 700. Accordingly, during the process of manufacturing the package, mechanical buffering function for expansion and contraction of the insulating frame 100 due to heat generated can be performed, and a mechanical buffering function for the expansion and contraction of the molding layer 300 can be performed.

In addition, the formation of the buffer layer 700 may be performed after the process of FIG. 3. That is, after the plurality of through holes 105 are formed in the mother frame 10, a buffer layer 700 made of a metal is formed on the first inclined surface 103 and the second inclined surface 104 of the inner wall of the mother frame 10 through a plating or deposition process. The metal layer formed on the first and second surfaces 101 and 102 may be removed through a CMP or etch back process. The buffer layer 700 may be formed on the first inclined surface 103 and the second inclined surface 104.

Referring to FIGS. 16 and 17, the structure and material of the semiconductor package are the same as those shown in FIGS. 13 and 14, except that a buffer layer 700 is formed between the insulating frame 100 and the molding layer 300. That is, the molding layer 300 has a first molding layer 310 and a second molding layer 320 formed on the first molding layer 310. The second molding layer 320 has a higher conductivity than the first molding layer 310.

The second molding layer 320 may perform an electromagnetic wave shielding operation or provide grounding. The second molding layer 320 is in contact with the conductive buffer layer 700 provided on the side surface. Therefore, the electromagnetic wave shielding operation is performed on the side surface in addition to the back surface of the semiconductor chip 200.

Figure 18:
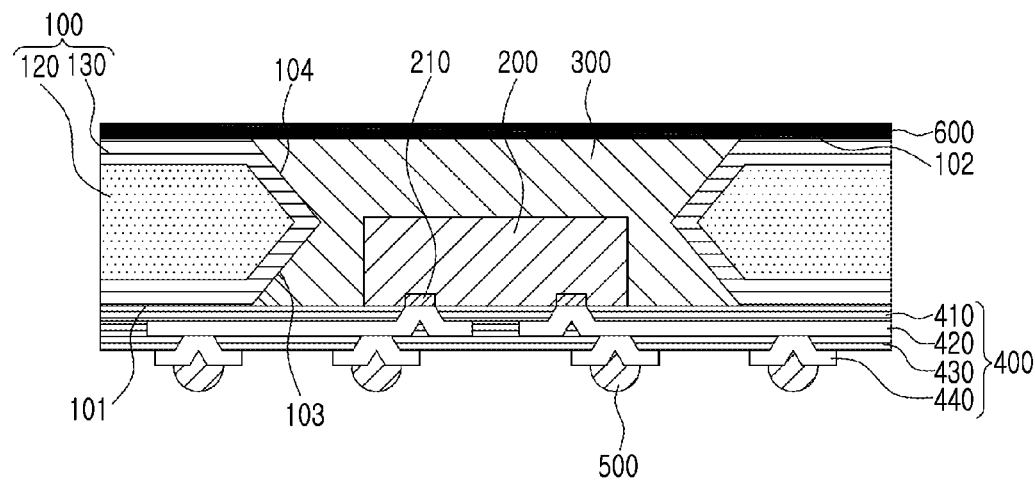
FIGS. 18 to 20 are still three other cross-sectional views for explaining a semiconductor package using the insulating frame according to the first embodiment of the present disclosure and a method of manufacturing the semiconductor package.
Figure 19:
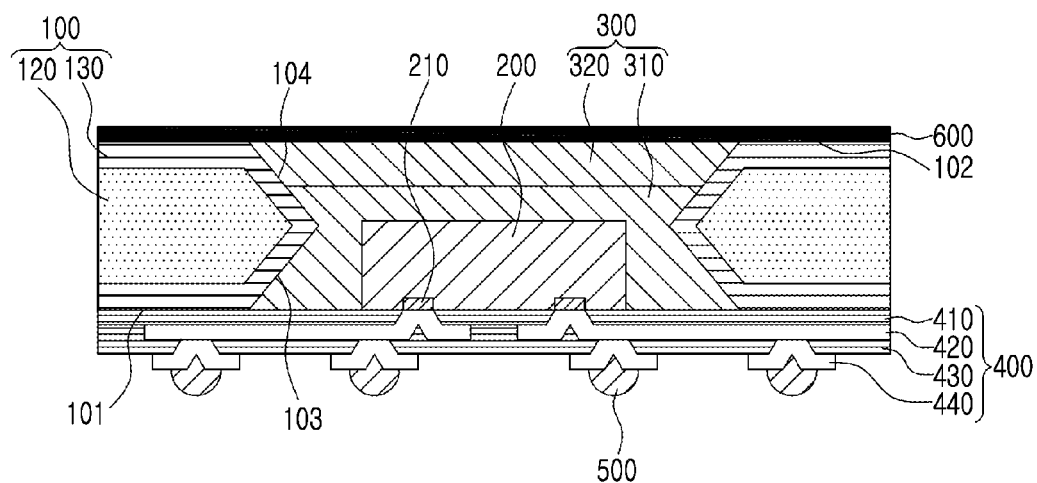
Figure 20:
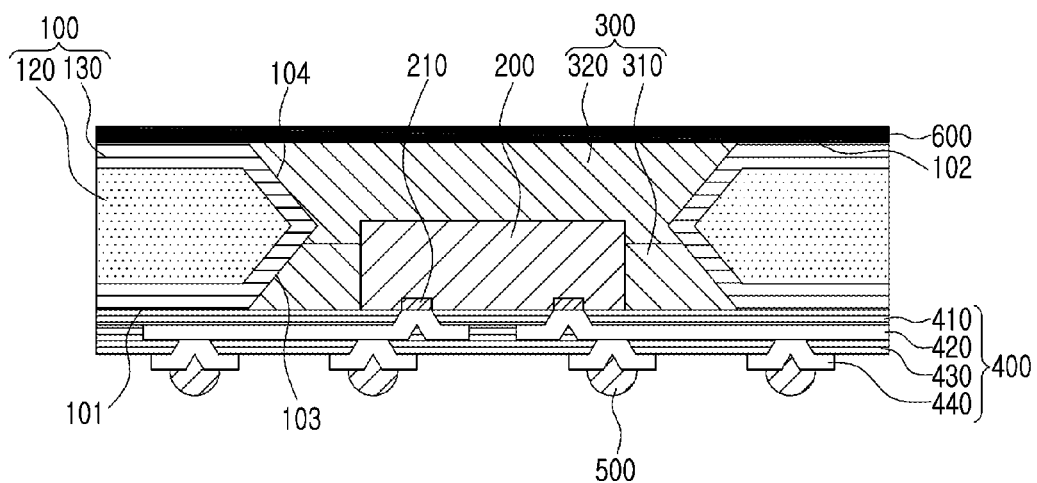

FIGS. 18 to 20 are still three other cross-sectional views for explaining a semiconductor package using the insulating frame according to the first embodiment of the present disclosure and a method of manufacturing the semiconductor package.

Referring to FIG. 18, the structure and material of the semiconductor package are the same as those of the semiconductor package shown in FIG. 1 except that the insulating frame 100 has the first insulating frame 120 and the second insulating frame 130.

The first insulating frame 120 may be made of a general insulating material and may have a soda lime glass as described in FIG. 1. The second insulating frame 130 is formed on the first insulating frame 120 and is formed by surface modification of the first insulating frame 120 without performing a specific coating or deposition process. The second insulating frame 130 has a higher mechanical strength than the first insulating frame 120.

When the first insulating frame 120 is formed of soda lime glass, the second insulating frame 130 may be a surface-enhanced soda lime glass. It has a structure in which sodium ions contained in soda lime glass are replaced with potassium ions. Potassium ion has a larger ionic radius than sodium ion, so it can induce compressive stress in the glass through substitution and improve the mechanical strength.

The stress generated by the thermal expansion or the thermal condensation can be more easily dispersed on the surface of the insulating frame 100 as the second insulating frame 130 having improved surface strength is used. In addition, it is preferable that the process of forming the second insulating frame 130 is performed immediately after the process of forming the through hole 105 described in FIG. 3.

Referring to FIGS. 19 and 20, a molding layer 300 for filling a through hole is composed of a first molding layer 310 and a second molding layer 320. The arrangement and material of the first molding layer 310 and the second molding layer 320 are the same as those described in FIGS. 13 and 14. Accordingly, the second molding layer 320 has higher conductivity than the first molding layer 310. Thus, electromagnetic interference can be minimized.

Figure 21:
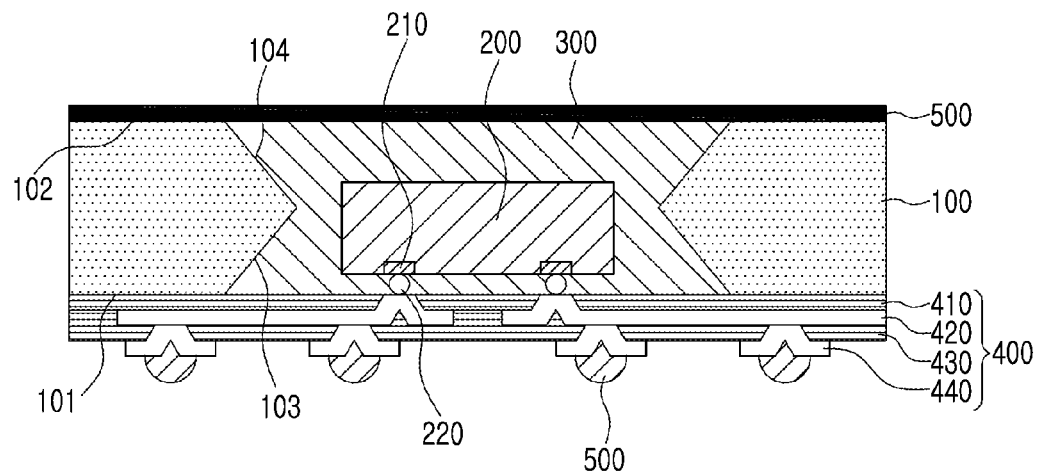
FIG. 21 is still another cross-sectional view for explaining a semiconductor package using the insulating frame according to the first embodiment of the present disclosure and a method of manufacturing the semiconductor package.

FIG. 21 is still another cross-sectional view for explaining a semiconductor package using the insulating frame according to the first embodiment of the present disclosure and a method of manufacturing the semiconductor package.

Referring to FIG. 21, the structure and material of the semiconductor package are the same as those of the semiconductor package shown in FIG. 1 except that the semiconductor chip 200 and the internal connection terminal 220 are provided in the semiconductor package.

That is, the semiconductor chip 200 and the internal connection terminal 220 are provided in the through hole defined by the first inclined surface 103 and the second inclined surface 104 of the insulating frame 100. The semiconductor chip 200 and the internal connection terminal 220 may be manufactured by specific processes. That is, individualization of the semiconductor chip 200 proceeds from the manufactured wafer, and the internal connection terminal 220 is formed on the pad 210 provided on the semiconductor chip 200. That is, the semiconductor chip 200 having the internal connection terminal 220 is disposed in the through hole.

The molding layer 300 covers the semiconductor chip 200 having the internal connection terminals 220 and the redistribution layer 400 is formed on the first surface 101 of the insulation frame 100 and the molding layer 300. In addition, the external connection terminal 500 is provided on the redistribution layer 400.

The semiconductor package disclosed in FIG. 21 can be manufactured by using the process of FIGS. 7 and 8.

That is, in FIG. 7, the semiconductor chip 200 having the internal connection terminal 220 is mounted in the through hole 105 of the mother frame 10 that is disposed on the carrier substrate 20. Then, a molding process is performed to fill the semiconductor chip 200 having the internal connection terminal 220 therein.

In FIG. 8, the carrier substrate is removed, and a redistribution layer 400 is formed on the first surface 101 of the insulation frame 100 and the molding layer 300. When forming the redistribution layer 400, the internal connection terminal 220 can be embedded by the molding layer 300. Therefore, a selective etching process for exposing the internal connection terminal 220 can be performed, so that the internal connection terminal 220 can be electrically connected to the redistribution layer 400.

Second Embodiment

Figure 22:
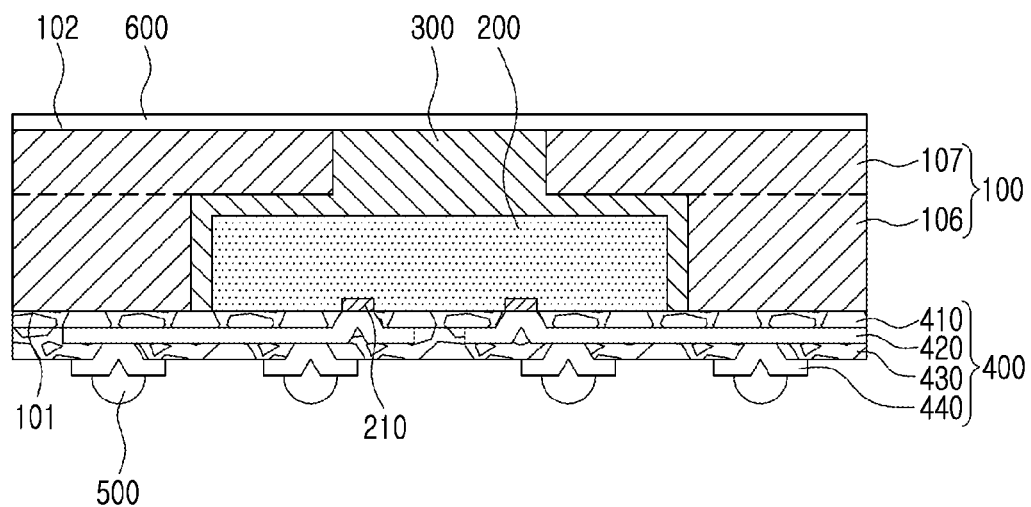
FIG. 22 is a cross-sectional view of a semiconductor package according to a second embodiment of the present disclosure.

FIG. 22 is a cross-sectional view of a semiconductor package according to a second embodiment of the present disclosure.

Referring to FIG. 22, the semiconductor package of this embodiment includes an insulating frame 100, a semiconductor chip 200, a molding layer 300, a redistribution layer 400, an external connection terminal 500, and a protective film 600.

The material of the insulating frame 100 is the same as that shown in the first embodiment. The insulating frame 100 may be variously selected depending on the material of the carrier substrate or the molding layer 300 to be used.

For example, soda lime glass has a thermal expansion coefficient of 9 to 9.5 ppm/° C., which is a thermal expansion coefficient in a range similar to the molding layer 300, and the thermal stress between the insulating frame 100 and the molding layer 300 can be minimized.

Also, it is required that the width of the lower first surface 101 is narrower than the width of the upper second surface 102. For example, the insulating frame 100 has a first hole frame 106 and a second hole frame 107. The first hole frame 106 has the first surface 101, and the second hole frame 107 has the second surface 102 that has larger width than that of the first surface 101 of the first hole frame 106. The first hole frame 106 and the second hole frame 107 have the same material and may have a continuous structure that is not physically separated from each other.

The through holes in the insulating frame 100 defined by the first hole frame 106 and the second hole frame 107 are separated into a first through hole and a second through hole. The space of the first hole frame 106 is defined as a first through hole and the space of the second hole frame 107 is defined as a second through hole. The first through hole has a larger width and area than the second through hole. The first through hole has a width and an area capable of accommodating the semiconductor chip 200, and the second through hole has a narrower width than the semiconductor chip 200. Thus, the second hole frame 107 is formed extending over a partial region of the semiconductor chip.

In addition, according to the embodiment, the second through hole may have a wider width than the semiconductor chip 200.

The semiconductor chip 200 is provided in the first through hole of the insulating frame 100. The semiconductor chip 200 has an active surface on which active elements such as pads 210, metal lines or transistors are formed, and has a back surface (inactive surface) opposite to the active surface. The active surface of the semiconductor chip 200 forms the same plane as the first surface 101 of the insulating frame 100.

A molding layer 300 is filled between the semiconductor chip 200 and the insulating frame 100. Since the semiconductor chip 200 is provided in the first through hole, the width of the second through hole is preferably set smaller than the width of the semiconductor chip 200. The molding layer 300 fills the first through hole and the second through hole. It is preferable that the molding layer 300 filling the through holes forms the same plane as the second surface 102 of the insulating frame 100. The material of the molding layer 300 is the same as that described in FIG. 1 of the first embodiment. The molding layer 300 may further include a conductive powder.

The redistribution layer 400 is formed on the active surface of the semiconductor chip 200 or on the first surface 101 of the insulating frame 100. The redistribution layer 400 formed has a first insulation layer 410, a first wiring layer 420, a second insulation layer 430, and a second wiring layer 440. However, the configuration of the redistribution layer 400 is only an example configured to realize the fan-out structure, and the configuration of the redistribution layer 400 described above can be variously modified by those skilled in the art.

Also, the redistribution layer 400 may be formed in any shape as far as the external connection terminal 500 can be formed on an outside the area occupied by the semiconductor chip 200. In FIG. 22, the first wiring layer 420 extends beyond the region occupied by the semiconductor chip 200 and extends to a lower region of the insulating frame 100. In addition, the first wiring layer 420 may extend to a region of the molding layer 300.

In addition, the redistribution layer 400 is electrically connected to the external connection terminal 500. The external connection terminal 500 has a solder ball or bump structure. More specifically, the external connection terminal 500 is formed on the second wiring layer 440 and is electrically connected to the pads 210 of the semiconductor chip 200. In addition, the second wiring layer 440 may be omitted according to the embodiment. That is, the external connection terminal 500 may be formed directly on the first wiring layer 420.

The protective film 600 may be provided on the second surface 102 of the insulating frame 100 and the molding layer 300 having the same plane with the second surface 102. The function and material of the protective film 600 are the same as those described in FIG. 1.

In FIG. 22, the semiconductor chip 200 is mounted in the first through hole. In addition, the distance between the first hole frame 106 and the side surface of the semiconductor chip 200 is reduced to several tens nm to several um. Therefore, the inconsistency of the alignment due to the movement of the semiconductor chip 200 or the change of the position in the molding layer 300 can be prevented.

In addition, since the insulating frame 100, which is a material having high brittleness, encloses the side surface of the molding layer 300, the thermal deformation phenomenon is minimized Particularly, the second hole frame 107 is formed over the semiconductor chip 200. That is, a part of the back surface of the semiconductor chip 200 is covered with the second hole frame 107. If the entire back surface of the semiconductor chip 200 is covered only with the molding layer 300, the characteristics of the semiconductor chip 200 may be deformed due to the penetration of moisture or the application of mechanical stress due to the external environment. Characteristics deformation of semiconductor can be prevented by the insulating frame 100 of a brittle material such as soda lime glass.

FIGS. 23 to 30 are sectional views and plan views for explaining a method of manufacturing the semiconductor package of FIG. 22 according to the second embodiment of the present disclosure.

Figure 23:
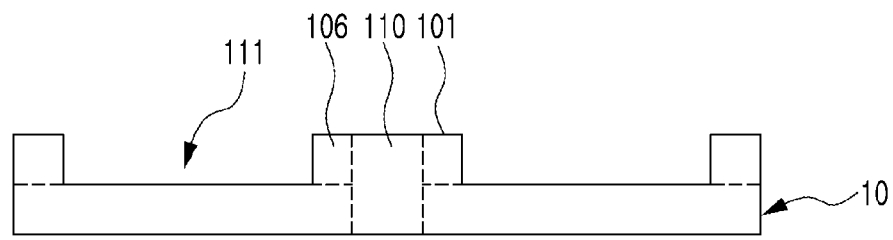
FIGS. 23 to 30 are sectional views and plan views for explaining a method of manufacturing the semiconductor package of FIG. 22 according to the second embodiment of the present disclosure.

Referring to FIG. 23, a mother frame 10 is prepared. The mother frame 10 is made of an insulating material for providing the insulating frame 100 of FIG. 22, and preferably has a thermal expansion coefficient similar to that of the carrier substrate or the molding layer described later. The mother frame 10 has the same material as the mother frame described in the first embodiment.

A photoresist pattern (not shown) is provided on the first surface 101 of the mother frame 10. The photoresist pattern may be formed by a conventional photolithography process in accordance with the deposition of the photoresist, the exposure, and the development process.

The formed photoresist pattern is used as an etching mask to etch the mother frame 10. The selective etch for the mother frame 10 may be wet or dry, and any etch may be used. A first through hole 111, which is an inner space of the first hole frame 106, is formed by etching process. In FIG. 23, the first hole frame 106 is provided in a form not distinguished from the mother frame 10 and is defined by a dotted line. The first hole frame 106 may be separated and individualized from the mother frame 10 with the removal of the cutting frame 110 in the cutting process for the mother frame 10 thereafter.

Figure 24:
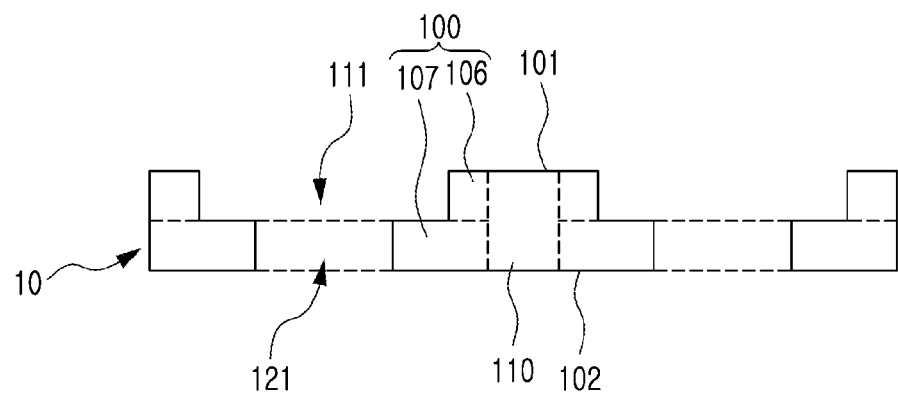

Referring to FIG. 24, the second etching for the mother frame 10 of FIG. 23 is performed. A second through hole 121 having a smaller space than the first through hole 111 is formed by the second etching. In FIG. 24, the mother frame 10 may be divided into a first hole frame 106 defining a first through hole 111 and a second insulating frame 120 defining a second through hole 121. Further, the interval between the insulating frames 100 can be defined as a cutting frame 110 which is removed by a subsequent cutting process. However, as described above, the insulating frame 100 having the first hole frame 106 and the second hole frame 107 may be individualized and defined by a cutting process for the mother frame 10 thereafter.

Figure 25:
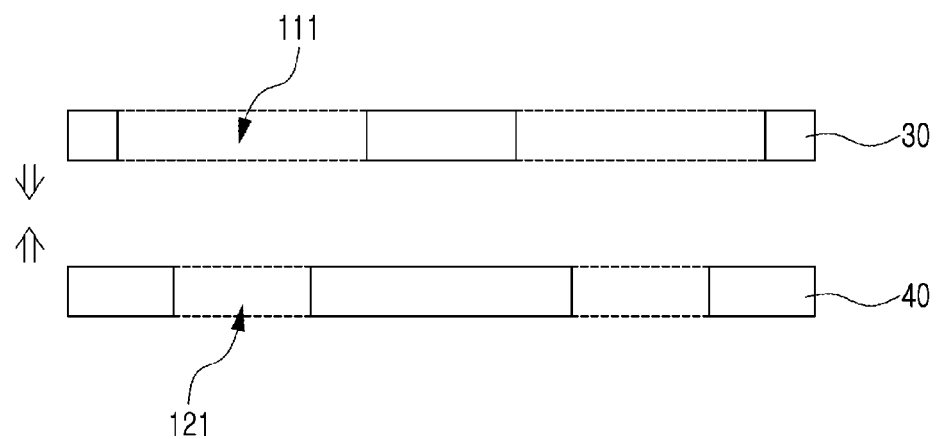

FIG. 25 is a sectional view showing another method of manufacturing the mother frame of FIG. 24.

Referring to FIG. 25, two mother frames 30 and 40 are prepared. That is, the first through hole 111 in the first mother frame 30 is formed by etching the first mother frame 30. The second mother frame 40 provided independently of the first mother frame 30 is etched to form the second through hole 121 in the second mother frame 40.

Then, the first mother frame 30 and the second mother frame 40 are joined together to form the mother frame 10 shown in FIG. 24. The joining of the mother frames 30 and 40 can be achieved by a fusion process in which the joining faces are partially melted to induce joining.

Figure 26:
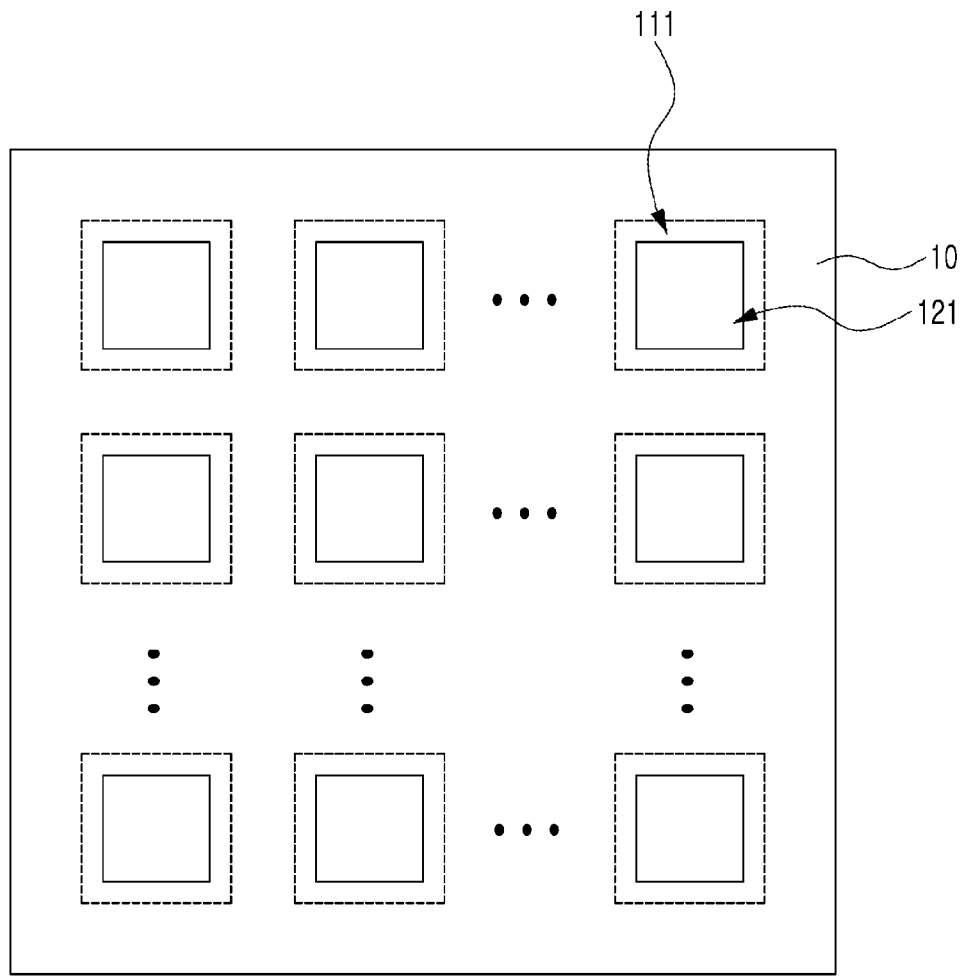

FIG. 26 is a bottom plan view showing the mother frame shown in FIG. 24.

Referring to FIG. 26, an inner area of the mother frame 10 defined by a dotted line is defined as a first through hole 111, and an inner area of the mother frame 10 defined by a solid line is defined as a second through hole 121. A semiconductor chip is mounted on the first through hole 111, and a molding layer is filled.

Figure 27:
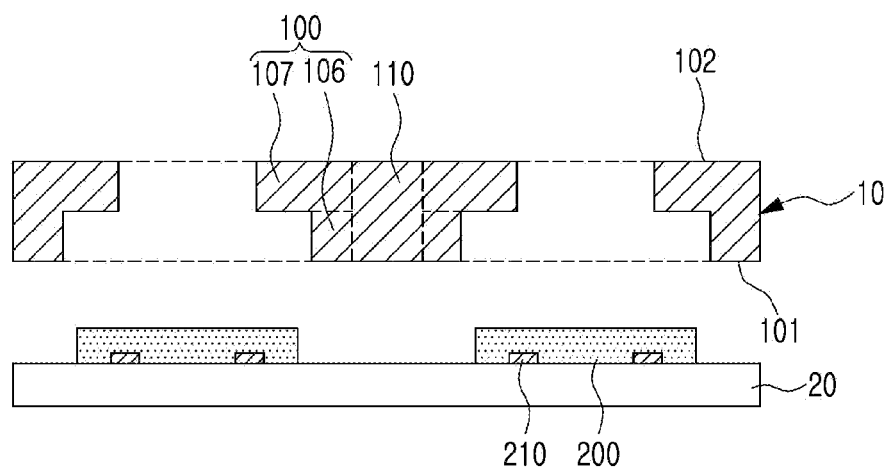

Referring to FIG. 27, a plurality of semiconductor chips 200 are arranged on the carrier substrate 20 at regular intervals. An adhesive layer may be interposed between the semiconductor chip 200 and the carrier substrate 20 in order to prevent the semiconductor chips 200 from moving on the carrier substrate 20. The adhesive layer may be provided in the form of a film which is easily detachable.

The semiconductor chip 200 disposed on the carrier substrate 20 has an active surface on which the pads 210 are disposed facing the carrier substrate 20 and a back surface opposite to the active surface is opened toward the top.

The mother frame 10 of FIG. 24 is prepared on the carrier substrate 20 on which the semiconductor chip 200 is disposed. The mother frame 10 is prepared so that the first surface 101 faces the carrier substrate 20.

Figure 28:
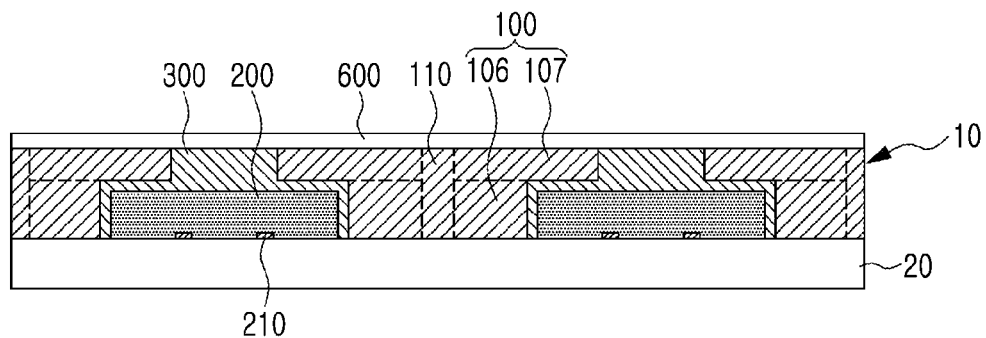

Referring to FIG. 28, a mother frame 10 is arranged on a carrier substrate 20. The first surface 101 of the mother frame 10 faces the carrier substrate 20. Further, the semiconductor chip 200 is disposed in the first through hole defined by the first hole frame 106 of the mother frame 10. That is, the semiconductor chip 200 is accommodated in the first through hole. Particularly, it is required that the interval of the second through holes defined by the second hole frame 107 is narrower than the width of the semiconductor chip 200. A protruding portion of the second hole frame 107 toward the second through hole covers a part of the back surface of the semiconductor chip 200.

Subsequently, a molding layer 300 for filling a through hole is formed. The EMC (Epoxy Molding Compound) constituting the molding layer 300 may have a usual material. That is, it may have a material including an insulating polymer, silica powder or carbon black. However, the molding layer 300 for filling the inside of the first through hole needs to cover the side surface and the back surface of the semiconductor chip 200. Then, a heat treatment may be added to ensure the fluidity of the EMC during the molding process.

The protective film 600 may be attached to the second surface 102 of the mother frame 10 and the molding layer 300 after the molding layer 300 is formed. The protective film 600 serves to protect moisture and relax external mechanical impact.

Figure 29:
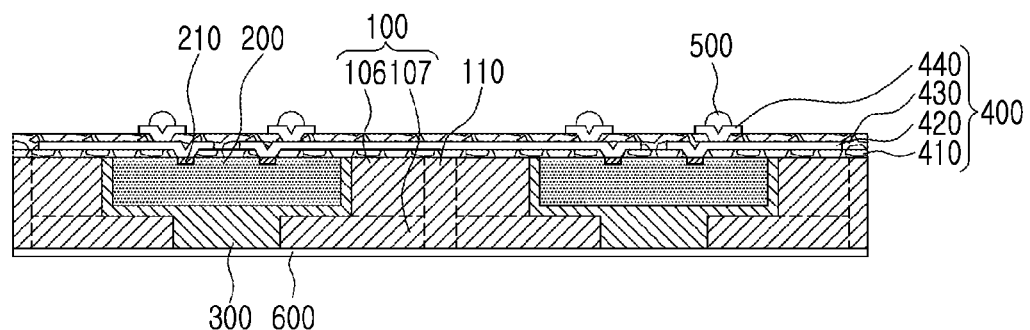

Referring to FIG. 29, the mother frame 10 on which the molding layer 300 is formed is separated from the carrier substrate. The pads 210 of the semiconductor chip 200 and the first surface 101 of the mother frame 10 are exposed by separation from the carrier substrate. A redistribution layer 400 and an external connection terminal 500 are sequentially formed on the pad 210 of the semiconductor chip 200 and the first surface 101 of the mother frame 10.

The formation of the redistribution layer 400 is the same as that described in FIG. 8 of the first embodiment.

An external connection terminal 500 may be formed on the second wiring layer 440 of the redistribution layer 400. The external connection terminal 500 is preferably a solder ball or a bump.

Through the above process, the semiconductor chip 200 is mounted in the first through hole 111 of the mother frame 10, and the molding layer 300 filling the through holes is formed. A redistribution layer 400 is formed on the active surface of the semiconductor chip 200 and on the first surface 101 of the mother frame 10.

Figure 30:
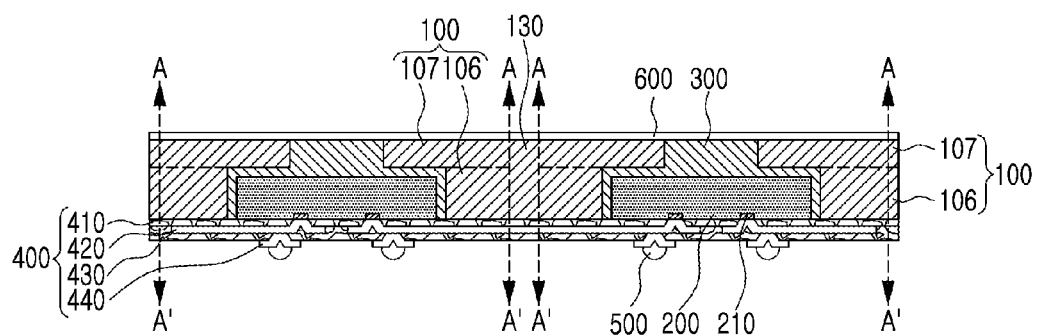

Referring to FIG. 30, a region indicated by a dotted line in the mother frame 10 is cut to individualize the semiconductor package. Thus, the semiconductor package shown in FIG. 22 can be obtained.

The cutting is performed along the cutting line A-A'. Thus, the cutting frame 110 is removed from the mother frame 10, and the insulating frame 100 is separated from the mother frame 10.

That is, an individualized insulating frame 100 can be obtained by cutting the mother frame 10, and the semiconductor chip 200 is accommodated in the insulating frame 100 and disposed in the first through hole. The molding layer 300 fills the through hole, and the redistribution layer 400 is formed on the active surface of the semiconductor chip 200 and the first surface 101 of the insulating frame 100.

Figure 31:
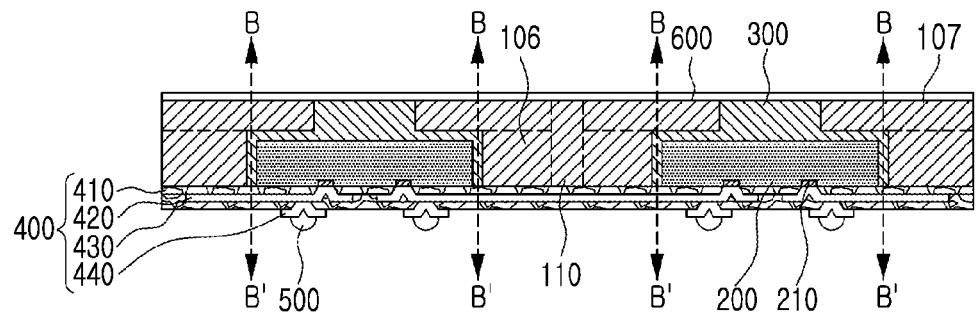
FIGS. 31 and 32 are cross-sectional views showing various modifications of the cutting for the mother frame of FIG. 29 according to the second embodiment of the present disclosure.
Figure 32:
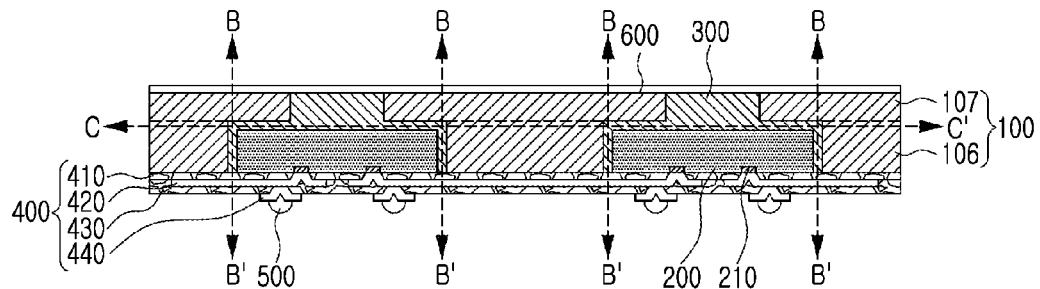

FIGS. 31 and 32 are cross-sectional views showing various modifications of the cutting for the mother frame of FIG. 29 according to the second embodiment of the present disclosure.

The shape of the semiconductor package individualized by cutting can be variously modified in comparison with the semiconductor package shown in FIG. 22.

Referring to FIG. 31, the cutting is processes to a part of the molding layer 300 which fills the first through hole along the cutting line B-B In addition, a part of the second hole frame 107 is also cut so that only protruding portions of the second hole frame 107 can remain.

Therefore, the first hole frame 106 is not included in the semiconductor package, and only the molding layer 300 remains on the side surface of the semiconductor chip 200.

In addition, only a part of the second hole frame 107 remains on the upper part of the molding layer 300 partially covering the back surface of the semiconductor chip 200. The protrusions of the remaining second hole frame 107 in FIG. 31 may protect the molding layer 300 and the semiconductor chip 200 from the external environment. That is, it is possible to prevent the mechanical impact or the penetration of moisture which may be externally applied.

The protrusions of the second hole frame 107 are formed on both sides in the cross-sectional view of FIG. 31 and form only the second through holes, but they are generally connected to each other. Therefore, mechanical distortion of the semiconductor package due to the thermal stress generated by the operation of the semiconductor chip 200 is prevented.

Referring to FIG. 32, the cutting of the mother frame disposed between the adjacent semiconductor chips 200 is processed along the cutting line B-B', and cutting process is performed at the molding layer 300 disposed between the semiconductor chip 200 and the first hole frame 106. Also, the second hole frame 107 is removed along line C-C'. The second hole frame 107 may be removed by a process such as back grinding. A semiconductor package in which the only molding layer 300 is formed on the side and back surface of the semiconductor chip 200 can be manufactured.

The semiconductor package manufactured by the cutting shown in FIG. 32 is a semiconductor package in which deformation due to thermal deformation or external mechanical stress is minimized by the insulating frame removed in the manufacturing process.

In addition, the semiconductor package manufactured by the processes of FIGS. 31 and 32 may be a fan-in type in which the external connection terminal is limited to the semiconductor chip region.

Figure 33:
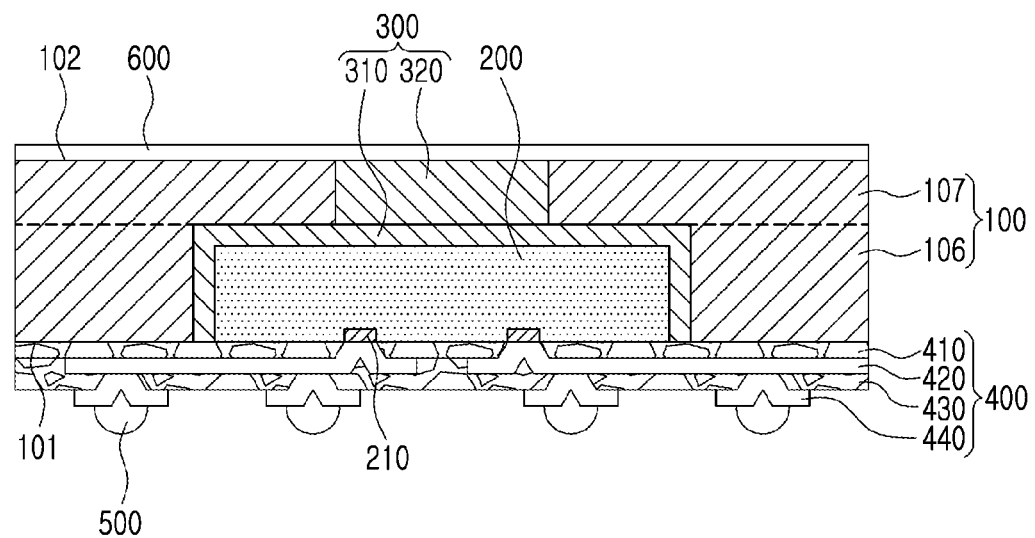
FIGS. 33 and 34 are two other cross-sectional views of semiconductor packages according to a second embodiment of the present disclosure.
Figure 34:
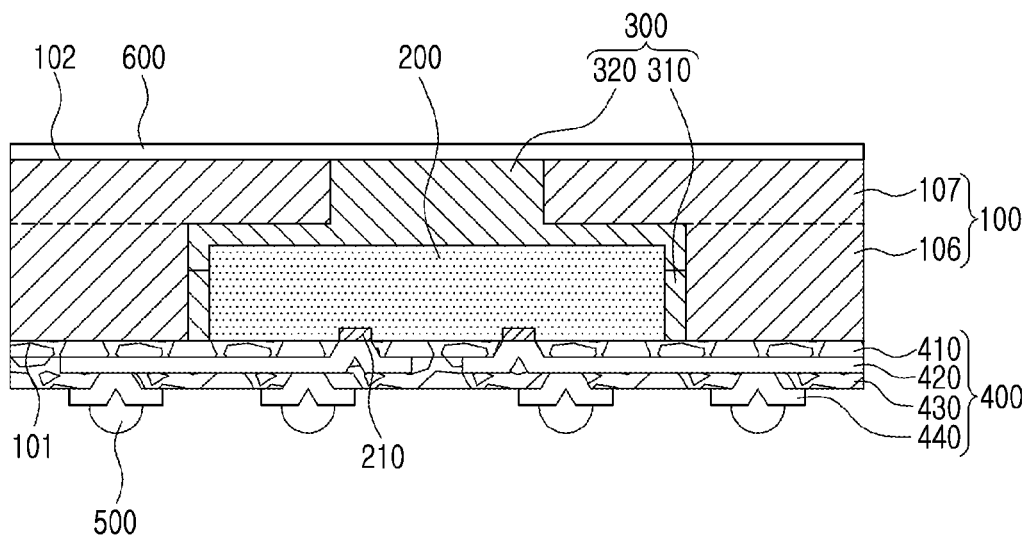

FIGS. 33 and 34 are two other cross-sectional views of semiconductor packages according to a second embodiment of the present disclosure.

Figure 35:
FIGS. 35 to 37 are cross-sectional views for explaining method of manufacturing semiconductor packages of FIGS. 33 and 34 according to a second embodiment of the present disclosure.
Figure 36:
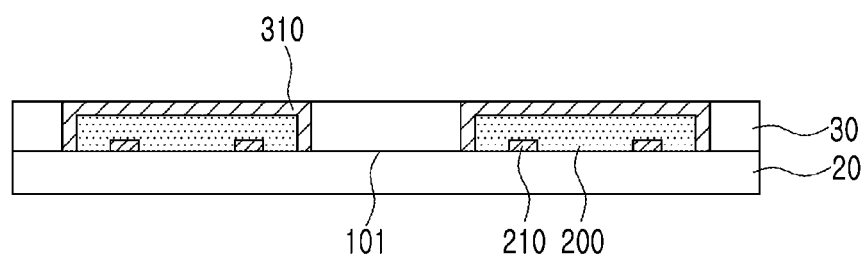
Figure 37:
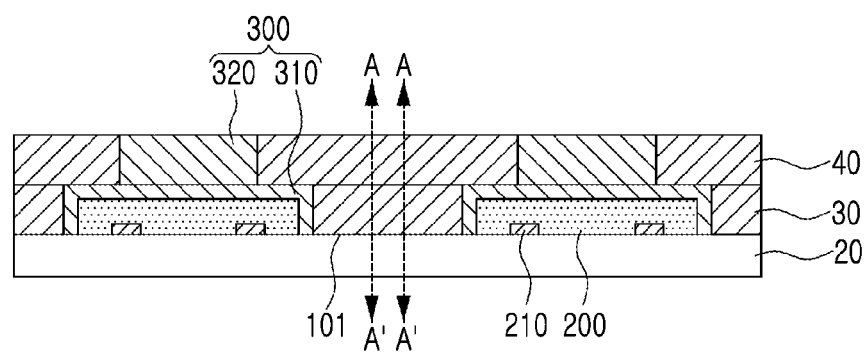

FIGS. 35 to 37 are cross-sectional views for explaining method of manufacturing semiconductor packages of FIGS. 33 and 34 according to a second embodiment of the present disclosure.

Referring to FIG. 33, the semiconductor package of this embodiment is the same as FIG. 22 except for the configuration of the molding layer 300.

That is, the molding layer 300 has a first molding layer 310 and a second molding layer 320.

The first molding layer 310 is made of EMC, which is a normal insulating material. That is, a powder of an inorganic material such as an insulating polymer and silica may be added, and a material such as carbon black may be added.

In addition, the first molding layer 310 is formed to cover the back surface of the semiconductor chip 200. Accordingly, the first molding layer 310 covers the side surface and the back surface of the semiconductor chip 200. A second molding layer 320 is provided on the first molding layer 310.

The second molding layer 320 has higher conductivity than the first molding layer 310. To this end, the conductive powder is mixed into the material of EMC to form the second molding layer 320. This is the same as that described in FIG. 13 of the first embodiment.

The second molding layer 320 having higher conductivity than the first molding layer 310 functions to shield electromagnetic waves generated from the semiconductor chip 200 or applied from the outside. Accordingly, malfunction of the semiconductor chip 200 due to interference by electromagnetic waves can be prevented. It is also preferable that the surface of the second molding layer 320 forms the same plane as the second surface 102 of the insulating frame 100.

Referring to FIG. 34, the first molding layer 310 covers a side surface or part of the side surface of the semiconductor chip 200. The second molding layer 320 formed on the first molding layer 310 covers the back surface of the semiconductor chip 200 and is formed on the remnant side surface of the semiconductor chip 200, which is not covered by the first molding layer 310. However, it is preferable that the second molding layer 320 does not cover the portion where the heavily doped region of the well or the transistor in the active region is formed. That is, the insulating first molding layer 310 needs to cover the side surface of the semiconductor chip 200 to a predetermined region directly involved in the operation of the device.

In addition, the second molding layer 320 has conductive powder as described in FIG. 33. In the structure of FIG. 34, the second molding layer 320 functions not only to block electromagnetic interference, but also to provide a ground to the semiconductor chip 200. Thereby, the semiconductor chip 200 can be operated in a more stable condition.

For example, the semiconductor chip 200 has a separate ground pad on its active surface. The ground pads are electrically connected to the weakly doped or undoped bulk regions. However, the ground voltage supplied through the ground pad may not be sufficiently supplied to the bulk region. This causes noise in the bulk region in the semiconductor chip 200, which may cause a body effect.

In the FIG. 34, the back surface of the semiconductor chip 200 is covered by the second molding layer 320 having higher conductivity than the first molding layer 310, thereby electromagnetic interference and body effect may be prevented.

In addition, the formation of the first molding layer 310 and the second molding layer 320 can be implemented in the process of FIG. 28. That is, the semiconductor chips 200 are disposed on the carrier substrate 20, and the semiconductor chips 200 are arranged in the through holes of the mother frame 10. Next, a first molding layer 310 for filling a part of the through hole is formed, and a second molding layer 320 is formed on the first molding layer 310 successively.

In addition, the semiconductor packages disclosed in FIGS. 33 and 34 may be manufactured by other methods.

Referring to FIG. 35, the first mother frame 30 disclosed in FIG. 25 is prepared. The first mother frame 30 has a first through hole 111.

Referring to FIG. 36, a first mother frame 30 is arranged on a carrier substrate 20. The semiconductor chip 200 is disposed in the first through hole of the first frame 30. The active surface on which the pads 210 of the semiconductor chip 200 are formed faces the carrier substrate 20. Also, the first surface 101 of the first mother frame 30 is arranged to face the carrier substrate 20.

Then, a first molding layer 310 for filling the first through hole is formed. The first molding layer 310 may completely fill the first through hole. In addition, the first molding layer 310 may fill only a part of the first through hole. That is, the first molding layer 310 can partially fill the side surface of the semiconductor chip 200.

Referring to FIG. 37, the second mother frame 40 disclosed in FIG. 25 is bonded to the upper portion of the first mother frame 30. It is preferable that the second mother frame 12 has a second through hole and the width of the second through hole is smaller than the width of the first through hole and the semiconductor chip 200. The width of the second through hole may be set larger than the width of the semiconductor chip 200. However, it is preferable that the width of the second through hole is smaller than the width of the first through hole.

Subsequently, a second molding layer 320 for filling the second through hole of the second mother frame 40 is formed. Thereafter, the carrier substrate is removed, and a redistribution layer 400 and an external connection terminal 500, which are electrically connected to the pads 210 of the semiconductor chip 200, are formed.

In addition, when the first mother frame 30 and the second mother frame 40 are cut along the cutting line A-A', the semiconductor package shown in FIG. 33 can be obtained.

If the first molding layer 310 covers only a part of the side surface of the semiconductor chip 200 in the step of FIG. 36, the second molding layer 320 may cover the remaining side surfaces of the semiconductor chip 200 and the back surface of the semiconductor chip 200. After the second molding layer 320 is formed, the semiconductor package shown in FIG. 34 can be obtained by cutting along the cutting line A-A'.

Figure 38:
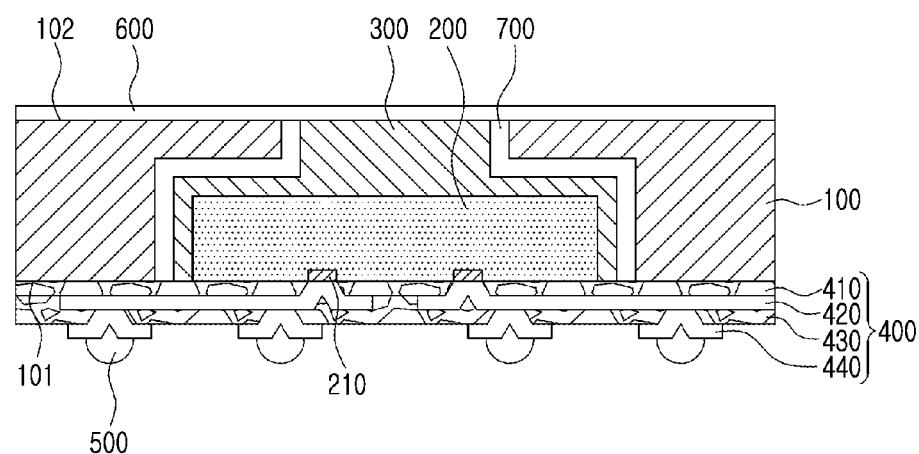
FIGS. 38 to 40 are yet three other cross-sectional views for explaining a semiconductor packages and a manufacturing method thereof according to a second embodiment of the present disclosure.
Figure 39:
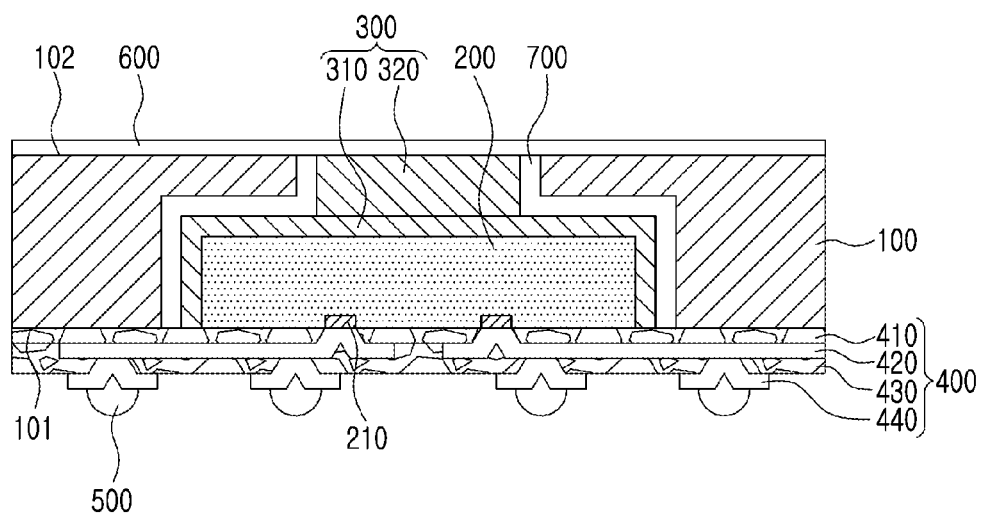
Figure 40:
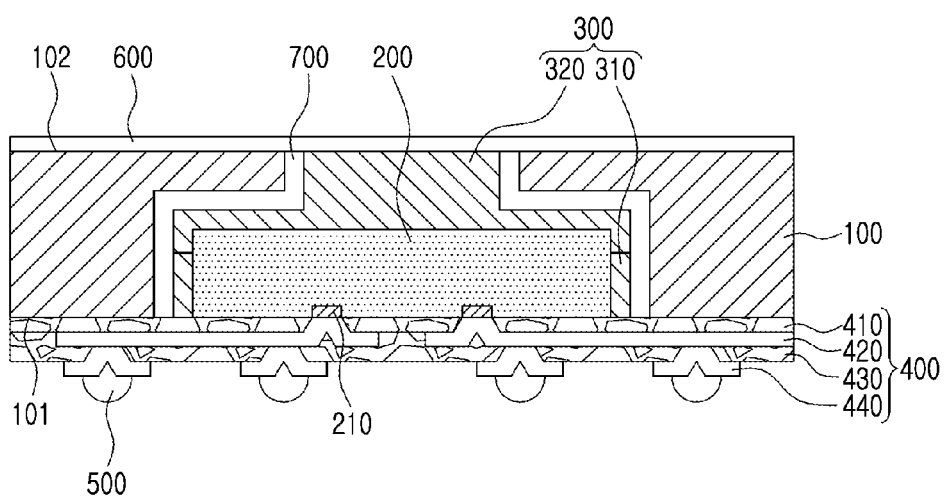

FIGS. 38 to 40 are yet three other cross-sectional views for explaining a semiconductor packages and a manufacturing method thereof according to a second embodiment of the present disclosure.

Referring to FIG. 38, the structure and material of the semiconductor package are the same as those of the semiconductor package shown in FIG. 22 except that a buffer layer 700 is formed between the insulating frame 100 and the molding layer 300.

The buffer layer 700 is provided between the insulating frame 100 and the molding layer 300. The buffer layer 700 preferably has a conductivity of a metal material, and preferably has a thickness of several um. Metals have superior malleability and ductility than ceramics or polymers. This means that mechanical stresses generated in the insulating frame 100 and the molding layer 300 can be absorbed in the buffer layer 700.

Accordingly, during the process of manufacturing the package, expansion and contraction of the insulating frame 100 due to heat generated can be solved by mechanical buffering of the buffer layer 700, and the expansion and contraction of the molding layer 300 can be solved by mechanical buffering of the buffer layer 700.

In addition, the formation of the buffer layer 700 may be performed after the process of FIG. 24 of the present embodiment. That is, after a plurality of through holes are formed in the mother frame 10, a buffer layer 700 made of metal is formed on the inner wall of the mother frame 10 by plating or deposition. The metal layer formed on the first and second surfaces 101 and 102 may be removed through a CMP or etch back process. The buffer layer 700 may be formed on the inner wall of the mother frame 10 defining the first through hole 111 and the second through hole 121.

Referring to FIGS. 39 and 40, the structure and material of the semiconductor packages are the same as those shown in FIGS. 33 and 34 except that a buffer layer 700 is formed between the insulating frame 100 and the molding layer 300. That is, the molding layer 300 has a first molding layer 310 and a second molding layer 320 formed on the first molding layer 310. The second molding layer 320 has a higher conductivity than the first molding layer 310.

The second molding layer 320 may perform an electromagnetic wave shielding operation or provide grounding. The second molding layer 320 is in contact with the conductive buffer layer 700 provided on the side surface. Therefore, the electromagnetic wave shielding is performed to the side surface in addition to the back surface of the semiconductor chip 200.

The buffer layer 700 is formed on the mother frame 10 in which the first through hole 111 and the second through hole 121 are formed in FIG. 24. The formation of the first molding layer 310 and the second molding layer 320 can be accomplished by two molding processes in the molding layer forming step described in FIG. 28.

Figure 41:
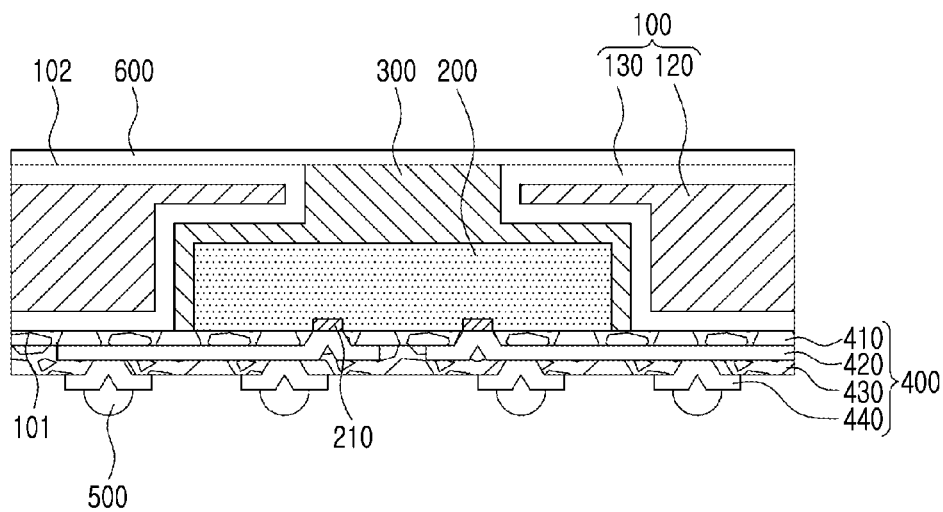
FIGS. 41 to 43 are still three other sectional views for explaining a semiconductor package and a manufacturing method thereof according to a second embodiment of the present disclosure.
Figure 42:
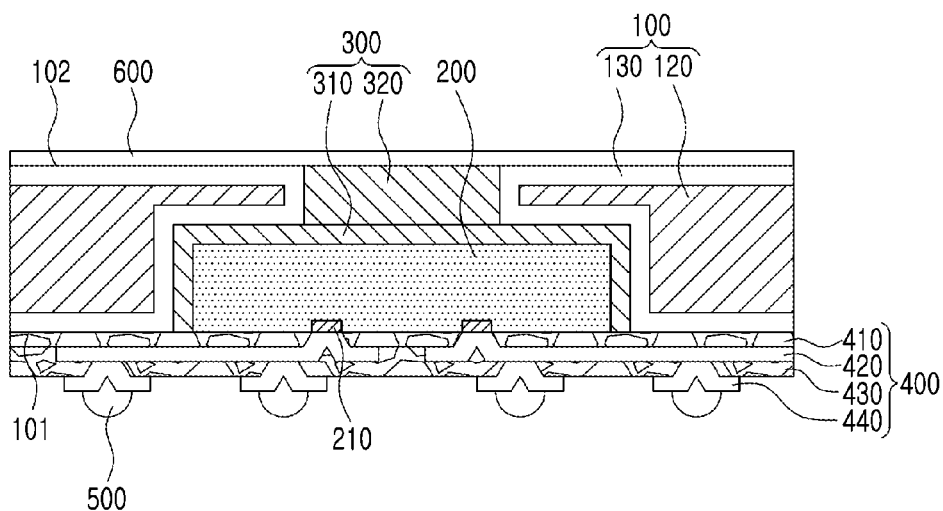
Figure 43:
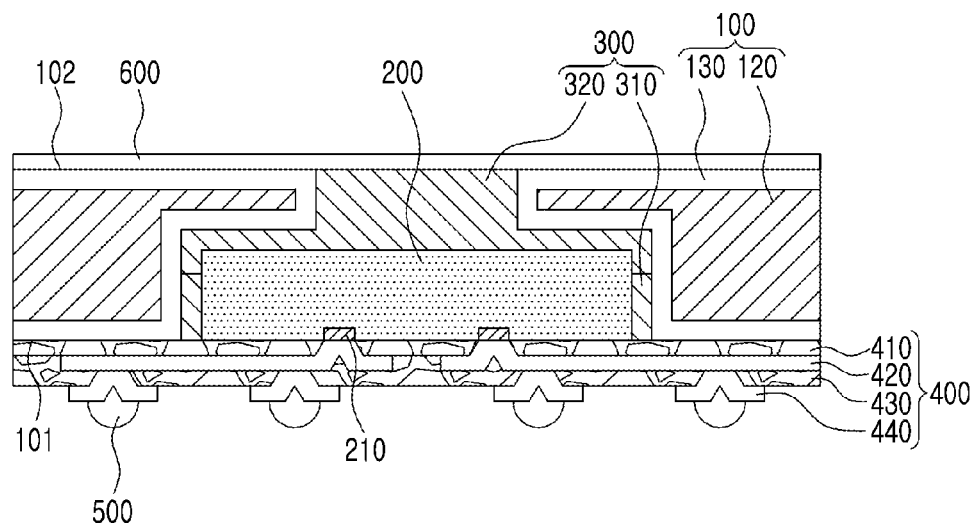

FIGS. 41 to 43 are still three other sectional views for explaining a semiconductor package and a manufacturing method thereof according to a second embodiment of the present disclosure.

Referring to FIG. 41, the structure and material of the semiconductor package are the same as those of the semiconductor package shown in FIG. 22 except that the insulating frame 100 has the first insulating frame 120 and the second insulating frame 130.

The first insulating frame 120 may be made of a normal insulating material and may have a soda lime glass material as described in FIG. 22. Also, it is preferable that the second insulating frame 130 is formed on the first insulating frame 120 and is formed by surface modification of the first insulating frame 120 without performing a separate coating or deposition process. The second insulating frame 130 has a higher mechanical strength than the first insulating frame 120.

When the first insulating frame 120 is formed of soda lime glass, the second insulating frame 130 may be a surface-enhanced soda lime glass. It has a structure in which sodium ions contained in soda lime glass are replaced with potassium ions. Potassium ion has a larger ionic radius than sodium ion, so it can induce compressive stress in the glass through substitution and improve the mechanical strength.

The stress generated by the thermal expansion or the thermal condensation can be more easily dispersed by the second insulating frame 130 having improved surface strength.

It is preferable that the process of forming the second insulating frame 130 is performed immediately after the process of forming the through holes described in FIG. 24.

That is, the surface strengthening process is performed on the circumferential surface of the mother frame 10 shown in FIG. 24. When the mother frame 10 has a soda lime glass material, the circumferential surface of the mother frame 10 by the substitution of potassium ions is modified into second insulating frame 130 having high strength. That is, the second insulating frame 130 of the insulating frame 100 of FIG. 41 is provided in a surface-modified form of the first insulating frame 120.

Referring to FIGS. 42 and 43, a molding layer 300 for filling a through hole is formed of a first molding layer 310 and a second molding layer 320. The arrangement and material of the first molding layer 310 and the second molding layer 320 are the same as those described in FIGS. 33 and 34. Accordingly, the second molding layer 320 has higher conductivity than the first molding layer 310. Thus, electromagnetic interference can be minimized.

Figure 44:
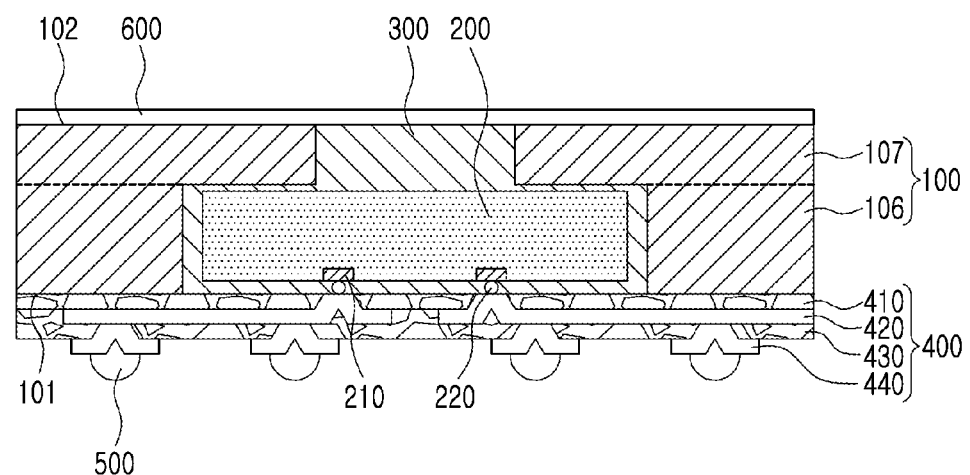
FIG. 44 is still another cross-sectional view for explaining a semiconductor package and a manufacturing method thereof according to a second embodiment of the present disclosure.

FIG. 44 is still another cross-sectional view for explaining a semiconductor package and a manufacturing method thereof according to a second embodiment of the present disclosure.

Referring to FIG. 44, the structure and material of the semiconductor package are identical to those of the semiconductor package shown in FIG. 22 except that the internal connection terminal 220 are provided in the semiconductor package.

That is, the semiconductor chip 200 and the internal connection terminal 220 are provided in the first through hole defined by the first insulation frame 110 of the insulation frame 100. The semiconductor chip 200 and the internal connection terminal 220 may be manufactured by separate processes. That is, individualization of the semiconductor chip 200 is performed for the manufactured wafer, and the internal connection terminal 220 is formed on the pad 210 provided on the semiconductor chip 200. The internal connection terminal 220 may have any configuration as long as it can achieve electrical connection between the pad 210 and the redistribution layer 400. That is, the semiconductor chip 200 having the internal connection terminal 220 is disposed in the first through hole.

The molding layer 300 buries the semiconductor chip 200 having the internal connection terminals 220 and the redistribution layer 400 is formed on the first surface 101 of the insulating frame 100 and the molding layer 300. Also, an external connection terminal 500 is provided on the redistribution layer 400.

The semiconductor package disclosed in FIG. 44 can be manufactured through the process of FIGS. 27 to 30 of the present embodiment.

That is, in FIG. 27, a semiconductor chip 200 having an internal connection terminal 220 is disposed on a carrier substrate, and a mother frame having a first through hole is disposed on the semiconductor chip 200.

In FIG. 28, the semiconductor chip 200 is accommodated in the first through hole 111, and a molding process is performed to bury the semiconductor chip 200 having the internal connection terminal 220 therein.

In FIG. 29, the carrier substrate is removed, and a redistribution layer 400 is formed on the first surface 101 of the insulating frame 100 and the molding layer 300. When forming the redistribution layer 400, the internal connection terminal 220 can be embedded by the molding layer 300. Therefore, an additional etching process for exposing the internal connection terminal 220 can be performed.

In addition, cutting can be performed along the cutting line A-A' in the process of FIG. 30 to obtain the semiconductor package of FIG. 44.

Third Embodiment

Figure 45:
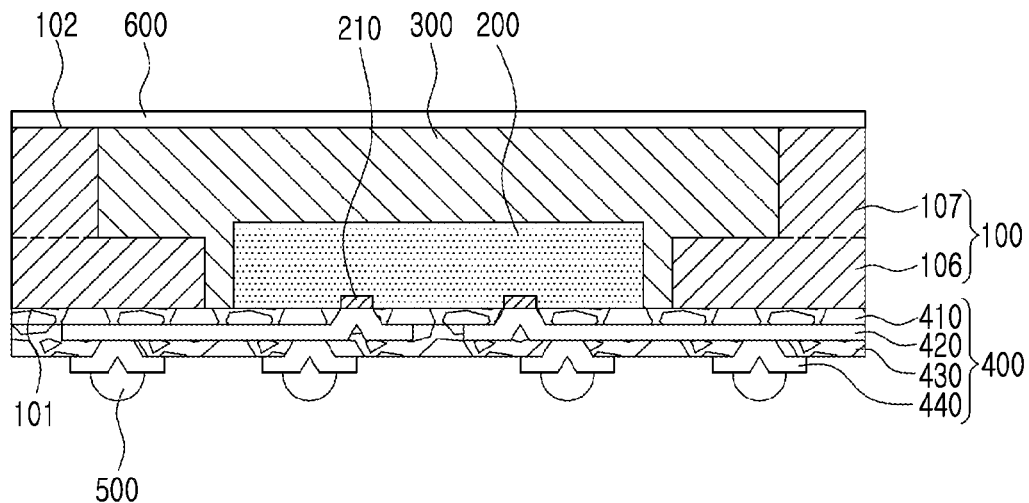
FIG. 45 is a cross-sectional view illustrating a semiconductor package according to a third embodiment of the present disclosure.

FIG. 45 is a cross-sectional view illustrating a semiconductor package according to a third embodiment of the present disclosure.

Referring to FIG. 45, the semiconductor package of this embodiment has an insulating frame 100, a semiconductor chip 200, a molding layer 300, a redistribution layer 400, an external connection terminal 500, and a protective film 600.

The insulating frame 100 is an insulating material, and preferably has a coefficient of thermal expansion similar to that of the carrier substrate or the molding layer described below. Therefore, the insulating frame 100 has the same material as that described in the first embodiment.

For example, soda lime glass has a thermal expansion coefficient of 9 to 9.5 ppm/° C., which is a range similar to the thermal expansion coefficient of EMC and means that the thermal stress between the insulating frame 100 and the molding layer 300 can be minimized. In addition, the insulating frame 100 is required to have a width of the first surface 101 wider than that of the second surface 102.

The width of the inner peripheral surface of the insulating frame 100 formed from the first surface 101 toward the second surface 102 is set differently depending on the position. For example, the insulating frame 100 may be formed of the same material but may be divided into a first hole frame 106 and a second hole frame 107 by a shape. The first hole frame 106 includes a first surface 101 and an inner circumferential surface to form a first through hole. Further, the second hole frame 107 is defined on the first hole frame 107, and the second through hole is formed by the inner circumferential surface. The first through hole has a smaller width than the second through hole.

Further, the semiconductor chip 200 is disposed in the first through hole. The active surface on which the pad 210 is formed preferably has the same plane as the first surface 101. The thickness of the semiconductor chip 200 may be equal to or different from the thickness of the first insulating frame 110. In the FIG. 45, the thickness of the semiconductor chip 200 is larger than the thickness of the first insulating frame 110, but the thickness of the semiconductor chip 200 is equal to the thickness of the first insulating frame 110 or small.

A molding layer 300 fills a space between the semiconductor chip 200 and the insulating frame 100. The molding layer 300 fills the first through hole and the second through hole. It is preferable that the molding layer 300 filling the through holes forms the same plane as the second surface 102 of the insulating frame 100. The molding layer 300 is made of EMC (Epoxy Molding Compound) and is composed of an insulating polymer and a silica powder as an inorganic material. The molding layer 300 may further include a conductive powder.

The width of the molding layer 300 filling space between the second surfaces 102 of the insulating frame 100 is larger than that of the molding layer 300 filling between the first surface 101 and semiconductor chip 200. That is, a molding layer 300 filling space between second surfaces 102 from the back surface (inactive surface) of the semiconductor chip 200 have a width larger than the width of the molding layer 300 for filling the side surface of the semiconductor chip 200.

The redistribution layer 400 is formed on the active surface of the semiconductor chip 200 or on the first surface 101 of the insulating frame 100. The redistribution layer 400 formed has a first insulation layer 410, a first wiring layer 420, a second insulation layer 430, and a second wiring layer 440. However, the configuration of the redistribution layer 400 is only an example configured to realize the fan-out structure, and the configuration of the redistribution layer 400 described above can be variously modified by those skilled in the art.

However, the redistribution layer 400 may be formed in any shape as far as the external connection terminal 500 can be formed in an area outside the area occupied by the semiconductor chip 200. In FIG. 45, the first wiring layer 420 extends beyond the region occupied by the semiconductor chip 200 and extends to a lower region of the insulating frame 100. In addition, the first wiring layer 420 may extend to a region of the molding layer 300.

In addition, the redistribution layer 400 is electrically connected to the external connection terminal 500. The external connection terminal 500 has a solder ball or bump structure. More specifically, the external connection terminal 500 is formed on the second wiring layer 440 and is electrically connected to the pads 210 of the semiconductor chip 200. In addition, the second wiring layer 440 may be omitted according to the embodiment. That is, the external connection terminal 500 may be formed directly on the first wiring layer 420.

According to the embodiment, the protective film 600 may be provided on the second surface 102 of the insulating frame 100 and the molding layer 300 having the same plane. The protective film 600 is provided to protect the molding layer 300 from the external environment and may be provided to prevent mechanical damage and to prevent moisture from penetrating. The protective film 600 may be an insulating film and may have an epoxy or acrylic material.

In FIG. 45, the semiconductor chip 200 is mounted into the first through hole defined by the first hole frame 106. In addition, the second hole frame 107 defines a second through hole having a larger width than the first through hole. In addition, the first hole frame 106 disposed near the side surface of the semiconductor chip 200 has a greater width than the second hole frame 107. Heat generated during use of the semiconductor chip 200 induces thermal expansion in the molding layer 300. In particular, thermal deformation of the molding layer 300 formed on the side surface of the semiconductor chip 200 causes structural deformation of the semiconductor package. Accordingly, the first hole frame 106, which is disposed on the side surface and has a relatively large width as compared with the second hole frame 107, blocks stress due to thermal expansion of the semiconductor package.

Further, the insulating frame 100 made of an insulating material has a characteristic of insufficient heat transfer to the outside. It can be solved through the second through hole having a relatively wide width. That is, the molding layer 300 filling the second through hole can easily emit the heat generated from the semiconductor chip 200 to the outside of the semiconductor package.

FIGS. 46 to 51 are sectional views and plan views for explaining a method of manufacturing the semiconductor package of FIG. 45 according to the third embodiment of the present disclosure.

Figure 46:
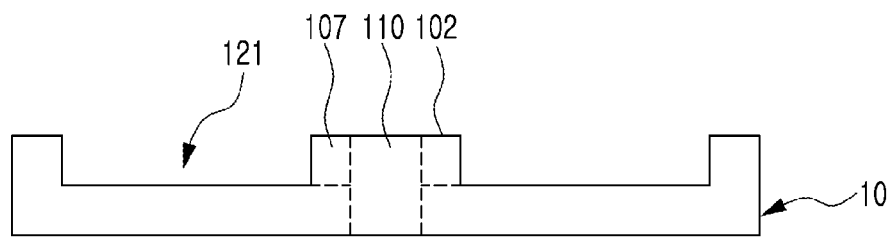
FIGS. 46 to 51 are sectional views and plan views for explaining a method of manufacturing the semiconductor package of FIG. 45 according to the third embodiment of the present disclosure.
Figure 47:
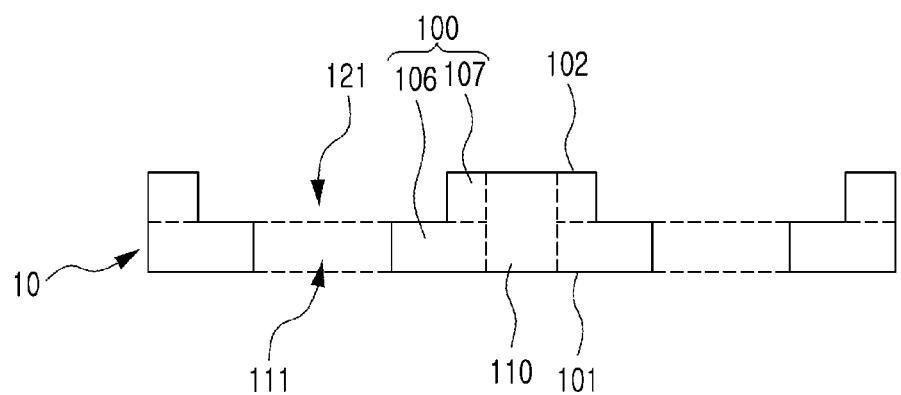

Referring to FIGS. 46 and 47, the mother frame 10 is prepared. The second surface 102 of the mother frame 10 is etched to form a second through hole 121 defined by the second hole frame 106. Further, a part exposed by the second through hole 121 is further etched to form a first through hole 111 having a width narrower than that of the second through hole 121.

The formation of the first through hole 111 and the formation of the second through hole 121 may be performed in any order. That is, the first surface 101 of the mother frame 10 is etched to form the first through hole 111, and then the second surface 102 opposed to the first surface 101 is etched, The second through hole 121 having a width wider than the hole 111 can be formed.

In addition, two mother frames may be joined together to form the frame shown in FIG. 47. For example, the first mother frame having the first through hole formed therein and the second mother frame formed with the second through hole may be joined to form the mother frame shown in FIG. 47.

Figure 48:
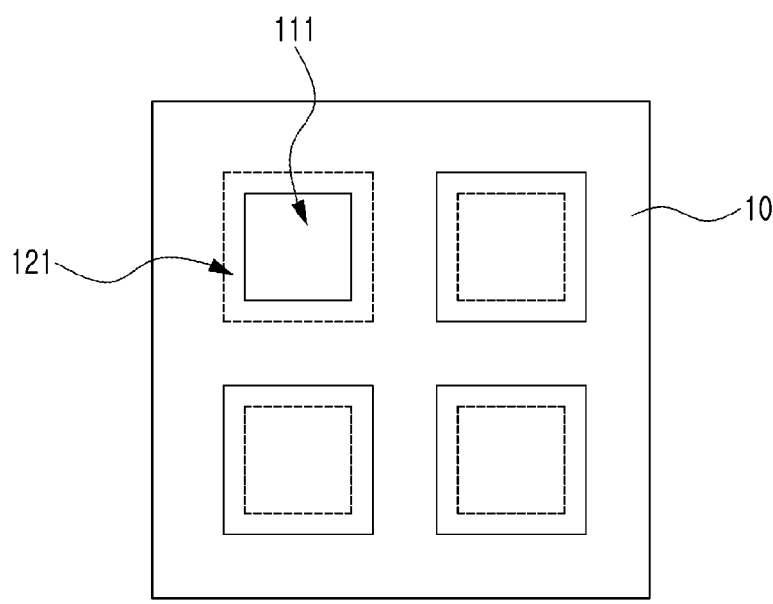

FIG. 48 is a bottom plan view showing the mother frame shown in FIG. 47.

Referring to FIG. 48, an inner area of the mother frame 10 defined by a solid line is defined as a first through hole 111, and an inner area of the mother frame 100 defined by a dotted line is defined as a second through hole 121. A semiconductor chip is mounted on the first through hole 111, and a molding layer is filled.

Figure 49:
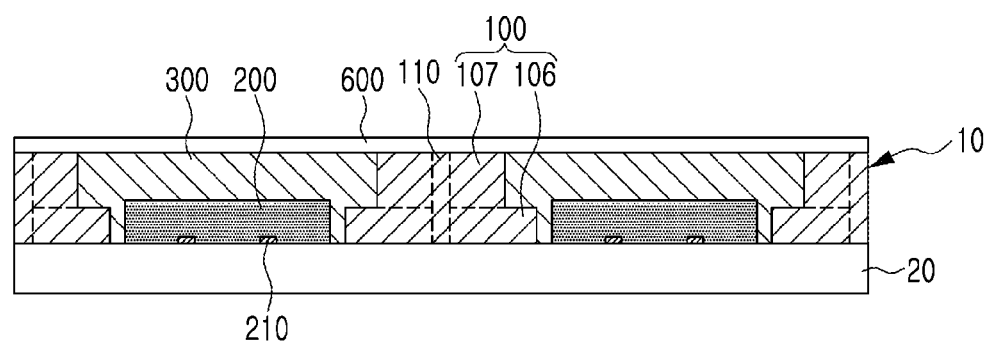

Referring to FIG. 49, on the carrier substrate 20, the mother frame 10 shown in FIG. 47 is disposed. The semiconductor chip 200 is disposed in the through hole of the mother frame 10. An adhesive layer may be interposed between the semiconductor chip 200 and the carrier substrate 20 in order to prevent the semiconductor chip 200 from moving on the carrier substrate 20. The adhesive layer may be provided in the form of a film which is easily detachable.

The semiconductor chip 200 disposed on the carrier substrate 20 has an active surface on which the pads 210 and the like are disposed facing the carrier substrate 20 and a back surface opposite to the active surface is opened toward the top.

The height at which the back surface of the semiconductor chip 200 is located may be greater than the height of the first through hole in the mother frame 10. In addition, the height at which the back surface of the semiconductor chip 200 is located may be equal to or lower than the height of the first through hole in the mother frame 10. This means that the semiconductor chip 200 disposed in the through hole of the mother frame 10 can be completely contained in the first through hole and can be disposed up to a part of the second through hole out of the first through hole.

Then, a molding process for the semiconductor chip 200 disposed in the through hole of the mother frame 10 is performed. A molding layer 300 for filling the through hole is formed by a molding process. The EMC (Epoxy Molding Compound) constituting the molding layer 300 may have a usual material. That is, it may have a material including an insulating polymer, silica powder or carbon black.

The protective film 600 may be attached to the second surface 102 of the mother frame 10 and the molding layer 300 after the molding layer 300 is formed. The protective film 600 serves to absorb moisture and absorb external mechanical impact.

Through the process described in FIG. 49, the semiconductor chip 200 whose active surface faces the carrier substrate 20 is disposed at the first through hole on the carrier substrate 20 or may be disposed at part of the second through hole. In addition, the semiconductor chip 200 is shielded by the molding layer 300 filling the through hole.

Figure 50:
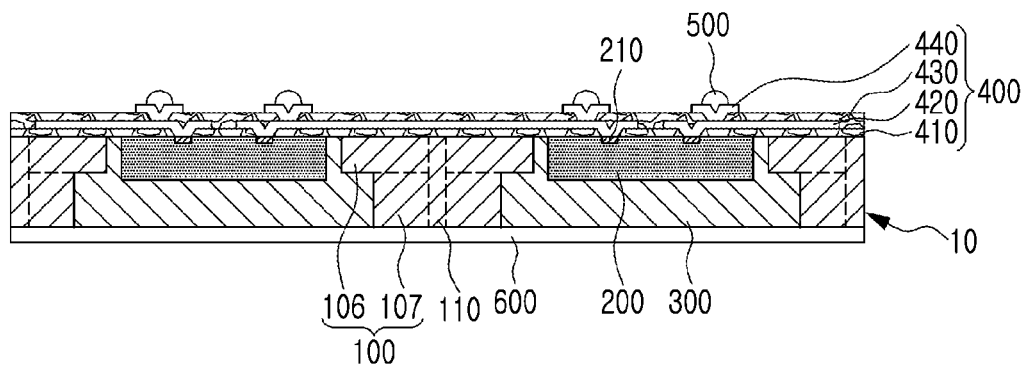

Referring to FIG. 50, carrier substrate 20 is removed from the semiconductor 200 and mother frame 10, and a redistribution layer 400 is formed on the pad 210 of the semiconductor chip 200 and the first surface 101 of the mother frame 10.

The formation of the redistribution layer 400 is the same as described in the first embodiment.

An external connection terminal 500 is formed on the second wiring layer 440 of the redistribution layer 400. The external connection terminal 500 is preferably a solder ball or a bump.

Through the above process, the semiconductor chip 200 is mounted in the first through hole 111 of the mother frame 10, and the molding layer 300 filling the through holes is formed. A redistribution layer 400 is formed on the active surface of the semiconductor chip 200 and on the first surface 101 of the mother frame 10.

Figure 51:
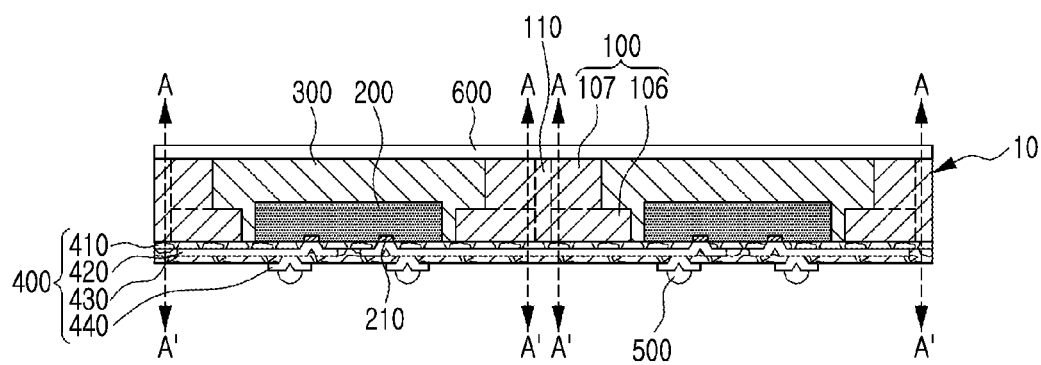

Referring to FIG. 51, the mother frame 10 may be cut along the cutting line A-A' to obtain an individual semiconductor package.

That is, the semiconductor package shown in FIG. 45 can be obtained by cutting the mother frame 10 having the through holes for accommodating the semiconductor chip 200 and the molding layer 300 shielding the semiconductor chip 200.

Figure 52:
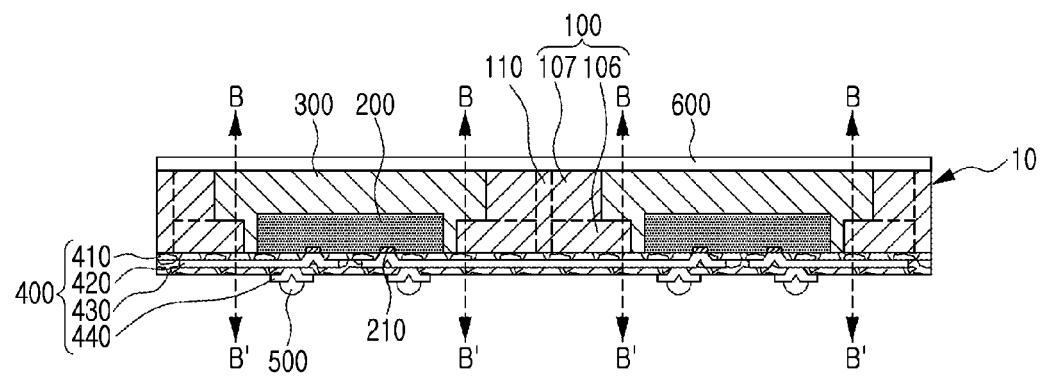
FIGS. 52 and 53 are cross-sectional views illustrating various cutting examples of the mother frame of FIG. 50 according to the third embodiment of the present disclosure.
Figure 53:
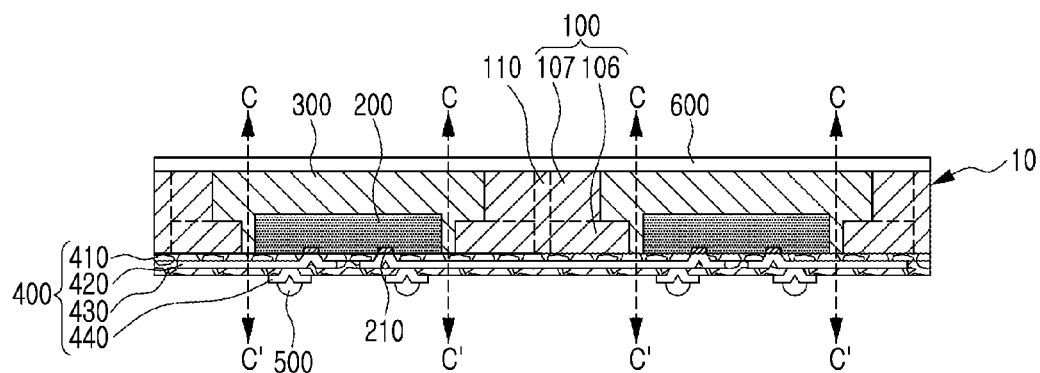

FIGS. 52 and 53 are cross-sectional views illustrating various cutting examples of the mother frame of FIG. 50 according to the third embodiment of the present disclosure.

That is, the semiconductor package manufactured according to the cutting of the mother frame 10 has a shape other than the semiconductor package shown in FIG. 45 described above.

Referring to FIG. 52, the cutting is performed according to the cutting line B-B' and is performed to a part of the molding layer 300 which fills the second through hole, and the first hole frame 106 is cut such that the part of the first hole frame 106 is remained in the semiconductor package. Therefore, the part of the first hole frame 106 remains on both sides of the lower portion of the semiconductor package.

That is, the lower region of the molding layer 300 is covered with a part of the first hole frame 106, and the upper region of the molding layer 300 is exposed to the outside. The first hole frame 106 surrounding the lower region of the molding layer 300 blocks thermal deformation caused by the use of the semiconductor chip 200. Further, the side surface of the semiconductor chip 300 is protected from the external environment.

Referring to FIG. 53, the cutting of the mother frame 10 disposed between the adjacent semiconductor chips 200 is performed for molding layer 300 filling the space between the first hole frame 106 and the semiconductor chip 200 along the cutting line C-C The side surface of the molding layer 300 formed on the side surface of the semiconductor chip 200 is exposed by the cutting. In addition, the upper surface of the molding layer 300 covering the back surface of the semiconductor chip 200 may be also exposed by cutting.

In the semiconductor package manufactured by the cutting in FIG. 53, an insulating frame is only used in the manufacturing process, but is not included in the semiconductor package. The deformation of the semiconductor package due to the thermal stress generated during molding is minimized by the mother frame 10.

In addition, the semiconductor package manufactured by the processes of FIGS. 52 and 53 may be a fan-in type in which the external connection terminal is limited to the semiconductor chip region.

Figure 54:
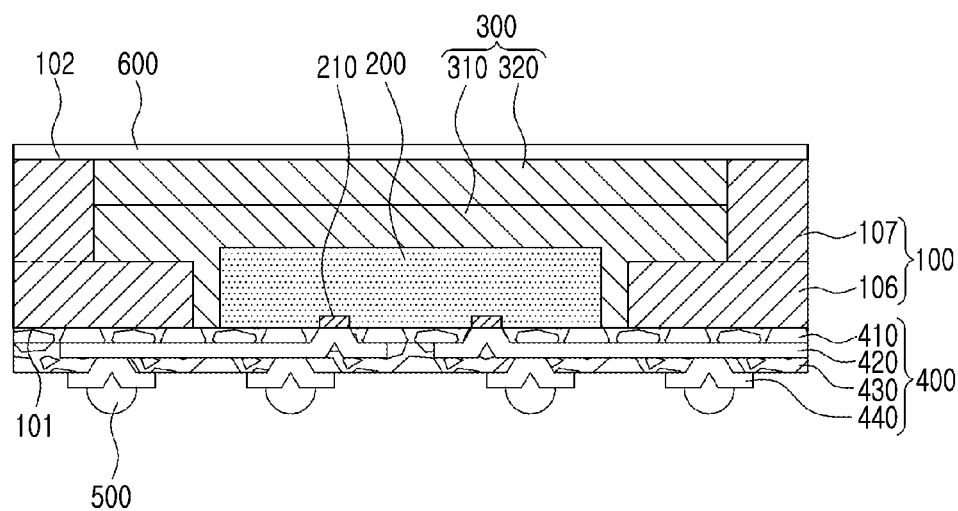
FIGS. 54 to 55 are two other cross-sectional views of semiconductor packages according to a third embodiment of the present disclosure.
Figure 55:
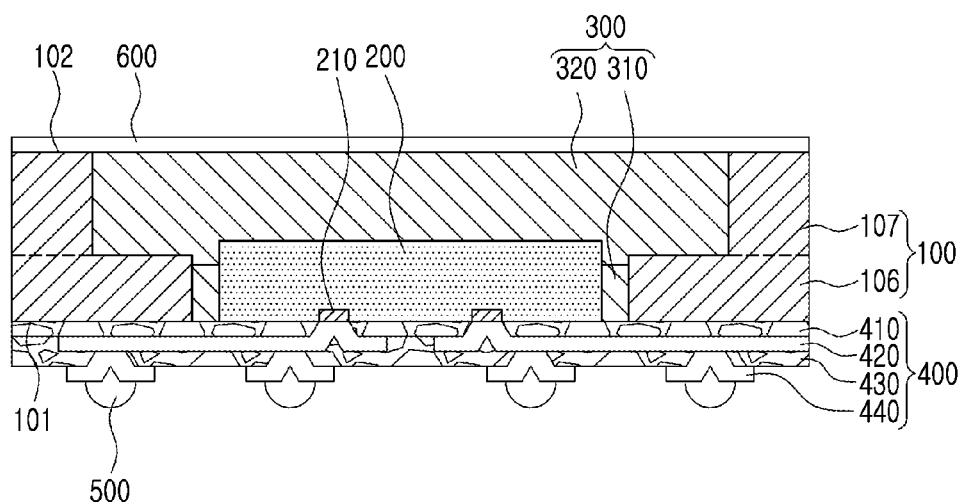

FIGS. 54 to 55 are two other cross-sectional views of semiconductor packages according to a third embodiment of the present disclosure.

Figure 56:
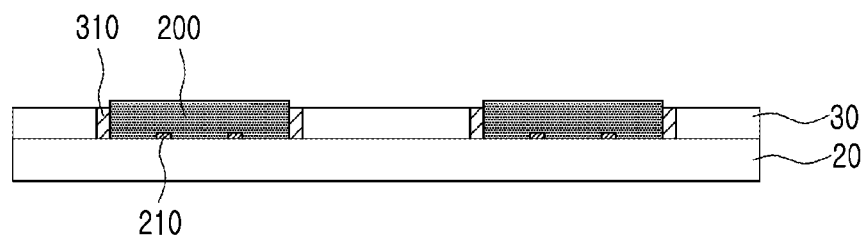
FIGS. 56 to 57 are cross-sectional views for explaining method of manufacturing a semiconductor package of FIG. 55 according to a third embodiment of the present disclosure.
Figure 57:
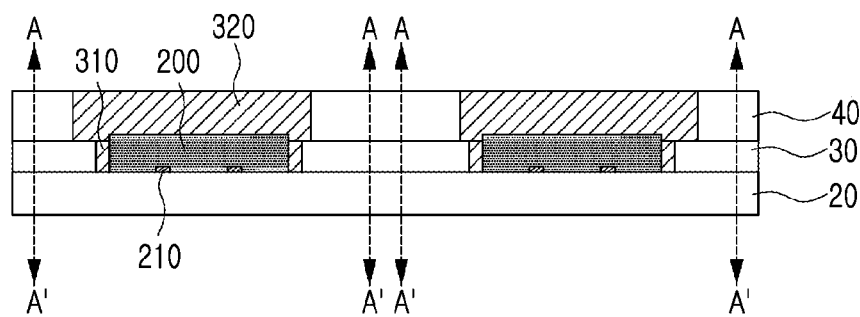

FIGS. 56 to 57 are cross-sectional views for explaining method of manufacturing a semiconductor package of FIG. 55 according to a third embodiment of the present disclosure.

Referring to FIG. 54, the semiconductor package is the same as FIG. 45 except for the structure of the molding layer 300.

That is, the molding layer 300 has a first molding layer 310 and a second molding layer 320.

The first molding layer 310 is made of EMC, which is a normal insulating material. That is, a powder of an inorganic material such as an insulating polymer and silica may be added, and a material such as carbon black may be added.

In addition, the first molding layer 310 is formed to cover the back surface of the semiconductor chip 200. Accordingly, the first molding layer 310 covers the side surface and the back surface of the semiconductor chip 200. A second molding layer 320 is provided on the first molding layer 310.

The second molding layer 320 has higher conductivity than the first molding layer 310. To this end, the conductive powder is mixed into insulating material. The material and function of the second molding layer 320 are the same as those described in FIG. 13 of the first embodiment and FIG. 33 of the second embodiment.

Referring to FIG. 55, the first molding layer 310 covers a side surface or a part of side surface of the semiconductor chip 200. The second molding layer 320 formed on the first molding layer 310 covers back surface of the semiconductor chip 200 and is formed on remaining side surface of the semiconductor chip 200. However, it is preferable that the second molding layer 320 does not cover the portion where the doped region of the well or the transistor of the active region is formed. Thus, the effect described in FIG. 34 of the second embodiment can be obtained.

In FIG. 55, the back surface of the semiconductor chip 200 is covered by the second molding layer 320 having higher conductivity than the first molding layer 310, thereby preventing electromagnetic interference and body effect.

In addition, the semiconductor package shown in FIG. 55 can be manufactured by another method.

Referring to FIG. 56, a first mother frame 30 having a first through hole is disposed on a carrier substrate 20. Further, the semiconductor chip 200 is disposed on the carrier substrate 20 through the first through hole. The active surface on which the pad of the semiconductor chip to be formed is disposed faces the carrier substrate 20.

Then, a first molding layer 310 filling the first through hole is formed. In FIG. 56, the thickness of the semiconductor chip is shown as being above the first mother frame 30, but the thickness of the semiconductor chip 200 may be lower than that of the first mother frame 30. In this case, the first molding layer 310 may shield the side surface and the back surface of the semiconductor chip and may shield a part of side surface of the semiconductor chip.

Referring to FIG. 57, a second mother frame 40 is disposed on the first mother frame 30. The second mother frame 40 has a second through hole having a width larger than that of the first through hole.

Subsequently, a second molding layer 320 filling the second through hole is formed. Thereafter, the carrier substrate 20 is removed, and a redistribution layer 400 and an external connection terminal 500, which are electrically connected to the pads 210 of the semiconductor chip 200, are formed.

In addition, when the first mother frame 30 and the second mother frame 40 are cut along the cutting line A-A', the semiconductor package shown in FIG. 55 can be obtained.

Figure 58:
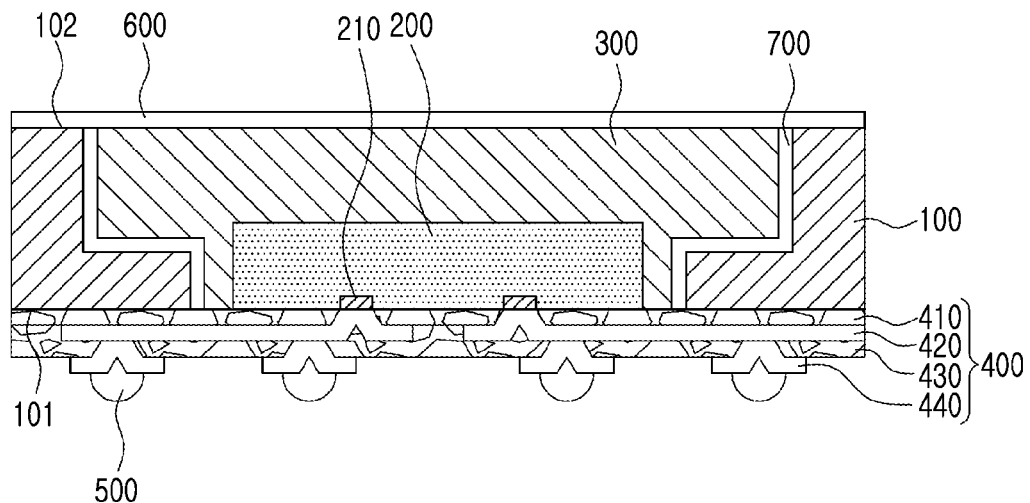
FIGS. 58 to 60 are yet three other sectional views for explaining a semiconductor package and a manufacturing method thereof according to a third embodiment of the present disclosure.
Figure 59:
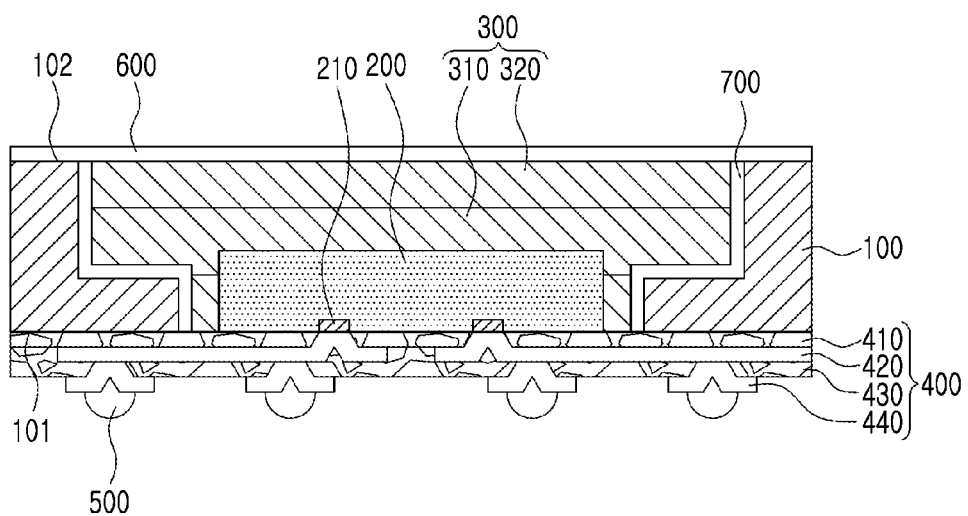
Figure 60:
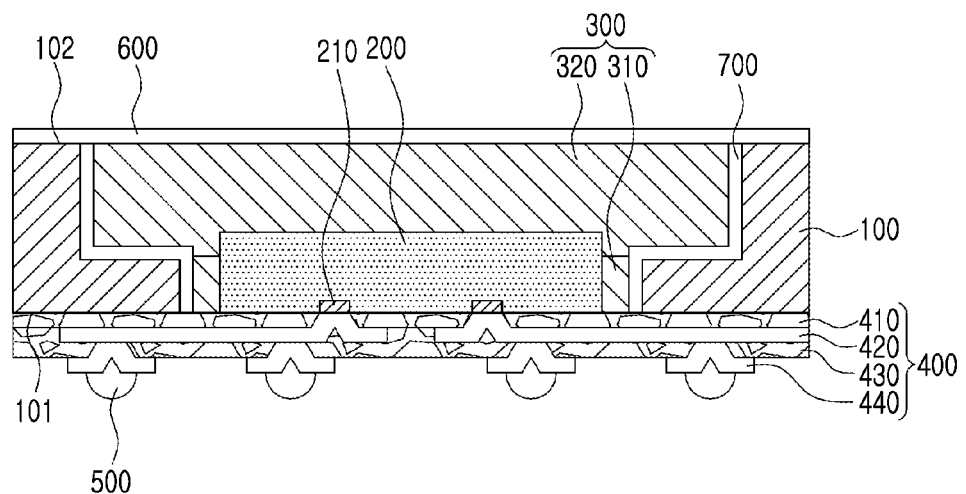

FIGS. 58 to 60 are yet three other sectional views for explaining a semiconductor package and a manufacturing method thereof according to a third embodiment of the present disclosure.

Referring to FIG. 58, the structure and material of the semiconductor package are the same as those of the semiconductor package shown in FIG. 45 except that a buffer layer 700 is formed between the insulating frame 100 and the molding layer 300.

The buffer layer 700 is provided between the insulating frame 100 and the molding layer 300. The buffer layer 300 preferably has a conductivity of a metal material, and preferably has a thickness of several urn. The material and operation of the buffer layer 700 are the same as those described in FIG. 18 of the first embodiment.

In addition, the formation of the buffer layer 700 may be performed after the process of FIG. 47 of the present embodiment. That is, after a plurality of through holes are formed in the mother frame 10, a buffer layer 700 made of metal is formed on the inner wall of the mother frame 10 by plating or deposition. The metal layer formed on the first and second surfaces 101 and 102 may be removed through a CMP or etch back process. The buffer layer 700 may be formed on the inner wall of the mother frame 10 defining the first through hole 111 and the second through hole 121.

Referring to FIGS. 59 and 60, the structure and material of the semiconductor package are the same as those shown in FIGS. 54 and 55, except that a buffer layer 700 is formed between the insulating frame 100 and the molding layer 300. That is, the molding layer 300 has a first molding layer 310 and a second molding layer 320 formed on the first molding layer 310. The second molding layer 320 has a higher conductivity than the first molding layer 310.

The second molding layer 320 may perform an electromagnetic wave shielding operation or provide grounding. The second molding layer 320 is in contact with the conductive buffer layer 700 provided on the side surface. Therefore, the electromagnetic wave shielding can be performed at the side surface in addition to the back surface of the semiconductor chip 200.

The formation of the buffer layer 700 is performed on the mother frame 10 in which the first through hole 111 and the second through hole 121 are formed in FIG. 47. In addition, the formation of the first molding layer 310 and the second molding layer 320 can be accomplished by the two molding processes in the molding layer forming step described with reference to FIG. 49.

Figure 61:
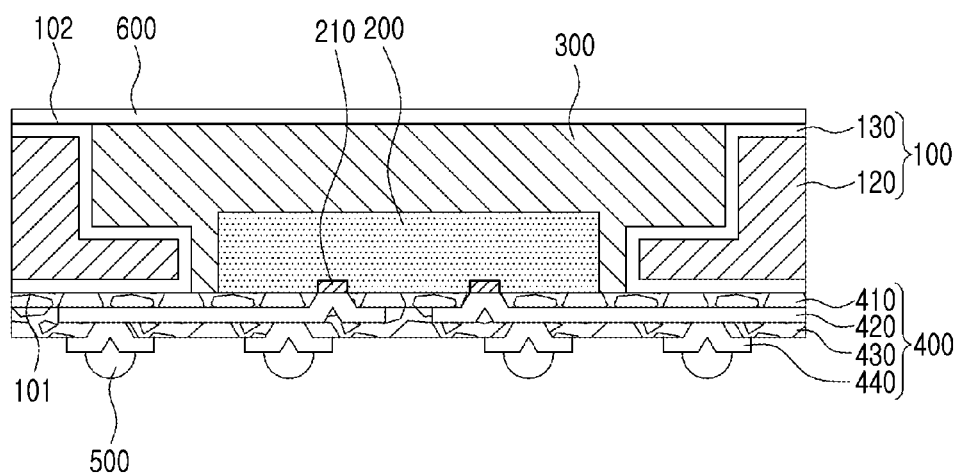
FIGS. 61 to 63 are still three other cross-sectional views for explaining a semiconductor package and a manufacturing method thereof according to a third embodiment of the present disclosure.
Figure 62:
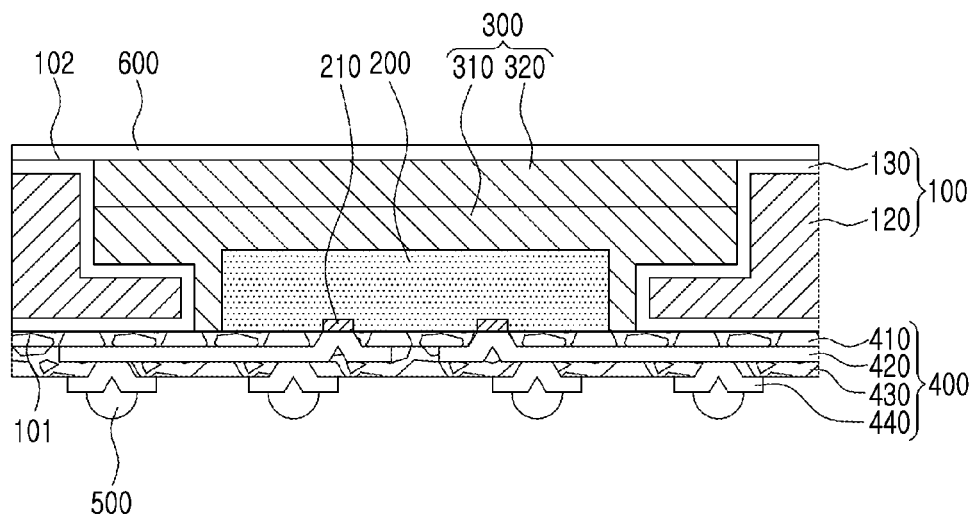
Figure 63:
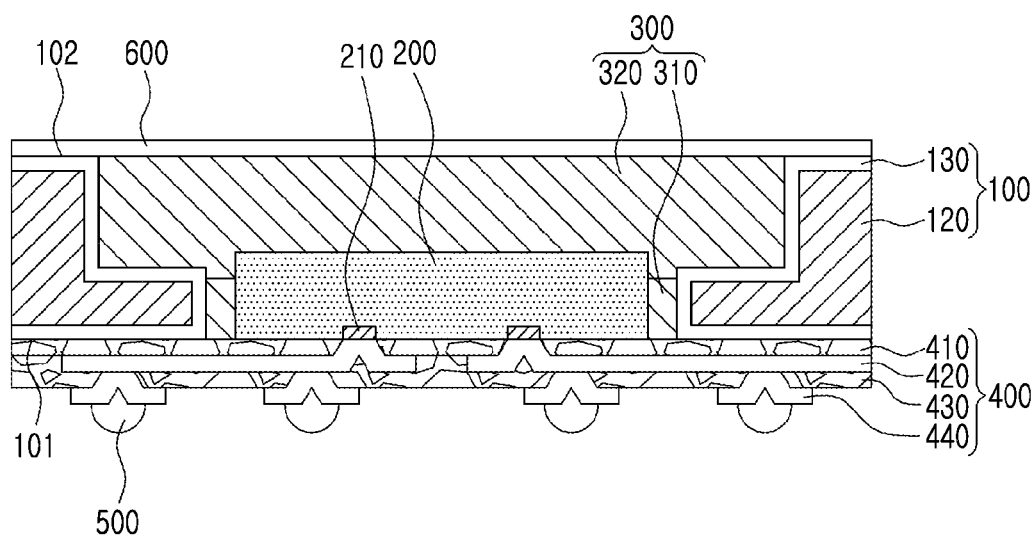

FIGS. 61 to 63 are still three other cross-sectional views for explaining a semiconductor package and a manufacturing method thereof according to a third embodiment of the present disclosure.

Referring to FIG. 61, the structure and material of the semiconductor package are the same as those of the semiconductor package shown in FIG. 45 except that the insulating frame 100 has the first insulating frame 120 and the second insulating frame 130.

The first insulating frame 120 may be made of a normal insulating material and may have a soda lime glass material as described in FIG. 45. Also, it is preferable that the second insulating frame 130 is formed on the first insulating frame 130 and is formed by surface modification of the insulating frame 100 without performing a coating or deposition process. The second insulating frame 130 has a higher mechanical strength than the first insulating frame 120.

The material and manufacturing method of the second insulating frame 130 are the same as those described in the first embodiment.

It is preferable that the process of forming the second insulating frame 130 is performed immediately after the process of forming the through holes described in FIG. 47 in this embodiment.

That is, the surface strengthening process is performed on the circumferential surface of the mother frame 10. When the mother frame 10 has a soda lime glass material, the circumferential surface of the mother frame 10 by the substitution of potassium ions is modified into the second insulating frame 130 having high strength. That is, the second insulating frame 130 of FIG. 61 is provided in a surface-modified form of the first insulating frame 120.

Referring to FIGS. 62 and 63, a molding layer 300 for filling a through hole is composed of a first molding layer 310 and a second molding layer 320. The arrangement and material of the first molding layer 310 and the second molding layer 320 are the same as those described in FIGS. 54 and 55 of this embodiment. Accordingly, the second molding layer 320 has higher conductivity than the first molding layer 310. Thus, electromagnetic interference can be minimized.

Figure 64:
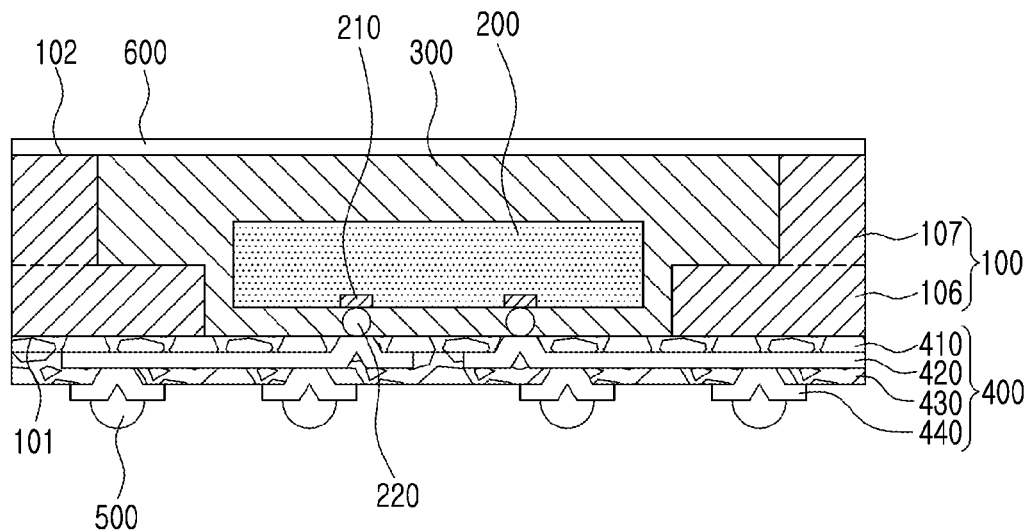
FIG. 64 is a still another cross-sectional view illustrating a semiconductor package and a manufacturing method thereof according to a third embodiment of the present disclosure.

FIG. 64 is a still another cross-sectional view illustrating a semiconductor package and a manufacturing method thereof according to a third embodiment of the present disclosure.

Referring to FIG. 64, the structure and material of the semiconductor package 200 are identical to those of the semiconductor package shown in FIG. 45 except that the semiconductor chip 200 and the internal connection terminal 220 are provided in the semiconductor package.

That is, the semiconductor chip 200 and the internal connection terminal 220 are provided in the first through hole defined by the first hole frame 106 of the insulation frame 100. The semiconductor chip 200 and the internal connection terminal 220 may be manufactured through separate processes. That is, individualization of the semiconductor chip 200 is performed for the manufactured wafer, and the internal connection terminal 220 is formed on the pad 210 provided on the semiconductor chip 200. The internal connection terminal 220 may be of any type as long as it can achieve electrical connection between the pad 210 and the redistribution layer 400. That is, the semiconductor chip 200 having the internal connection terminal 220 is disposed in the first through hole.

The molding layer 300 covers the semiconductor chip 200 having the internal connection terminals 220 and the redistribution layer 400 is formed on the first surface 101 of the insulating frame 100 and the molding layer 300. In addition, an external connection terminal 500 is provided on the redistribution layer 400.

The semiconductor package disclosed in FIG. 64 can be manufactured by the process of FIGS. 49 to 51 of the present embodiment.

That is, in FIG. 49, the insulating frame 100 is disposed on the carrier substrate 20, and the semiconductor chip 200 having the internal connection terminal 220 is disposed at the first through hole of the insulating frame 100.

Then, a molding process is performed to fill the semiconductor chip 200 having the internal connection terminal 220 therein.

In FIG. 50, the carrier substrate is removed, and a redistribution layer 400 is formed on the first surface 101 of the insulating frame 100 and the molding layer 300. When forming the redistribution layer 400, the internal connection terminal 220 can be buried by the molding layer 300. Therefore, a selective etching process for exposing the internal connection terminal 220 can be performed.

In addition, cutting is performed along the cutting line A-A' in the process of FIG. 51 to obtain the semiconductor package of FIG. 64.

Fourth Embodiment

Figure 65:
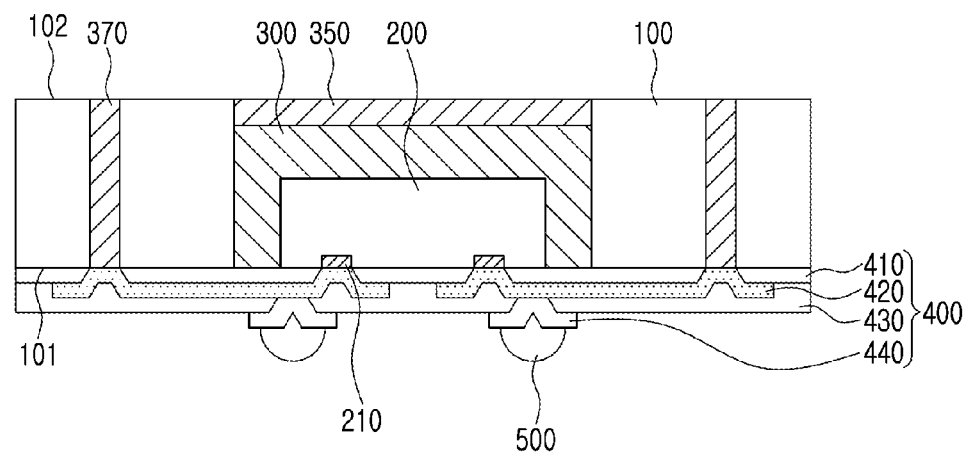
FIG. 65 is a cross-sectional view showing a semiconductor package according to a fourth embodiment of the present disclosure.

FIG. 65 is a cross-sectional view showing a semiconductor package according to a fourth embodiment of the present disclosure.

Referring to FIG. 65, the semiconductor package of the present embodiment includes an insulating frame 100, a semiconductor chip 200, a molding layer 300, a conductive layer 350, a via contact 370, a redistribution layer 400 and external connection terminal 500.

The insulating frame 100 is preferably an insulating material or a semiconductor material. In addition, the insulating frame 100 preferably has a coefficient of thermal expansion similar to that of the carrier substrate or the molding layer 300 described below.

Accordingly, the insulating frame 100 can be variously selected depending on the material of the carrier substrate or the molding layer 300, which is described in the first embodiment.

In addition, the insulating frame 100 has a through hole and a via hole formed around the through hole. If the insulating frame 100 has a semiconductor material, an insulating layer may be formed on the inner circumferential surface of the through hole. The insulating layer may be provided to cut off the electrical connection between the semiconductor chip 200 and insulating frame 100 having the semiconductor material. In addition, when the insulating frame 100 has a semiconductor material, other insulating layer may be formed on the inner circumferential surface of the via hole.

The semiconductor chip 200 is disposed in the through hole of the insulating frame 100. The pads 210 of the semiconductor chip 200 are arranged to face the redistribution layer 500. In addition, the active surface of the semiconductor chip 200 on which the pads 210 are formed preferably has the same plane as the first surface 101 of the insulating frame 100.

A molding layer 300 is formed on the side and back surface (inactive surface) of the semiconductor chip 200 disposed in the through hole. The molding layer 300 has a common epoxy molding compound (EMC) material and may be supplied in liquid or powder form. When supplied in the form of liquid, it is formed into the molding layer 300 through volatilization of the solvent.

A conductive layer 350 is formed on the molding layer 300. The conductive layer 350 is preferably formed in the through hole. The conductive layer 350 includes Ag, Cu, or Al, and the metal powder may be provided in a state where the metal powders are closely connected to each other. To this end, the metal powder is dispersed in a solvent and provided on the molding layer 300 in the form of a conductive paste, and then the conductive layer 350 can be formed through evaporation of the solvent.

Accordingly, the conductive layer 350 has a higher conductivity than the molding layer 300 in which the conductive powder may be mixed.

Via contacts 370 fill in the via holes formed in the periphery of the through holes of the insulating frame 100. The via contacts 370 may have the same material as the conductive layer 350. That is, it is preferable that conductive metal powders are provided in a physically mutually connected state. Via contacts 370 are formed through the first and second surfaces 101 and 102 of the insulating frame 100 and provide electrical connection between the first and second surfaces 101 and 102. In addition, the via contacts 370 may be formed of a conductive oxide powder. That is, a conductive oxide such as ITO or IZO may be filled in the via hole and forms the via contacts 370.

A redistribution layer 400 is formed on the active surface of the semiconductor chip 200 and on the first surface 101 of the insulating frame 100. The redistribution layer 400 has a first insulation layer 410, a first wiring layer 420, a second insulation layer 430, and a second wiring layer 440. In addition, the second wiring layer 440 may be omitted according to the embodiment mode. However, the configuration of the redistribution layer 400 is only an example configured to realize the fan-out structure, and the configuration of the redistribution layer 400 described above may be variously modified by those skilled in the art. Accordingly, the redistribution layer 400 may be formed in any configuration as long as the external connection terminal 500 can be formed in an area outside the area occupied by the semiconductor chip 200.

In FIG. 65, the first wiring layer 420 extends beyond the region occupied by the semiconductor chip 200 and extends to the lower region of the insulating frame 100. In addition, the first wiring layer 420 may extend to the region of the molding layer 300.

In addition, the redistribution layer 400 is electrically connected to the external connection terminal 500. The external connection terminal 500 has a solder ball or bump structure. More specifically, the external connection terminal 500 is formed on the second wiring layer 440 and electrically connected to the pads 210 of the semiconductor chip 200. In addition, the second wiring layer 440 may be omitted according to the embodiment. That is, the external connection terminal 500 may be directly formed on the first wiring layer 420.

FIGS. 66 to 70 are sectional views showing modifications of the semiconductor package shown in FIG. 65 according to the fourth embodiment of the present disclosure.

Figure 66:
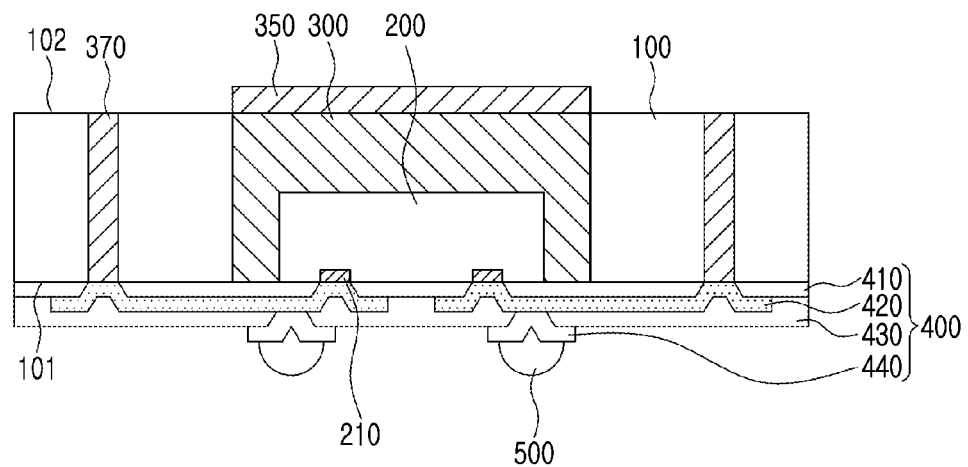
FIGS. 66 to 70 are sectional views showing modifications of the semiconductor package shown in FIG. 65 according to the fourth embodiment of the present disclosure.

Referring to FIG. 66, the molding layer 300 fills a through hole. In addition, the conductive layer 350 is formed on the molding layer 300 that fills the through holes. The conductive layer 350 is formed on the molding layer 300 and protrudes from the second surface 102 facing the first surface 101 of the insulating frame 100. In FIG. 65, the upper surface of the conductive layer 350 is coplanar with the second surface 102 of the frame 100, while the upper surface of the conductive layer 350 in FIG. 66, the top surface of the conductive layer 350 is set to be higher than the second surface 102 of the frame 100.

The other constitution and material of FIG. 66 are the same as those described in FIG. 65. That is, the molding layer 300 has a conductive powder, and the conductive layer 350 formed on the molding layer 300 may be composed of a conductive powder of metal or conductive oxide. Thus, the conductive layer 350 has a higher conductivity than the molding layer 300.

Figure 67:
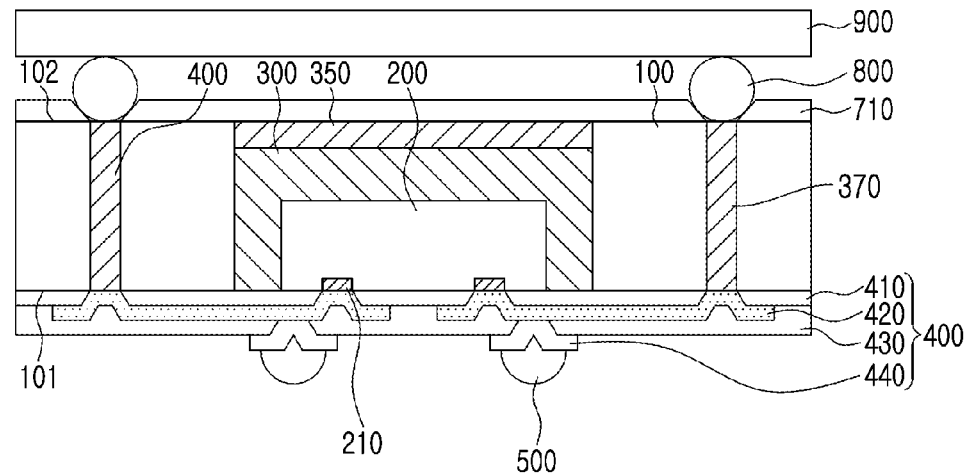

Referring to FIG. 67, an upper semiconductor package 900 is mounted on the semiconductor package shown in FIG. 65. The upper semiconductor package 900 is electrically connected to the via contacts 370 and the upper connection terminal 800 is interposed between the upper semiconductor package 900 and the via contact 370. Also, an upper insulating layer 710 may be formed to avoid unwanted physical contact between upper and lower semiconductor packages.

In the above-described semiconductor packages of FIGS. 65 to 67, the molding layer 300 has a conductive powder. Accordingly, the molding layer 300 has a predetermined conductivity. The conductive layer 350 formed on the molding layer 300 has higher conductivity than the molding layer 300. The heat generated in the semiconductor chip 200 can easily flow out to the outside by the conductive layer 350 and the molding layer 300 having conductivity.

In addition, the electromagnetic wave interference is minimized due to the conductivity secured by the molding layer 300 and the conductive layer 350. This allows semiconductor devices to operate normally in a variety of environments.

Figure 68:
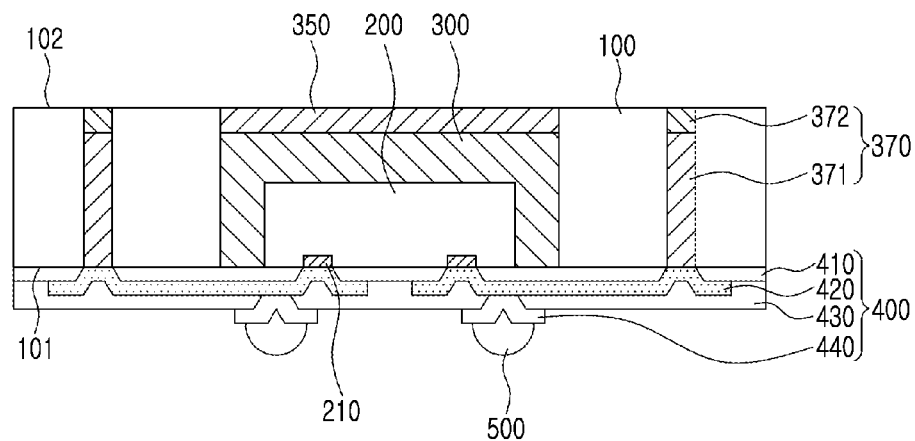

Referring to FIG. 68, the molding layer 300 for covering the semiconductor chip 200 has a conductive powder having a high conductivity. That is, the molding layer 300 may be formed using the conductive metal powder or the conductive oxide powder described in FIG. 65. Because the via contact 370 and the molding layer 300 are electrically opened each other by the insulating frame 100 made of an insulating material or a semiconductor, the semiconductor chip can be normally operated even if the molding layer 300 is used as the conductive powder.

The via contact 370 has a first via layer 371 and second via layer 371. The first via layer 371 has the same material as the molding layer 300 and are formed simultaneously with the molding layer 300.

In addition, the conductive layer 350 is formed on the molding layer 300 having the conductive powder. The second via layer 372 is formed on the first via layer 371 simultaneously with the conductive layer 350 formed on the molding layer 300. The conductive layer 350 and the second via layer 372 may be formed of metal. In particular, the first via layer 371 formed under the second via layer 372 is electrically connected to the lower redistribution layer 400 and the second via layer 372 is exposed to the upper portion of the insulating frame 100 to achieve electrical connection with another semiconductor package.

The conductive layer 350 formed on the molding layer 300 may have a conductivity higher than that of the molding layer 300, and the second via layer 372 formed on the first via layer 371 may have a higher conductivity than that of the first via layer 371. The molding layer 300 or the first via layer 371 can have a predetermined conductivity through the physical connection of the conductive powders, and the conductive layer 350 and the second via layer 372 can be formed by using various methods such as a deposition process or a plating process.

Figure 69:
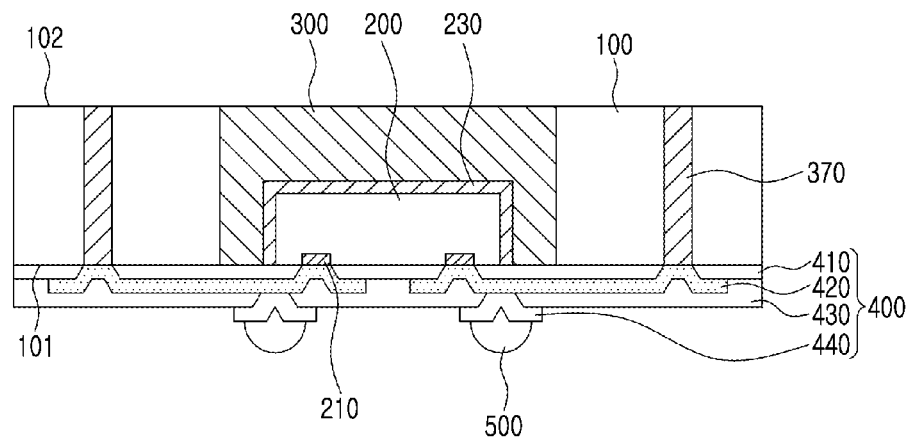

Referring to FIG. 69, the molding layer 300 is composed of a conductive powder as described in FIG. 68. And, barrier film 230 is introduced on the semiconductor chip 200.

The barrier film 230 prevents diffusion of the metal material contained in the molding layer 300. That is, when the conductive powder has a metal powder, a part of the metal can be diffused into the semiconductor chip 200 with a high diffusion coefficient. Particularly, Cu in the metal powder has a high diffusion coefficient. If the metal material is diffused into the semiconductor chip 200, the semiconductor chip 200 may malfunction. Therefore, the barrier film 230 prevents diffusion of the metal material of the molding layer 300 into the semiconductor chip 200. For this, the barrier film 230 is formed on the side and back surface of the semiconductor chip 200.

Examples of the material that can be used for the barrier film 230 include Ti, Ta, W, Ru, Mo, TiN, TaN, WN or graphene oxide.

Figure 70:
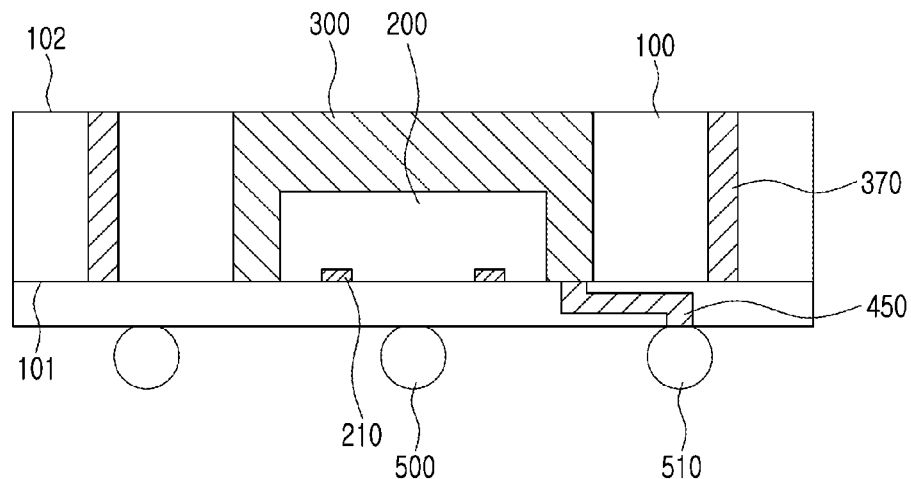

Referring to FIG. 70, in the semiconductor package of FIG. 68 or FIG. 69, the molding layer 300 has high conductivity and is electrically connected to the ground terminal 510 using a separate wiring. That is, the molding layer 300 is electrically connected to the ground terminal 510 through the ground wiring 450. When the molding layer 300 for shielding the semiconductor chip 200 is electrically connected to the ground terminal 510, the electromagnetic wave shielding ability of the molding layer 300 is improved. Accordingly, stable operation of the semiconductor chip 200 can be ensured, and heat dissipation capability is improved.

Figure 71:
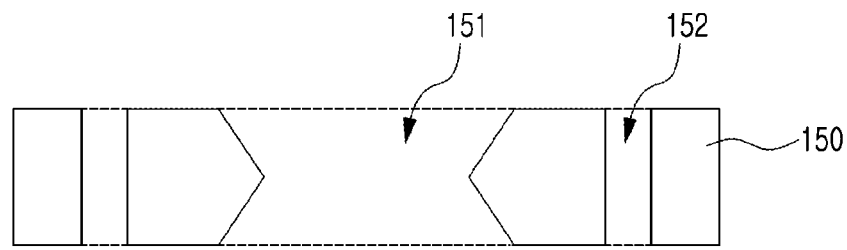
FIGS. 71 to 73 are sectional views showing structures of an insulating frame that can be used in the semiconductor package shown in FIGS. 65 to 70 according to the fourth embodiment of the present disclosure.
Figure 72:
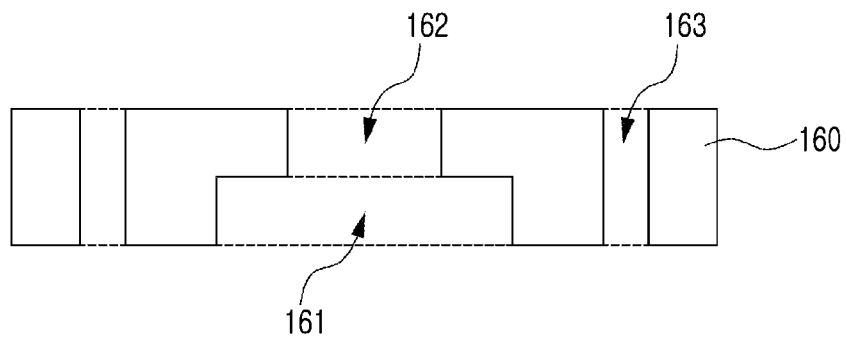
Figure 73:
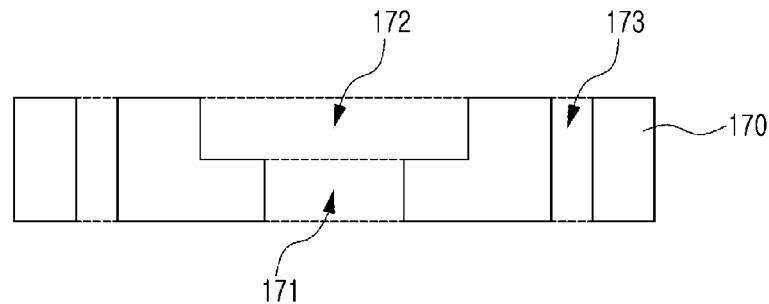

FIGS. 71 to 73 are sectional views showing structures of an insulating frame that can be used in the semiconductor package shown in FIGS. 65 to 70 according to the fourth embodiment of the present disclosure.

In FIGS. 65 to 70, the through hole of the insulating frame is shown as having a profile perpendicular to the lower surface, but other frame structures are also possible.

Referring to FIG. 71, an insulating frame 150 having through hole 151 and a via hole 152 and insulating frame 150 formed thereon protrudes toward the through hole 151.

That is, the inner circumferential surface of the insulating frame 150 defining the through hole 151 is provided in a convex shape toward the through hole 151. The insulating frame 150 having a convex shape toward the inner circumferential surface of the through hole 151 disperses thermal stress evenly throughout the insulating frame 150 when thermal stress is generated through the molding layer in subsequent manufacturing steps.

Referring to FIG. 72, the insulating frame 160 has a first through hole 161 and a second through hole 162 and has a via hole 163 in the vicinity of the through holes 161 and 162. The first through hole 161 has a wider width than the second through hole 162. The semiconductor chip can be mounted in the first through hole 161. A part of the insulating frame 160 can be extended to the top of the semiconductor chip by the second through hole 162, whereby the insulating frame 160 can effectively protect the semiconductor chip from the external environment.

Referring to FIG. 73, the insulating frame 170 has a first through hole 171 and a second through hole 172 and has a via hole 173 around the through holes 171 and 172. The first through hole 171 has a narrow width as compared with the second through hole 172. The semiconductor chip may be mounted in the first through hole 171.

FIGS. 74 to 77 are a plan view and a cross-sectional view for explaining the method of manufacturing the semiconductor package according to the fourth embodiment of the present disclosure.

Figure 74:
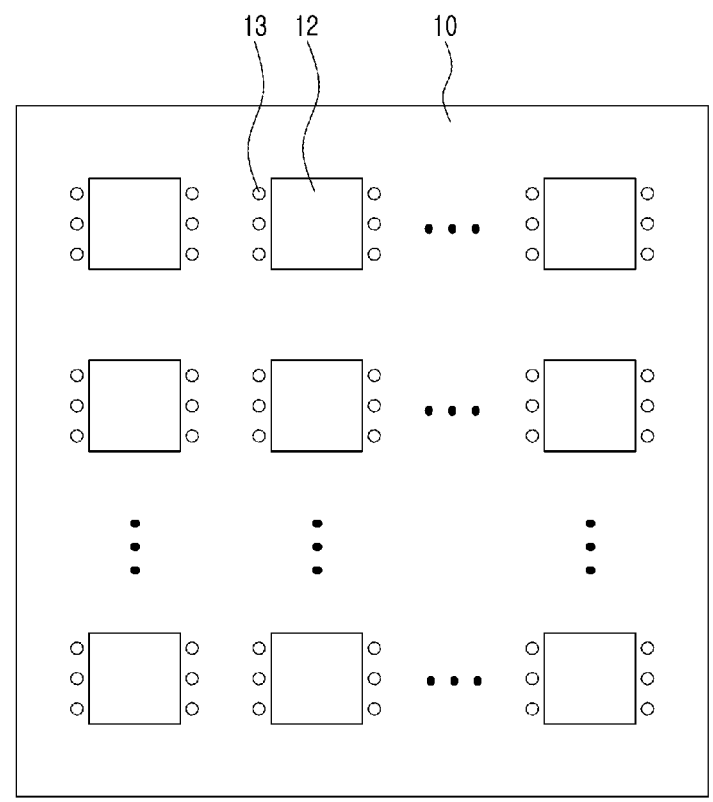
FIGS. 74 to 77 are a plan view and a cross-sectional view for explaining the method of manufacturing the semiconductor package according to the fourth embodiment of the present disclosure.

Referring to FIG. 74, the mother frame 10 is prepared. The mother frame 10 has a plurality of through holes 12 and a plurality of via holes 13 formed around the through holes 12. In FIG. 74, the via holes 13 formed around one through hole 12 are shown formed only on the right and left sides of the through hole 12, but the via holes 13 are formed at various positions around the through hole 12.

The mother frame 10 is divided into respective insulating frames according to a subsequent cutting process. Each insulating frame includes at least one through hole 12 and a plurality of via holes 13 formed around the through hole 12. In addition, the material of the mother frame 10 has the same material as the mother frame described in FIG. 65 above.

If the mother frame 10 has a semiconductor material, the surface of the mother frame 10 may be coated with an insulating layer of oxide or nitride. Therefore, an insulating layer can be applied to the inner circumferential surface of the through hole 12 formed in the mother frame 10 and the inner circumferential surface of the via hole 13.

Figure 75:
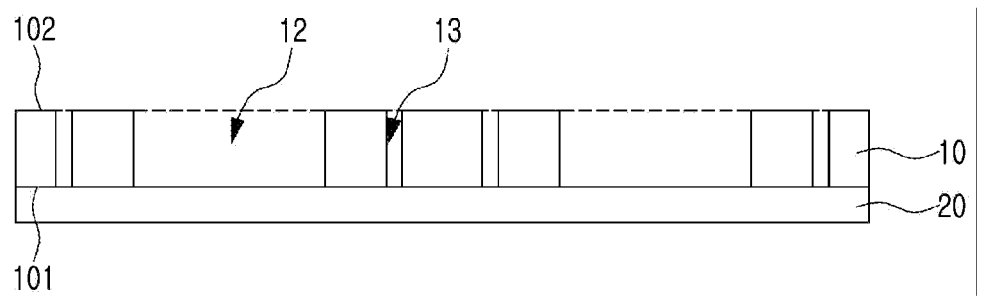

Referring to FIG. 75, the mother frame 10 is disposed on the carrier substrate 20. The first surface 101 of the mother frame 10 is disposed toward the carrier substrate 20 and the surface of the carrier substrate 20 is exposed through the through hole 12 and the via hole 13.

In FIG. 75, the mother frame 10 may be provided in various shapes. That is, the mother frame having the through holes shown in FIGS. 71 to 73 can be similarly applied in the subsequent processes.

Figure 76:
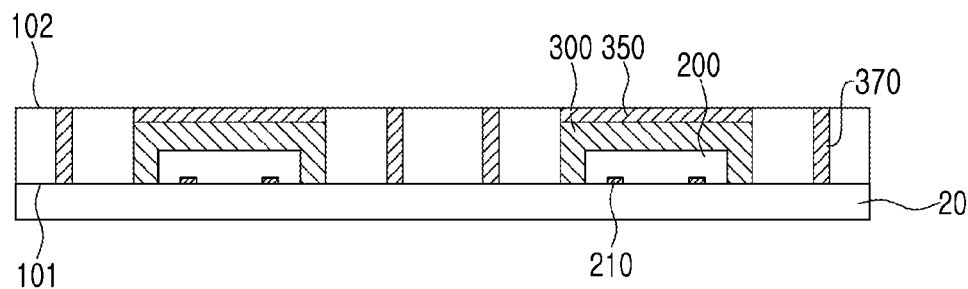

Referring to FIG. 76, the semiconductor chip 200 is disposed in the through hole. The pads 210 on the active surface of the semiconductor chip 200 are arranged to face the carrier substrate 20.

If the semiconductor package of FIG. 69 is manufactured, the barrier film 230 may be formed after the semiconductor chip 200 is disposed on the carrier substrate 20. The barrier film 230 is formed using conventional chemical vapor deposition or physical vapor deposition.

Before the semiconductor chip 200 is placed on the carrier substrate 20, the barrier film 230 is formed in advance on the side surface of the semiconductor chip 200 and on the back surface opposite to the active surface through the deposition process for the semiconductor chip 200. Therefore, the semiconductor chip 200 on which the barrier film 230 is formed can be disposed on the carrier substrate 20.

Then, a molding layer 300 for shielding the semiconductor chip 200 disposed in the through hole is formed. The molding layer 300 is formed by mixing a conductive powder into an epoxy molding compound. For the formation of the molding layer 300, an epoxy molding compound or the like is provided in the form of a solution or provided in the form of a powder. The above described molding material fills a through hole in which the semiconductor chip 200 is disposed. In addition, a heating process may be performed to cure the molding material in the solution and cure the powder, thereby forming the molding layer 300 in which the conductive powder is mixed.

Subsequently, a conductive layer 350 is formed on the molding layer 300. The conductive layer 350 includes Ag, Cu, or Al, and the metal powder may be provided in a state where the metal powders are closely connected to each other. To this end, the metal powder is dispersed in a solvent and provided on the molding layer 300 in the form of a conductive paste, and then the conductive layer 350 can be formed through evaporation of the solvent.

In addition, the conductive layer 350 may include a conductive oxide in addition to the metal powder. The conductive oxide may be composed of ITO or IZO.

In particular, the via contact 370 may be formed simultaneously with the formation of the conductive layer 350. That is, since the conductive layer 350 and the via contact 370 can have the same material, the conductive layer 350 and the via contact 370 can be formed in a concurrent process by filling the upper part of the molding layer 300 and the via hole with conductive paste.

In addition, when the conductive layer 350 and the via contact 370 have different materials, the formation of the conductive layer 350 and the via contact 370 may proceed in any order.

The semiconductor chip 200 is disposed in the through hole of the mother frame 10 disposed on the carrier substrate 20 and the semiconductor chip 200 is embedded by the molding layer 300. A conductive layer 350 is formed on the molding layer 300 and a via hole formed on the side surface of the through hole is filled with the via contact 370. It is preferable that the distal end of the via contact 370 formed is coplanar with the first surface 101 and the second surface 102 of the mother frame 10.

In FIG. 76, the molding layer 300 and the via contact 370 may be formed by the same process. That is, when the molding layer 300 and the via contact 370 have conductive powder, the via contact 370 are formed simultaneously with the formation of the molding layer 300. When the process of FIG. 77 to be described later is performed, the semiconductor package shown in FIGS. 68 to 70 can be manufactured.

Figure 77:
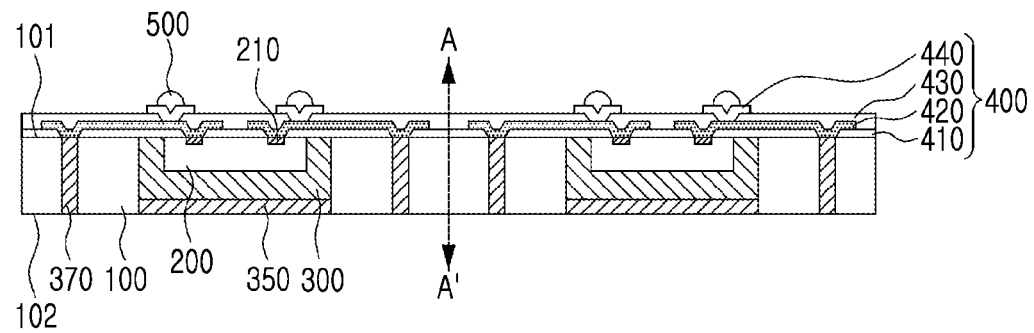

Referring to FIG. 77, the carrier substrate is removed, and a redistribution layer 400 is formed on the active surface of the semiconductor chip 200 and the first surface 101 of the mother frame 10.

First, the mother frame 10 on which the molding layer 300 is formed is separated from the carrier substrate. The pads 210 of the semiconductor chip 200 and the first surface 101 of the mother frame 10 are exposed by separation from the carrier substrate. The redistribution layer 400 and the external connection terminal 500 are sequentially formed on the pad 210 of the semiconductor chip 200 and the first surface 101 of the mother frame 10.

The formation of the redistribution layer 400 follows the manufacturing process described in the first embodiment.

An external connection terminal 500 is formed on the second wiring layer 440 of the redistribution layer 400. The external connection terminal 500 is preferably a solder ball or a bump.

The semiconductor chip 200 is mounted in the mother frame 10 and the molding layer 300 and the conductive layer 350 for filling the through holes are formed. A redistribution layer 400 is formed on the active surface of the semiconductor chip 200 and on the first surface 101 of the mother frame 10.

Then, the mother frame 10 is cut along the cutting line A-A' to obtain an individual semiconductor package.

That is, the semiconductor package shown in FIG. 65 can be obtained by cutting the mother frame 10 having the through holes for receiving the semiconductor chip 200 and the molding layer 300 for shielding the semiconductor chip 200.

In addition, the semiconductor package described in FIG. 66 can be manufactured by the process in which the molding layer 300 completely fills the through hole on the semiconductor chip 200 disposed in the through hole and the conductive layer 350 is formed on the molding layer 300 in the process of FIG. 76. That is, in the process of FIG. 76, the molding layer 300 covers the semiconductor chip 200 and fills the through hole. The conductive layer 350 is formed on the molding layer 300 and may be provided in a protruding form from the second surface 102 of the mother frame 10. The subsequent steps are the same as those described in FIG. 77 above.

In addition, the shape of the semiconductor package may be variously changed according to the cutting process for the structure disclosed in FIG. 77. That is, it is also possible to manufacture a semiconductor package that exposes a molding layer surrounding a side surface of a semiconductor chip through cutting to remove the via contact.

Fifth Embodiment

Figure 78:
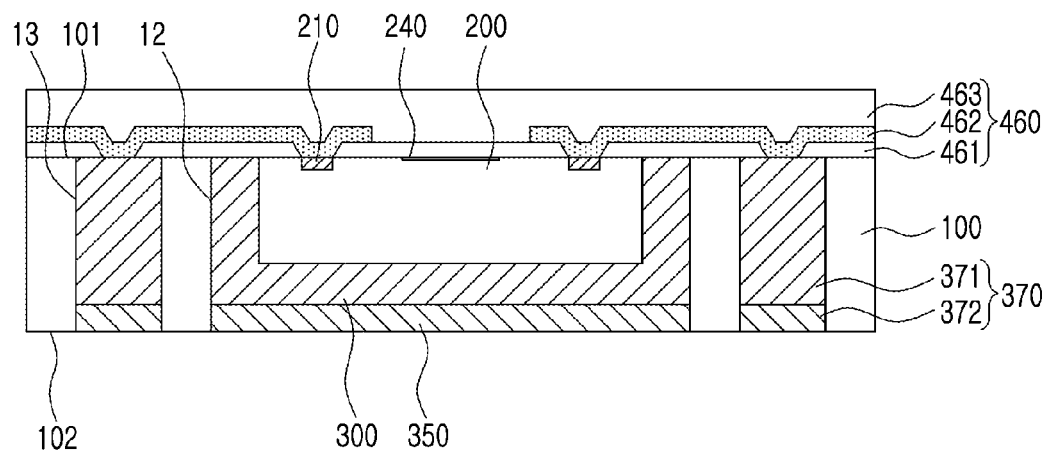
FIG. 78 is a sectional view showing a chip package according to a fifth embodiment of the present disclosure.

FIG. 78 is a sectional view showing a chip package according to a fifth embodiment of the present disclosure.

Referring to FIG. 78, the semiconductor package of this embodiment includes an insulating frame 100, a semiconductor chip 200, a molding layer 300, a conductive layer 350, a via contact 370 and an upper redistribution layer 460.

The insulating frame 100 is preferably an insulating material or a semiconductor material. Further, it is preferable that the frame 100 has a thermal expansion coefficient similar to that of the carrier substrate or the molding layer 300 described above. The material of the insulating frame 100 is the same as that described in the first embodiment. The insulating frame 100 may be variously selected depending on the material of the carrier substrate or the molding layer 300 to be used.

The insulating frame 100 has a through hole 12 and a via hole 13 formed around the through hole 12. If the insulating frame 100 has a semiconductor material, an insulating layer may be formed on the inner circumferential surface of the through hole 12. The insulating layer may be provided to cut off the electrical connection between the semiconductor chip 200 and the insulating frame 100. In addition, when the frame 100 has a semiconductor material, the insulating layer may be formed on the inner peripheral surface of the via hole 13.

The through hole 12 of the insulating frame 100 may be provided to pass through the insulating frame 100 and may be located at the center of the insulating frame 100. The through hole 12 is provided to be wider than the width of the semiconductor chip 200 to accommodate the semiconductor chip 200.

The chip 200 is disposed in the through hole 12 of the insulating frame 100. The semiconductor chip 200 may have an active surface including an active region where a circuit is formed. On the other hand, the back surface of the chip 200 may be an inactive surface. Alternatively, both sides of the chip 200 are provided with active surfaces. A plurality of pads 210 for exchanging signals with the outside may be provided on the active surface of the semiconductor chip 200. The pads 210 may be formed of a conductive material layer such as aluminum (Al). The pad 210 may be formed integrally with the semiconductor chip 200.

The pads 210 of the semiconductor chip 200 may be disposed to face the upper redistribution layer 460. The active surface of the semiconductor chip 200 is preferably coplanar with the first surface 101 of the insulating frame 100.

In addition, when the semiconductor chip 200 of the semiconductor package according to the present embodiment is applied to a fingerprint sensor, the semiconductor chip 200 may include a sensing unit 240 for sensing a fingerprint on the active surface of the semiconductor chip 200. The sensing unit 240 may be formed in various shapes, for example, using a conductive material. The sensing unit 240 can detect a difference in capacitance due to a height difference according to the ridges and patterns of the fingerprint of the user's finger and can scan the image of the fingerprint to produce a fingerprint image. Therefore, the active surface of the semiconductor chip 200 according to the present disclosure may be formed in an open form with respect to the upper redistribution layer 460 which will be described later, and can collect an external information such as fingerprint information due to user's finger. In addition, although the sensing unit 240 of the semiconductor chip 200 according to the present embodiment is described as a fingerprint sensor, the semiconductor chip 200 can be applied to chips such as electromagnetic sensing, optical sensing, and medical sensing in addition to sensing of a fingerprint sensor.

The thickness of the semiconductor chip 200 may be equal to or different from the thickness of the insulating frame 100. In order to form the molding layer 300 and the conductive layer 350 to be filled in the through hole 12, it is preferable that the semiconductor chip 200 has a thickness smaller than the thickness of the insulating frame 100.

A molding layer 300 is formed on a side surface and a back surface of the semiconductor chip 200 disposed in the through hole 12. The molding layer 300 has a common epoxy molding compound (EMC) material and may be supplied in liquid or powder form. When supplied in the form of liquid, it is formed into the molding layer 300 through volatilization of the solvent. The molding layer 300 may include an insulating polymer as a main component and silica particles. The molding layer 300 is mixed with a conductive powder. The conductive powder is preferably a metal powder such as Ag, Cu or Al. In addition, the conductive powder may have a conductive oxide such as ITO or IZO.

A conductive layer 350 is formed on the molding layer 300. The conductive layer 350 is preferably formed in the through hole 12. The conductive layer 350 includes Ag, Cu, or Al, and the metal powder may be provided in a state where the metal powders are closely connected to each other. To this end, the metal powder is dispersed in a solvent and provided on the molding layer 300 in the form of a conductive paste, and then the conductive layer 350 can be formed by evaporation of the solvent.

Accordingly, the conductive layer 350 has a higher conductivity than the molding layer 300 in which the conductive powder may be mixed.

The semiconductor package according to the present embodiment may include a via contact 370 provided outside the pad 210 of the semiconductor chip 200 and capable of transmitting an electrical signal in a vertical direction due to the via contact 370. One end point of the via contact 370 is electrically connected to the chip 200, the other end point is electrically connected to an external connection terminal (not shown), and the external connection terminal can be electrically connected to the main substrate or another chip or package. The via contact 370 may be formed by being filled in the via hole 13 formed around the through hole 12 of the insulating frame 100.

In addition, the via contact 370 may include a first via layer 371 and a second via layer 372.

One surface of the first via layer 371 may be formed to be coplanar with the first surface 101 of the insulating frame 100 and electrically connected to an upper redistribution layer 460 to be described later. The first via layer 371 may have the same material as the molding layer 300.

A second via layer 372 may be formed on the first via layer 371 and one surface of the second via layer 372 may be formed to be coplanar with the second surface 102 of the insulating frame 100. That is, the first via layer 371 and the second via layer 372 may be formed in the via hole 13 of the insulating frame 100. The second via layer 372 may have the same material as the conductive layer 350.

The upper redistribution layer 460 may be provided to electrically connect one side of the via contact 370 with the pad 210 of the chip 200. For example, the upper redistribution layer 460 may include a first insulation layer 461, a first wiring layer 462, and a second insulation layer 463. The first insulation layer 461 and the second insulation layer 463 are formed of an insulating material.

The first insulation layer 461 may be formed on the active surface of the semiconductor chip 200, the molding layer 300, and the first surface 101 of the insulating frame 100. The first insulation layer 461 exposes the pads 210 of the semiconductor chip 200 and the via contacts 370, and the first wiring layer 462 stacked on the first insulation layer 461 is electrically connected to the pads 210 and the via contact 370.

The first wiring layer 462 includes a conductive material and is stacked on the first insulation layer 461. In addition, the first insulation layer 461 exposes the pads 210 of the semiconductor chip 200 and the via contacts 370, so that the first wiring layer 462 formed on the first insulation layer 461 is connected to the pads 210 and via contact 370.

when the semiconductor chip 200 of the semiconductor package functions as a fingerprint sensor, it is preferable that the first wiring layer 462 is formed so that the active surface of the semiconductor chip 200 is opened and the sensing unit 240 of the semiconductor chip 200 is opened.

The first wiring layer 462 may include a metal as a conductive material, and may include copper, a copper alloy, aluminum, or an aluminum alloy, for example.

The second insulation layer 463 may be formed on the first insulation layer 461 and the first wiring layer 462, so that isolate the first wiring layer 462 from the outside. Although the second insulation layer 463 seals the first wiring layer 462 in FIG. 78, the second insulation layer 463 may be provided to expose a part of the first wiring layer 462 and may be electrically connected to the outside (main substrate, semiconductor chip, package, or the like) through the exposed first wiring layer 462.

FIGS. 79 to 83 are sectional views showing modifications of the semiconductor package shown in FIG. 78 according to the fifth embodiment of the present disclosure.

Figure 79:
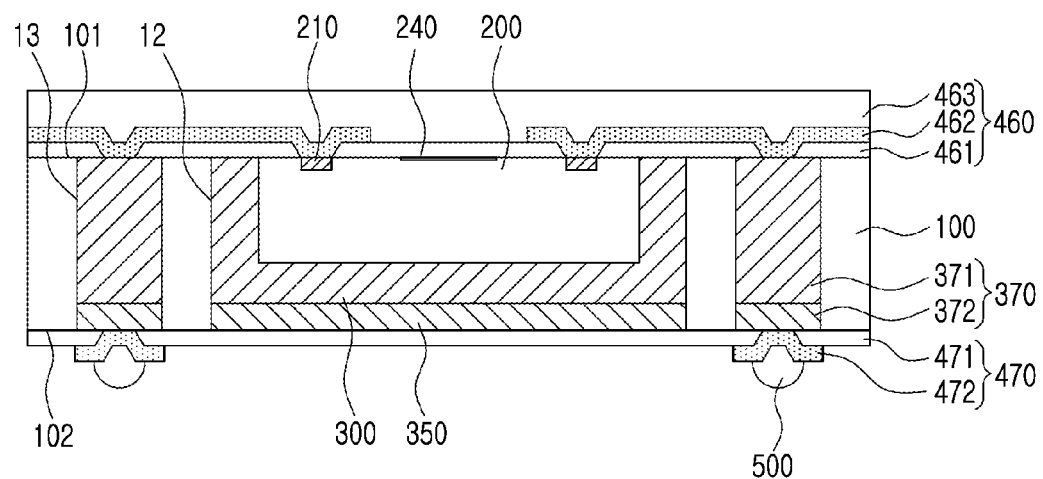
FIGS. 79 to 83 are sectional views showing modifications of the semiconductor package shown in FIG. 78 according to the fifth embodiment of the present disclosure.

Referring to FIG. 79, a lower redistribution layer 470 is formed in a direction opposite to the pad 210 of the semiconductor chip 200.

That is, a lower redistribution layer 470 formed of the third insulation layer 471 and the second wiring layer 472 may be formed under the second surface 102 of the insulating frame 100 and the conductive layer 350.

The third insulation layer 471 may be formed to be stacked on the conductive layer 350 and the second surface 102 of the insulating frame 100. The third insulation layer 471 may expose the second via layer 372 of the via contact 370 and second wiring layer 472 formed on the third insulation layer 471 contacts an external connection terminal 500.

The second wiring layer 472 may be formed on the third insulation layer 471 and connected to an external connection terminal 500 having a solder ball or bump structure. The external connection terminal 500 may be electrically connected to the pads 210 of the chip 200 through the lower redistribution layer 470, the via contact 370, and the upper redistribution layer 460. The external connection terminal 500 may be directly connected to the lower portion of the via contact 370 of the semiconductor package shown in FIG. 78, that is, the lower portion of the second via layer 372 without the lower redistribution layer 470.

The semiconductor package shown in FIG. 79 is the same in structure and material as the semiconductor package disclosed in FIG. 78 except for the lower redistribution layer 470 and the external connection terminal 500.

Figure 80:
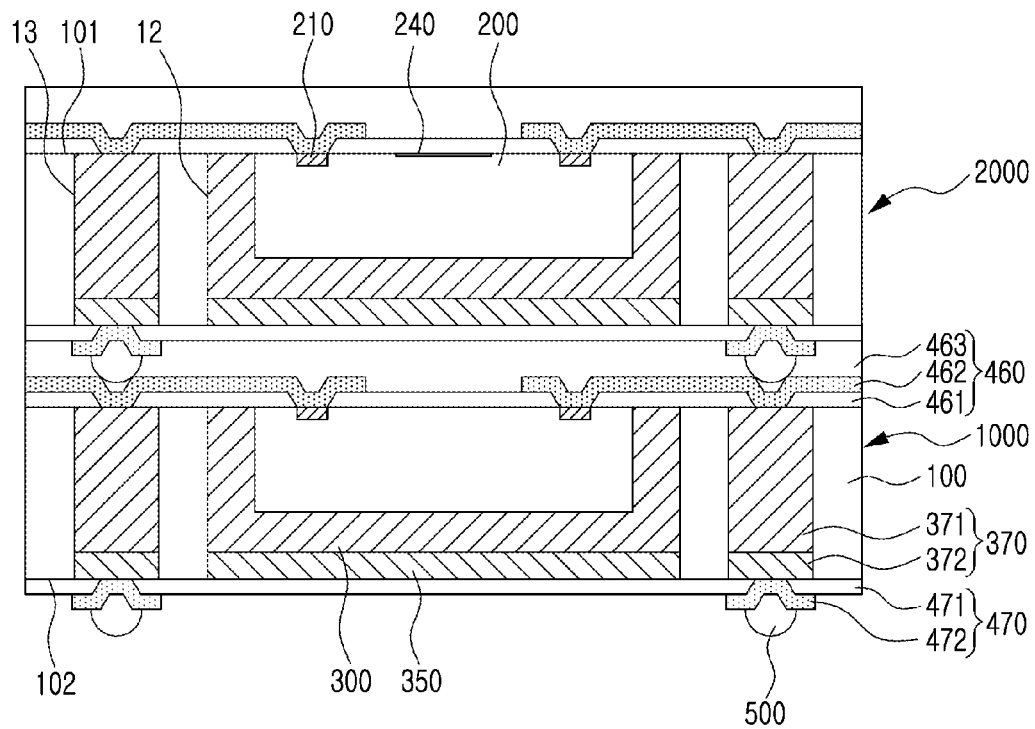

Referring to FIG. 80, a package-on-package (POP) in which a plurality of semiconductor packages shown in FIG. 78 are stacked is disclosed. The package-on-package may be a structure in which a plurality of semiconductor packages 1000, 2000 are stacked vertically. Specifically, the upper semiconductor package 2000 may be positioned on the lower semiconductor package 1000, and the second insulation layer 463 of the lower semiconductor package 1000 may be provided to expose a portion of the first wiring layer 462, and the external connection terminal 500 of the upper semiconductor package 2000 may be connected to the first wiring layer 462 of the exposed lower semiconductor package 1000.

In the above-described semiconductor packages of FIGS. 78 to 80, the conductive powder may be mixed into the molding layer 300. Accordingly, the molding layer 300 has a predetermined conductivity. The conductive layer 350 formed on the molding layer 300 has higher conductivity than the molding layer 300. The heat generated in the semiconductor chip 200 can easily flow out to the outside by the conductive layer 350 and the molding layer 300 having conductivity.

In addition, the electromagnetic wave interference is minimized due to the conductivity secured by the molding layer 300 and the conductive layer 350. This allows semiconductor to operate normally in a variety of environments.

Figure 81:
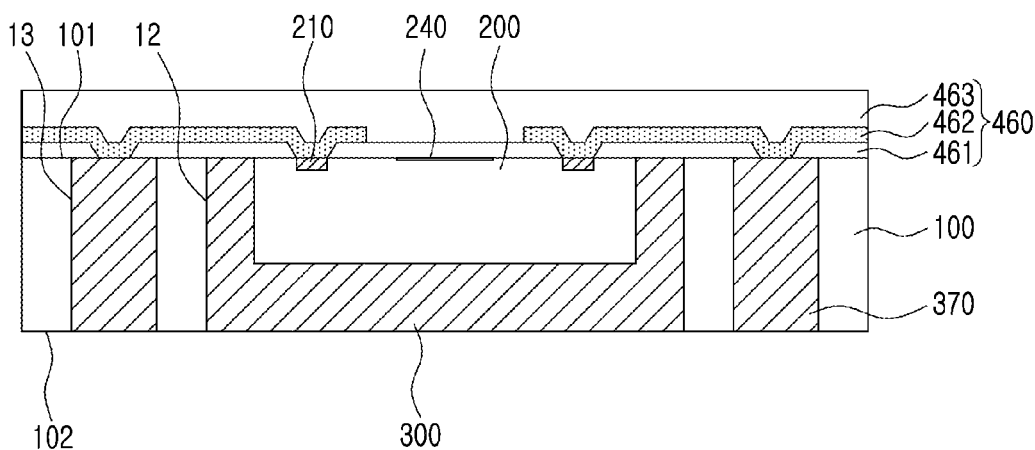

Referring to FIG. 81, the molding layer 300 is made of a conductive powder having a high conductivity for shielding the semiconductor chip 200. That is, the molding layer 300 may be formed using the conductive metal powder or the conductive oxide powder described in FIG. 78. Even if the molding layer 300 is made of the conductive powder, the operation of the semiconductor chip 200 can be normally operated because the insulating frame 100 has the insulating material or the semiconductor material, and the via contact 370 and molding layer 300 are mutually isolated. The via contact 370 has the same material with that of the molding layer 300 and is formed simultaneously with the molding layer 300.

Figure 82:
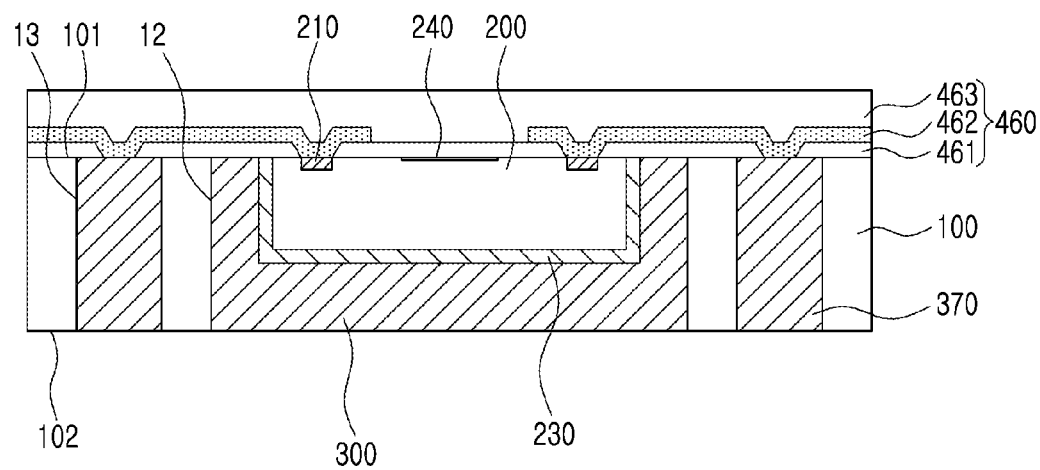

Referring to FIG. 82, the molding layer 300 is composed of conductive powder as described in FIG. 81. The semiconductor package has the same configuration with FIG. 81 except that the barrier film 230 is introduced on the semiconductor chip 200.

The barrier film 230 prevents diffusion of the metal material contained in the molding layer 300. That is, when the conductive powder has a metal powder, a part of the metal can be diffused into the semiconductor chip 200 with a high diffusion coefficient. Particularly, Cu in the metal powder has a high diffusion coefficient. If the metal material is diffused into the semiconductor chip 200, the semiconductor chip 200 causes malfunction. Therefore, the barrier film 230 prevents diffusion of the metal material of the molding layer 300 into the semiconductor chip 200. For this, the barrier film 230 may be formed on the side and back surface of the semiconductor chip 200.

As the material that can be used as the barrier film 230, an insulating film or a metal film may be used. For example, Ti, Ta, W, Ru, Mo, TiN, TaN, WN or graphene oxide may be used, and double layer or multiple layer thereof may be used.

Figure 83:
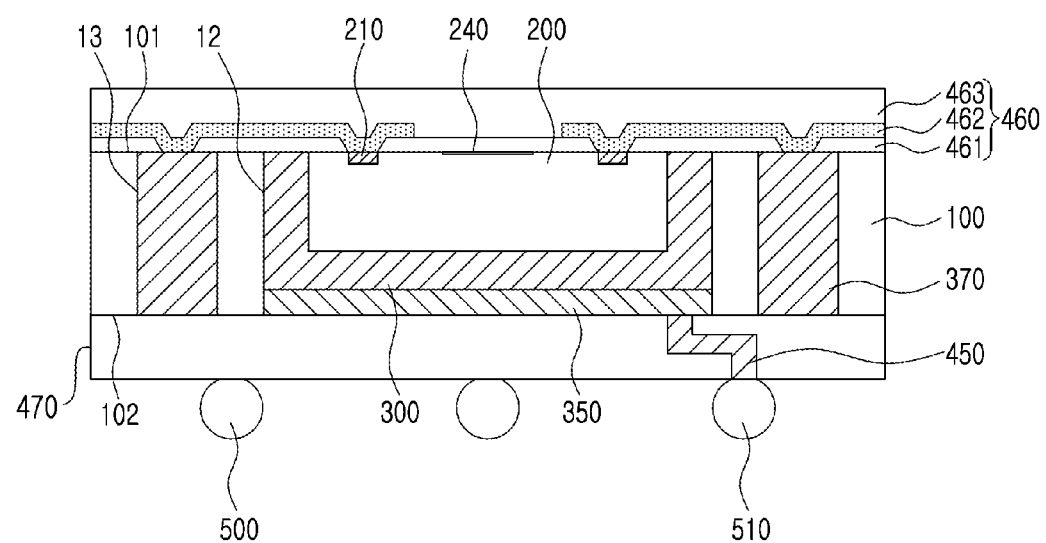

Referring to FIG. 83, since the molding layer 300 has a high conductivity, it is electrically connected to the ground terminal 510 using a separate wiring. That is, the molding layer 300 is electrically connected to the ground terminal 510 through the ground wiring 450 connected to the conductive layer 350. When the molding layer 300 that shields the semiconductor chip 200 is electrically connected to the ground terminal 510, the electromagnetic wave shielding ability of the molding layer 300 is improved. Accordingly, stable operation of the semiconductor chip 200 can be ensured, and heat dissipation capability is improved.

The chip package according to the present embodiment allows the via contact 370 and the redistribution layer to be directly connected to each other while eliminating a separate metal pad, making it possible to manufacture a thin and compact product.

In the case of the sensor device including the semiconductor chip 200, minimizing the thickness between all the build-up layers from the active surface of the semiconductor chip 200 is a method for increasing the sensing sensitivity. In the case of the semiconductor package according to the present embodiment, since the thickness of the first insulation layer 461 can be reduced, it is highly applicable to semiconductor packages of various fields.

In addition, conductive powder is mixed with the molding layer 300 of the semiconductor package according to the present embodiment. Accordingly, the molding layer 300 has a predetermined conductivity. The conductive layer 350 formed on the molding layer 300 has higher conductivity than the molding layer 300. The heat generated in the semiconductor chip 200 can easily flow out to the outside by the conductive layer 350 and the molding layer 300 having conductivity.

In addition, the electromagnetic wave interference is minimized due to the conductivity secured by the molding layer 300 and the conductive layer 310. This allows semiconductor devices to operate normally in a variety of environments.

In addition, the insulating frame of this embodiment can employ the structure disclosed in FIGS. 71 to 73 of the fourth embodiment. The contents of the insulating frames shown in FIGS. 71 to 73 is described in the fourth embodiment, and a description thereof will be omitted.

FIGS. 84 to 89 are a plan view and a cross-sectional view for explaining the method of manufacturing the chip package shown in FIGS. 78 and 79 according to the fifth embodiment of the present disclosure.

Figure 84:
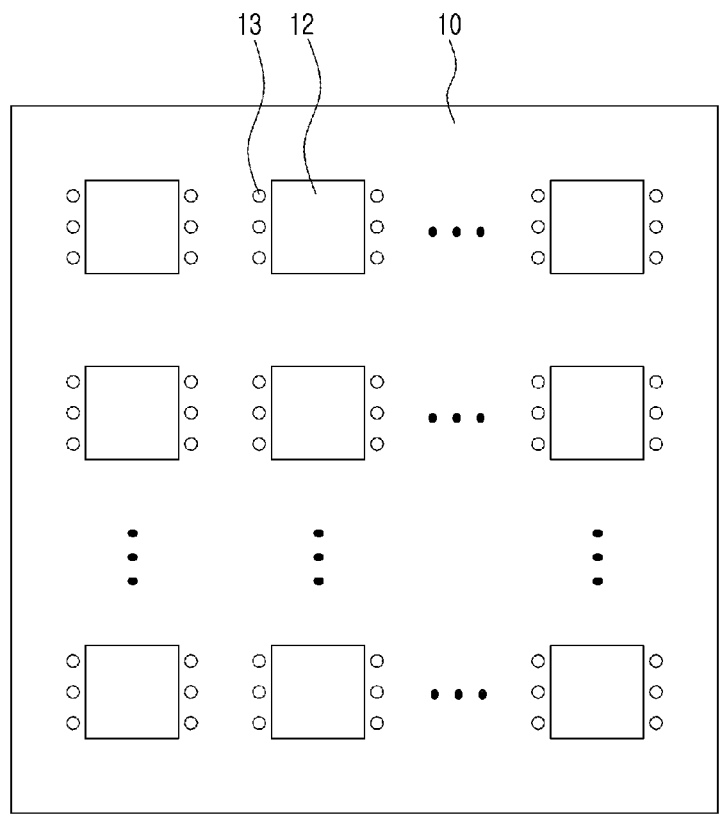
FIGS. 84 to 89 are a plan view and a cross-sectional view for explaining the method of manufacturing the chip package shown in FIGS. 78 and 79 according to the fifth embodiment of the present disclosure.

Referring to FIG. 84, the mother frame 10 is prepared. The mother frame 10 has a plurality of through holes 12 and a plurality of via holes 13 formed around the through holes 12. The structure and material of the mother frame 10 are the same as those described in FIG. 74 above.

Figure 85:
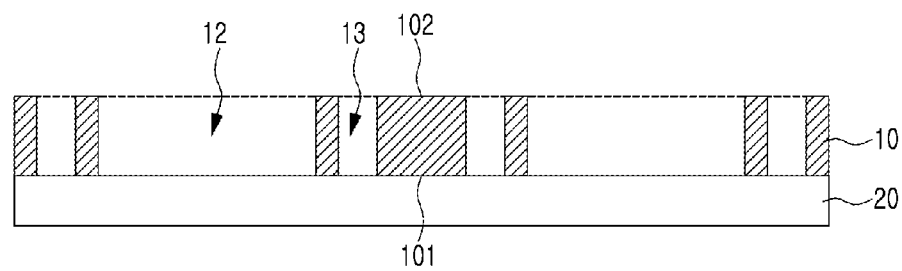

Referring to FIG. 85, the mother frame 10 is disposed on the carrier substrate 20. The first surface 101 of the mother frame 10 is disposed toward the carrier substrate 20 and the surface of the carrier substrate 20 is exposed by the through hole 12 and the via hole 13.

Figure 86:
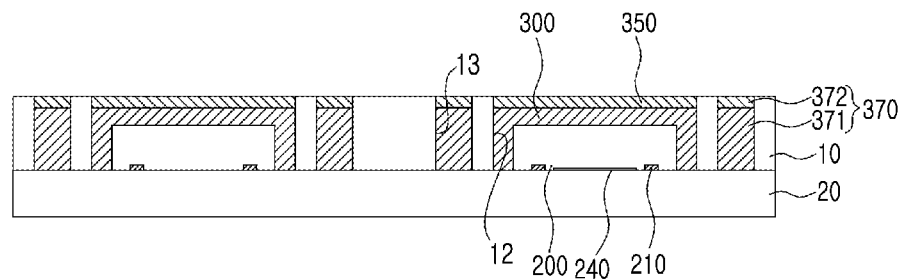

Referring to FIG. 86, a semiconductor chip 200 is disposed in the through hole 12. For example, the semiconductor chip 200 may include a sensing unit 240 for sensing a fingerprint on an active surface.

The pads 210 on the active surface of the chip 200 are disposed toward the carrier substrate 20. Then, a molding layer 300 for shielding the chip 200 disposed in the through hole 12 is formed. The molding layer 300 may be formed by mixing a conductive powder into an epoxy molding compound.

The first via layer 371 of the via contact 370 having the same material as the molding layer 300 may be formed in the via hole 13 at the same time as the molding layer 300 is formed. That is, since the molding layer 300 and the first via layer 371 have the same material, the first via layer 371 may be formed of a conductive material such as Ag, Cu, Al, or the like in the epoxy molding compound. Accordingly, the molding layer 300 and the first via layer 371 can be formed by the simultaneous process of filling the through hole 12 and the via hole 13.

In addition, when the molding layer 300 and the first via layer 371 have different materials, the molding layer 300 and the first via layer 371 may be formed in any order.

Subsequently, a conductive layer 350 is formed on the molding layer 300. The conductive layer 350 may be formed in the through hole 12 together with the molding layer 300. The conductive layer 350 may include Ag, Cu or Al.

In addition, the conductive layer 350 may include a conductive oxide in addition to the metal powder. The conductive oxide may be composed of ITO or IZO.

In particular, a second via layer 372 having the same material as the conductive layer 350 may be formed on the first via layer 371 at the same time as the conductive layer 350 is formed. That is, since the conductive layer 350 and the second via layer 372 may have the same material, the second via layer 372 may be formed of Ag, Cu, or Al. Accordingly, the conductive layer 350 and the second via layer 372 can be formed simultaneously by filling the upper portion of the molding layer 300 and the upper portion of the first via layer 371. The second via layer 372 is preferably formed in the via hole 13 together with the first via layer 371.

In addition, when the conductive layer 350 and the second via layer 372 have different materials, the formation of the conductive layer 350 and the second via layer 372 may be performed in any order.

The semiconductor chip 200 is disposed in the through hole 12 of the mother frame 10 disposed on the carrier substrate 20 and the semiconductor chip 200 is buried in the molding layer 300. The first via layer 371 fills the via hole 13 formed in the side of the through hole 12 at the same time as the molding layer 300 is formed. A conductive layer 350 is formed on the molding layer 300 and second via layer 372 is formed on the first via layer 371 buried in the via hole 13 to form the via contact 370. It is preferable that one end and the other end of the via contact 370 formed are coplanar with the first surface 101 and the second surface 102 of the mother frame 10, respectively.

Figure 87:
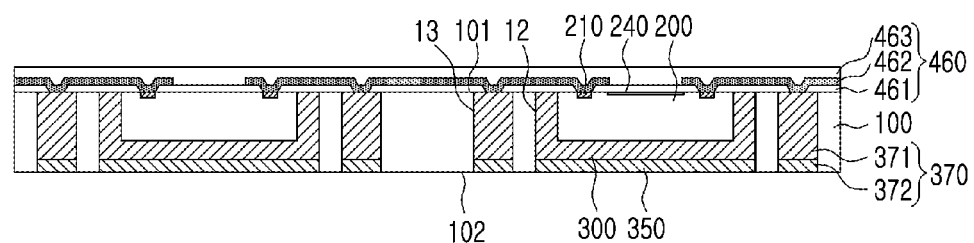

Referring to FIG. 87, the carrier substrate is removed, and an upper redistribution layer 460 is formed on the active surface of the semiconductor chip 200 and on the first surface 101 of the mother frame 10.

The first insulation layer 461 may be stacked to cover the semiconductor chip 200, the mother frame 10, and the molding layer 300. In this case, the first insulation layer 461 may be formed to expose the via contact 370 and the pad 210. The process of removing a part of the first insulation layer 461 may use an etching process or a laser removal process. The first insulation layer 461 may include an insulating material, and may include, for example, an oxide, a nitride, or an epoxy molding compound.

After the first insulation layer 461 is formed, a first wiring layer 462 may be formed. The first wiring layer 462 may be stacked on the first insulation layer 461 to form a wiring pattern for electrically connecting the pad 210 and the via contact 370. The first wiring layer 462 may fill the open portion of the first insulation layer 461 and may be connected to the pad 210 and the via contact 370 during this process. However, when the semiconductor chip 200 has function as a fingerprint sensor, it is preferable that the first wiring layer 462 opens the active surface of the semiconductor chip 200 to open the sensing unit 230 of the semiconductor chip 200. The first wiring layer 462 may include a metal as a conductive material, and may include copper, a copper alloy, aluminum, or an aluminum alloy, for example.

After the first wiring layer 462 is formed, a second insulation layer 463 may be formed. The second insulation layer 463 may be stacked on the exposed surfaces of the first insulation layer 461 and the first wiring layer 452. The second insulation layer 463 covers the first wiring layer 462 so that the first wiring layer 452 is not exposed to the outside, but the second insulation layer 463 is partly removed and the first wiring layer 462 can be exposed. At this time, the exposed first wiring layer 462 can be used as a path that can be electrically connected to the outside. The second insulation layer 463 may include an insulating material, and may include, for example, an oxide, a nitride, or an epoxy molding compound.

According to above process, the semiconductor chip 200 is mounted in the mother frame 10, and the molding layer 300 and the conductive layer 350 filling the through holes 12 are formed. In addition, the via contact 370 is formed by forming the first via layer 371 and the second via layer 372 in the via hole 13. Then, an upper redistribution layer 460 is formed on the active surface of the semiconductor chip 200 and on the first surface 101 of the mother frame 10.

Figure 88:
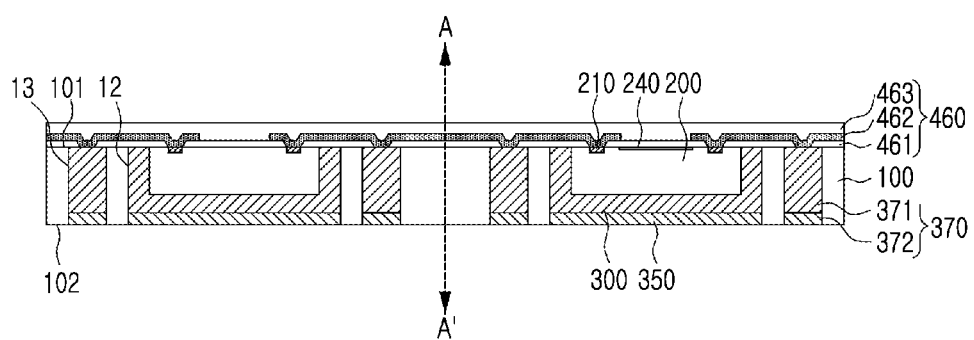

Referring to FIG. 88, the mother frame 10 may be cut along the cutting line A-A' to obtain an individualized semiconductor package.

Figure 89:
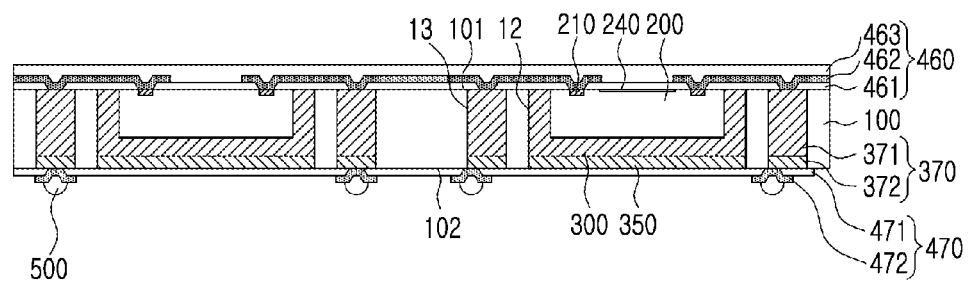

In addition, after forming the upper redistribution layer 460 shown in FIG. 87, a lower redistribution layer 470 is formed in a direction opposite to the pad 210 of the semiconductor chip 200 as shown in FIG. 89.

That is, the third insulation layer 471 and the second wiring layer 472 may be sequentially formed under the second surface 102 of the mother frame 10 and the conductive layer 350, An external connection terminal 500 may be formed so as to be electrically connected to the via contact 370. The external connection terminal 500 may be directly connected to the lower portion of the via contact 370 of the semiconductor package shown in FIG. 89, that is, the lower portion of the second via layer 372 without the lower redistribution layer 470.

If the lower redistribution layer 470 is additionally formed, the step of cutting the mother frame 10 of FIG. 88 to individualize the semiconductor package may be performed after FIG. 89.

In addition, the shape of the semiconductor package may be variously changed according to the cutting process for the structure disclosed in FIG. 88. That is, it is also possible to manufacture a semiconductor package that exposes the molding layer 300 covering the side surface of the semiconductor chip 200 through cutting to remove the via contact 370.

Sixth Embodiment

Figure 90:
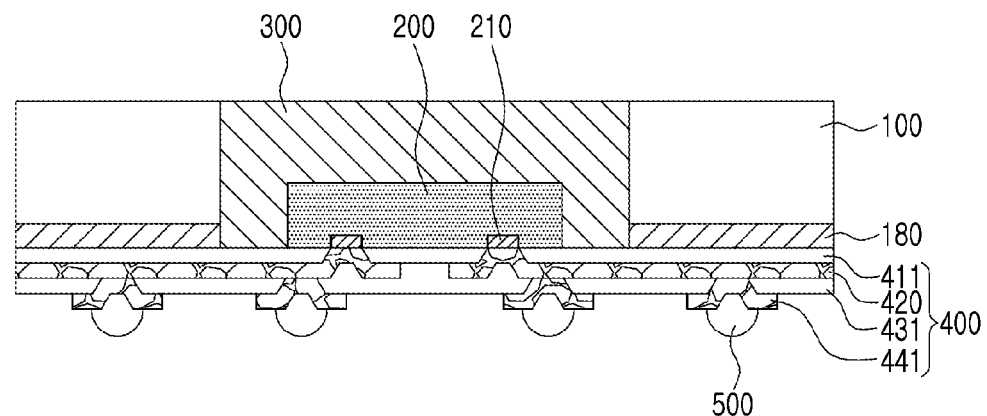
FIG. 90 is a cross-sectional view illustrating a semiconductor package according to a sixth embodiment of the present disclosure.

FIG. 90 is a cross-sectional view illustrating a semiconductor package according to a sixth embodiment of the present disclosure.

Referring to FIG. 90, the semiconductor package of this embodiment has an insulating frame 100, an adhesive buffer layer 180, a semiconductor chip 200, a molding layer 300, a redistribution layer 400, and an external connection terminal 500.

The insulating frame 100 is preferably an insulating material or a semiconductor material. Further, it is preferable that the insulating frame 100 has a thermal expansion coefficient similar to that of the carrier substrate or the molding layer 300 described below.

Accordingly, the insulating frame 100 may be an insulating ceramic or a semiconductor material. The insulating ceramics may have various materials such as metal oxides or metal nitrides, and soda lime glass or sapphire may be used. In addition, the semiconductor material may have a silicon material, and ZnO, GaN, GaAs, or the like may be used. However, the insulating frame 100 may be variously selected depending on the material of the carrier substrate or the molding layer 300 used.

An adhesive buffer layer 180 is formed under the insulating frame 100. The adhesive buffer layer 180 is selected as a material for improving interfacial adhesion properties. For example, the adhesive buffer layer 180 may be provided in the form of a metal thin film or a nanoparticle film.

The metal thin film is defined as a metal film having a predetermined thickness by physical vapor deposition or chemical vapor deposition, and the nanoparticle film refers to a coating of inorganic particles.

If the adhesive buffer layer 180 is provided in the form of a metal thin film, the material of the adhesive buffer layer 180 includes Al, Cu, Ag, Ta, W, or Ti. For example, the adhesive buffer layer 180 in the form of a metal thin film can be formed by sputtering using metal as a target.

In addition, the formation of the adhesive buffer layer 180 using the metal thin film can be performed using a self-assembled monolayer formation technique. That is, a self-assembled monolayer film such as alkyltrichlorosilane or alkanethiol can be chemically attached on the surface of the insulating frame 100. Since the metal ion is bonded to the end of the self-assembled monolayer, the adhesive buffer layer 180 of the metal thin film can be formed on the insulating frame 100 by a simple method such as dipping or coating.

In addition, the metal thin film may be formed in an island type. That is, a thin film of several tens nm to several um is formed through a process such as vapor deposition, and then the agglomeration of the metal material is induced through a heat treatment process. Through the agglomeration of the metal material, an island type metal thin film can be formed on the frame. This is a phenomenon depending on the surface energy of the metal in the heat treatment process, and the metal exhibits self-agglomeration characteristic, and flows on the surface of the insulating frame 100 and appears as an agglomerated island shape.

In addition, when the adhesive buffer layer 180 is provided in the form of a nanoparticle film, the adhesive buffer layer 180 includes TiO2 or SiO2. The nanoparticle film can be formed by dispersing inorganic nanoparticles in a solvent and spray coating. In addition, the pressing process can be performed so that the nanoparticles sufficiently adhere to the insulating frame 100.

In addition, since the nanoparticle film has the characteristics of an inorganic material, it can be formed by a conventional deposition method.

The adhesive buffer layer 180 is formed only on the lower portion of the insulating frame 100, but may also be formed on the upper and side surfaces of the insulating frame 100.

The semiconductor chip 300 is disposed in the through hole of the insulating frame 100. The pads 210 of the semiconductor chip 200 are disposed to face the redistribution layer 400. The active surface on which the pads 210 are formed in the semiconductor chip 200 is preferably coplanar with the lower surface of the adhesive buffer layer 180. The active surface of the semiconductor chip 200 refers to a region where active elements such as transistors or passives such as resistors are formed according to a semiconductor manufacturing process.

A molding layer 300 is formed on the side surface of the semiconductor chip 200 disposed in the through hole. The molding layer 300 has an ordinary epoxy molding compound (EMC) material and may be supplied in a liquid or powder form.

In addition, the molding layer 300 may have a conductive powder. The conductive powder is preferably a metal powder such as Ag, Cu or Al. In addition, the conductive powder may have a conductive oxide such as ITO or IZO.

A redistribution layer 400 is formed on the active surface of the semiconductor chip 200 and the adhesive buffer layer 180. The redistribution layer 400 has a polymer bonding layer 411, a first wiring layer 420, a passivation layer 431, and an external bonding layer 441. In addition, the external bonding layer 441 may be omitted according to the embodiment. However, the structure of the redistribution layer 400 is only example to implement the fan-out structure, and it should be understood by those skilled in the art that additional wiring layers other than the first wiring layer 420 may be additionally formed in the redistribution layer 400. That is, other wiring layer may be interposed between the first wiring layer 420 and the external bonding layer 441. Further, a polymer bonding layer is interposed between the wiring layers.

The polymer bonding layer 411 described in FIG. 90 is bonded to the adhesive buffer layer 180, the molding layer 300, and the active surface of the semiconductor chip 200. The material of the polymer bonding layer 411 is an insulating polymer, and preferably has a film form. For example, the polymer bonding layer 411 may have various materials such as polyimide, polyethylene, or polyethylene terephthalate. In particular, the polymer bonding layer 411 is preferably a polyimide film.

A first wiring layer 420 is formed on the polymer bonding layer 411. The polymer bonding layer 411 opens the pads 210 of the semiconductor chip 200 and the first wiring layer 420 is connected to the pads 210 of the semiconductor chip 200. The patterned first wiring layer 420 may extend to a region other than the region of the semiconductor chip 200.

A passivation layer 431 is formed on the first wiring layer 420. The passivation layer 431 has an insulating polymer material and may be provided in a film form.

An external bonding layer 441 is formed on the passivation layer 431 and an external connection terminal 500 is formed on the external bonding layer 441. The external connection terminal 500 has a solder ball or bump structure. More specifically, the external connection terminal 500 is formed on the external bonding layer 441 and electrically connected to the pad 210 of the semiconductor chip 200.

Also, the external connection terminal 500 may be directly formed on the first wiring layer 420 according to the embodiment.

Figure 91:
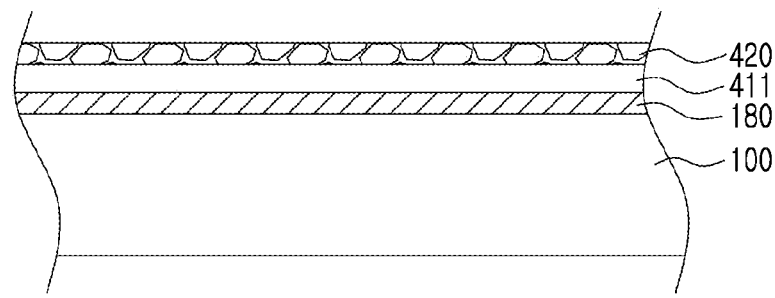
FIG. 91 is a cross-sectional view showing a partial structure of the redistribution layer of FIG. 90 according to the sixth embodiment of the present disclosure.

FIG. 91 is a cross-sectional view showing a partial structure of the redistribution layer of FIG. 90 according to the sixth embodiment of the present disclosure.

Referring to FIG. 91, an adhesive buffer layer 180 is formed on an insulating frame 100. The adhesive buffer layer 180 is provided to facilitate bonding with the polymer bonding layer 411, which is an insulating polymer film.

That is, the insulating frame 100 having an insulating material or a semiconductor material is not easily bonded to the polymer bonding layer 411 because of low surface roughness or high chemical/physical stability. A thermocompression bonding process is used for joining with the polymer bonding layer 411. That is, a polymer film is placed on a substrate, and a polymer film is attached on the substrate by applying a predetermined pressure and heat.

However, when the polymer film is thermally pressed directly on the insulating frame 100, adhesion is not adequate, and the polymer film is peeled off during use due to the smooth material of the insulating frame 100 and the low adhesive force with the polymer film.

To solve this problem, an adhesive buffer layer 180 is introduced. Polymer films such as polyimide films maintain high adhesion with metals or nanoparticles. Accordingly, a bonding buffer layer 180 made of a metal is provided on the insulating frame 100 to maintain a high bonding strength with the polymer bonding layer 411.

The thickness of the adhesive buffer layer 180 is preferably from 0.1 um to 5 um. If the thickness of the adhesive buffer layer 180 made of metal is less than 0.1 um, roughness required in the adhesive buffer layer 180 cannot be secured and a part of the adhesive buffer layer 180 may be damaged in the manufacturing process. Further, if the thickness of the adhesive buffer layer 180 exceeds 5 um, there arises a problem that the thickness of the semiconductor package increases more than necessary.

A polymer bonding layer 411 is formed on the adhesive buffer layer 180. The polymer bonding layer 411 preferably has an insulating polymer film form. For example, a polyimide film may be used as the polymer bonding layer 411. The polymer bonding layer 411 is bonded to the adhesive buffer layer 180 by a thermocompression bonding process. In addition, if necessary, a part of the polymer bonding layer 411 can be patterned.

A first wiring layer 420 is formed on the polymer bonding layer 411. The first wiring layer 420 may be formed by sputtering, which is a kind of physical vapor deposition. In the case of sputtering, since the process can be performed at a relatively low temperature of 200° C. or less, occurrence of thermal deformation is minimized in the polymeric bonding layer 411. The first wiring layer 520 may be made of a metal such as Cu, Ag or Al.

In FIG. 91, a first wiring layer 420 made of a metal and an adhesive buffer layer 180 are formed on upper and lower sides of the polymer bonding layer 411.

FIGS. 92 to 97 are sectional views for explaining a manufacturing method of the semiconductor package of FIG. 90 according to the sixth embodiment of the present disclosure.

Figure 92:
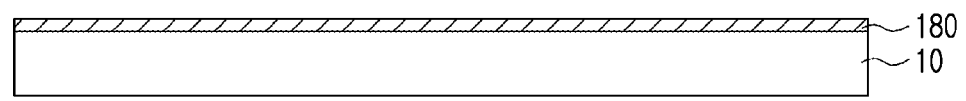
FIGS. 92 to 97 are sectional views for explaining a manufacturing method of the semiconductor package of FIG. 90 according to the sixth embodiment of the present disclosure.

Referring to FIG. 92, the mother frame 10 is prepared. An adhesive buffer layer 180 is formed on the mother frame 10.

The mother frame 10 may have an insulating material or a semiconductor material, and the adhesive buffer layer 180 preferably may have a metal material. The adhesive buffer layer 180 of metal or inorganic nanoparticles preferably has a thickness of 0.1 um to 5 um. Further, the adhesive buffer layer 180 may be formed using a conventional deposition method of metal materials, and may be formed by a coating process for forming a nanoparticle layer.

In FIG. 92, it is disclosed that the adhesive buffer layer 180 is formed only on the upper surface of the mother frame 10, but an adhesive buffer layer 180 may be formed on the other surface that needs to form the wiring structure as described above. For example, an adhesive buffer layer may be formed on the lower surface or the side surface of the mother frame 10.

Figure 93:

Referring to FIG. 93, a part of the mother frame 10 shown in FIG. 92 is etched or partially removed to form a through hole 12 passing through the mother frame 10.

Figure 94:
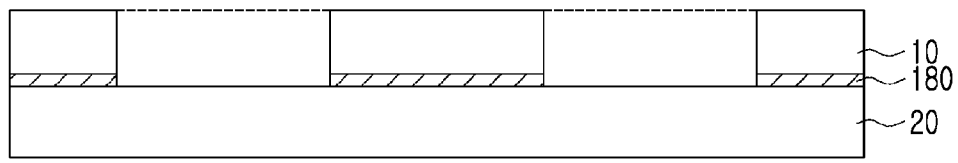

Referring to FIG. 94, a mother frame 10 having an adhesive buffer layer 180 formed on a carrier substrate 20 is disposed.

In particular, the adhesive buffer layer 180 is disposed to face the surface of the carrier substrate 20.

Figure 95:
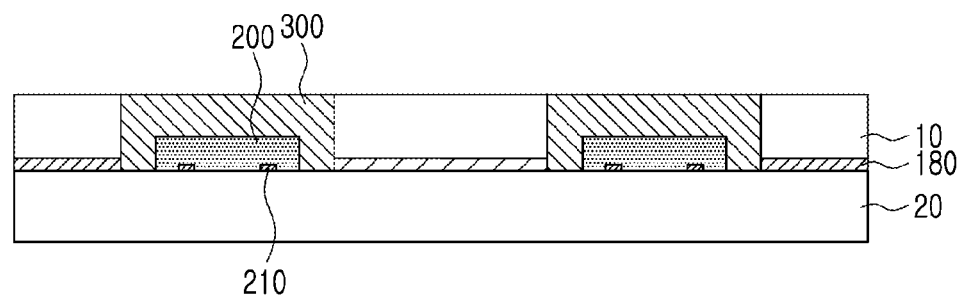

Referring to FIG. 95, the semiconductor chip 200 is disposed in the through hole of the mother frame 10. The semiconductor chip 200 is disposed so that the pads 210 of the active surface face the carrier substrate 20.

Then, a molding layer 300 is formed which covers the semiconductor chip 200 and fills the through holes. The molding layer 300 may have a conventional epoxy molding compound material, and the molding layer 300 may have a conductive powder if necessary. That is, the molding layer 300 may have an insulating property and may have conductivity depending on the use of the conductive powder.

The molding layer 300 is coplanar with the active surface of the semiconductor chip 200 and is also coplanar with the adhesive buffer layer 180.

Figure 96:
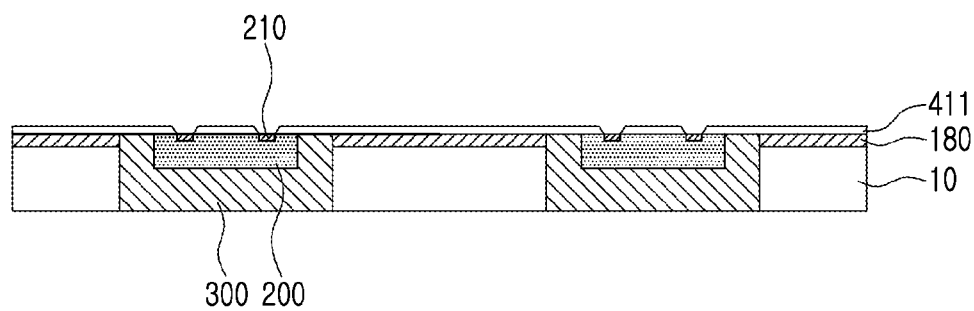

Referring to FIG. 96, the carrier substrate is removed, and the polymer bonding layer 411 constituting the redistribution layer is formed on the active surface of the semiconductor chip 200 and the adhesive buffer layer 180.

First, the mother frame 10 on which the molding layer 300 is formed is separated from the carrier substrate. The surface of the pad 210 of the semiconductor chip 200 and the surface of the adhesive buffer layer 180 are exposed by separation of the carrier substrate. The polymer bonding layer 411 is formed based on the exposed surface. The polymer bonding layer 411 is bonded to the adhesive buffer layer 200 and exposes the pads 210 of the semiconductor chip 200.

The insulating polymer film is disposed on the active surface of the semiconductor chip 200 and the adhesive buffer layer 180 in order to form the polymer bonding layer 411 and a thermal compression process is performed on the insulating polymer film. The thermocompression process is a process of supplying heat to the insulating polymer film while applying a predetermined pressure.

The applied pressure and heat may be set differently depending on the type of semiconductor package to be manufactured. In particular, the pressure is characterized by the thickness of the semiconductor chip 200, the thickness of the molding layer 300, and the thickness of the insulating frame. Therefore, a person skilled in the art can apply the pressure within a range in which the warping of the semiconductor package or the mother frame does not occur.

When a polyimide film is used as the insulating polymer film, the applied heat is preferably set at 80° C. to 120° C. If heat is applied at a temperature of less than 80° C., the polyimide film cannot sufficiently bond to the adhesive buffer layer 180 made of metal, or an excessive time is required for adhesion. Further, if the temperature exceeds 120° C., thermal deformation of the polyimide film may occur.

When the thermal compression process is performed on the insulating polymer film, the insulating polymer film has a predetermined fluidity and is easily bonded to the adhesive buffer layer 180 having a predetermined roughness.

In addition, the semiconductor chip 200 has a semiconductor material, but the active surface does mostly not expose the semiconductor material. In the case of silicon, which is a typical semiconductor material, Si is combined with oxygen in the atmosphere to form $SiO_2$, and the active surface exposed to the outside in the semiconductor manufacturing process is treated by an insulating film. Therefore, the polyimide film can be easily adhered also to the active surface of the semiconductor chip 200.

Subsequently, patterning is performed on the insulating polymer. The patterning uses a conventional photolithography process. Therefore, a photoresist is coated on the insulating polymer film, and a photoresist pattern is formed by exposure and development. Further, the pad 210 is opened by performing an etching process using the formed photoresist pattern as an etching mask. A polymer bonding layer 411 is formed to open the pad 210.

Figure 97:
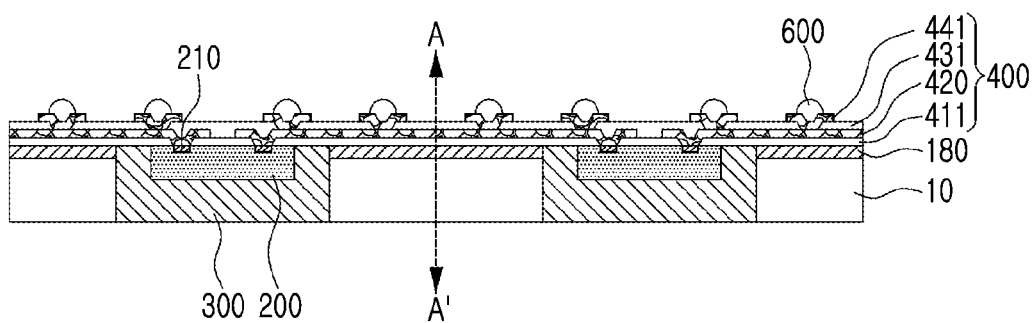

Referring to FIG. 97, a first wiring layer 420 is formed on the polymer bonding layer 411.

The first wiring layer 420 may be formed by forming a metal film of Cu, Ag, or Al on the polymer bonding layer 411 and then patterning the same.

Subsequently, a passivation layer 431 is formed on the first wiring layer 420. The passivation layer 431 may be formed of an insulating polymer film. A part of the first wiring layer 420 is exposed by selective etching of the passivation layer 431 and an external bonding layer 441 is formed on the exposed portion of the first wiring layer 420. An external connection terminal 500 is formed on the external bonding layer 441.

Also, another polymer bonding layer may be formed on the first wiring layer 420 in FIG. 97. Also, it is preferable that a polymer bonding layer is formed on the first wiring layer 420 and that the formed polymer bonding layer is also formed of an insulating polymer film and is formed by a thermocompression bonding process.

In addition, another wiring layer may be formed on the polymer bonding layer formed on the first wiring layer 420. For the formation of another wiring layer, a process used for forming the first wiring layer 420 is used.

Also, the external connection terminal 500 is preferably a solder ball or a bump.

Through the above-described process, the semiconductor chip 200 is mounted in the mother frame 10, and a molding layer 300 for filling the through holes is formed. An adhesive buffer layer 180 is formed on the mother frame 10 and the polymer bonding layer 411 is easily bonded to the adhesive buffer layer 180 through thermocompression bonding. The redistribution layer 400 can be easily formed.

Then, the mother frame 10 is cut along the cutting line A-A' to obtain the individualized semiconductor package shown in FIG. 90.

The invention claimed is:

1. A semiconductor package comprising:
a frame having a through hole penetrating the frame;
a semiconductor chip disposed in the through hole, and having an active surface on which a pad is formed and a back surface facing the active surface;
a molding layer covering a side surface of the semiconductor chip and the back surface of the semiconductor chip;
a redistribution layer formed on the active surface of the semiconductor chip, electrically connected to the pad, and extending on a first surface of the frame; and
a via contact filling a via hole formed around the through hole and penetrating the frame,
wherein the first surface of the frame and the active surface of the semiconductor chip form the same plane.

2. The semiconductor package of claim 1,
wherein the molding layer has the same material as the via contact.

3. The semiconductor package of claim 1,
further comprising a conductive layer formed on the molding layer.

4. The semiconductor package of claim 1,
wherein the molding layer has a conductive powder composed of a metal powder and a conductive oxide powder, the metal powder having Ag, Cu or Al, the conductive oxide powder having ITO or IZO.

5. The semiconductor package of claim 1,
further comprising a barrier film formed on the side surface and the back surface of the semiconductor chip to prevent diffusion of metal.

6. The semiconductor package of claim 5,
wherein the barrier film has Ti, Ta, W, Ru, Mo, TiN, TaN, WN or graphene oxide.

7. The semiconductor package of claim 1,
wherein the molding layer is electrically connected to a ground terminal.

8. A semiconductor package comprising:
a frame having a through hole penetrating the frame, and having a via hole penetrating the frame and disposed around the through hole;
a semiconductor chip disposed in the through hole, and having an active surface and a thickness smaller than that of the frame;
a molding layer covering a side surface of the semiconductor chip and a back surface of the semiconductor chip;
a conductive layer formed on the molding layer and formed in the through hole;
an upper redistribution layer formed on active surface of the semiconductor chip electrically connected to a pad of the semiconductor chip, and extending on a first surface of the frame; and
a via contact filling the via hole and electrically connected the upper redistribution layer,
wherein the active surface of the semiconductor chip is formed in an open form with respect to the upper redistribution layer.

9. The semiconductor package of claim 8,
wherein the molding layer has a conductive powder composed of a metal powder and a conductive oxide powder, the metal powder having Ag, Cu or Al, the conductive oxide powder having ITO or IZO.

10. The semiconductor package of claim 8,
wherein the via contact comprises:
a first via layer contacting the upper redistribution layer; and
a second via layer formed on the first via layer.

11. The semiconductor package of claim 8,
wherein the upper redistribution layer comprises:
a first insulation layer formed on the active surface of the semiconductor chip;
a first wiring layer formed on the first insulation layer and electrically connected to the pad of semiconductor chip; and
a second insulation layer formed on the first wiring layer,
wherein the first wiring layer is formed to open the active surface of the semiconductor chip.

12. The semiconductor package of claim 8, further comprising a barrier film formed on the side surface and the back surface of the semiconductor chip to prevent diffusion of metal, wherein the barrier film has Ti, Ta, W, Ru, Mo, TiN, TaN, WN or graphene oxide.

13. The semiconductor package of claim 8,
wherein the molding layer is electrically connected to a ground terminal.

14. The semiconductor package of claim 13,
wherein the frame has an insulating material or a semiconductor material.

15. The semiconductor package of claim 8,
further comprising a lower redistribution layer electrically connected to the via contact, disposed opposite to the pad of the semiconductor chip, and electrically connected to an external connection terminal.

16. The semiconductor package of claim 15,
wherein the external connection terminal directly contacts the lower redistribution layer, disposed opposite to the via contact with respect to the lower redistribution layer, and has a solder ball or bump.

17. A semiconductor package comprising:
a semiconductor chip disposed in a through hole penetrating an insulation frame;
a molding layer covering a side surface of the semiconductor chip and a back surface facing an active surface of the semiconductor chip;
an adhesive buffer layer formed on a surface of the insulating frame other than the active surface;
a polymer bonding layer formed on the adhesive buffer layer and provided as an insulating polymer film; and
a wiring layer formed on the polymer bonding layer and connected to the active surface,
wherein the adhesive buffer layer is metal film or nanoparticle film, and the nanoparticle film has $TiO_2$ or $SiO_2$.

18. The semiconductor package of claim 17, wherein the insulating polymer film has polyimide.

19. The semiconductor package of claim 17, wherein the adhesive buffer layer has a thickness of 0.1 um to 5 um.

20. The semiconductor package of claim 17, wherein the insulating frame comprises an insulating ceramic or a semiconductor material,
wherein the insulating ceramic is soda lime glass or sapphire, and the semiconductor material comprises silicon, ZnO, GaN or GaAs.

* * * * *